United States Patent
Hirota

(10) Patent No.: US 10,104,324 B2
(45) Date of Patent: Oct. 16, 2018

(54) SOLID-STATE IMAGE PICKUP DEVICE AND CAMERA SYSTEM

(75) Inventor: Isao Hirota, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 491 days.

(21) Appl. No.: 14/116,426

(22) PCT Filed: May 23, 2012

(86) PCT No.: PCT/JP2012/063218
§ 371 (c)(1),
(2), (4) Date: Nov. 8, 2013

(87) PCT Pub. No.: WO2012/161225
PCT Pub. Date: Nov. 29, 2012

(65) Prior Publication Data
US 2014/0071244 A1    Mar. 13, 2014

(30) Foreign Application Priority Data
May 24, 2011 (JP) ................. 2011-116235

(51) Int. Cl.
*H04N 13/02* (2006.01)
*H04N 5/369* (2011.01)
(Continued)

(52) U.S. Cl.
CPC ......... *H04N 5/369* (2013.01); *H01L 27/1464* (2013.01); *H01L 27/14603* (2013.01);
(Continued)

(58) Field of Classification Search
CPC .......................... G02B 13/001; H04N 5/23212
(Continued)

(56) References Cited

U.S. PATENT DOCUMENTS

| 7,576,371 B1 | 8/2009 | Goushcha |
| 2007/0221829 A1 | 9/2007 | Nakagawa et al. |

(Continued)

FOREIGN PATENT DOCUMENTS

| EP | 2190019 A1 | 5/2010 |
| EP | 2681906 A1 | 1/2014 |

(Continued)

OTHER PUBLICATIONS

European Search Report issued in connection with related European Patent Application No. EP 12788991 dated Dec. 10, 2014.

*Primary Examiner* — Frederick D Bailey
*Assistant Examiner* — Masum Billah
(74) *Attorney, Agent, or Firm* — Dentons US LLP

(57) ABSTRACT

There are provided a solid-state image pickup device and a camera system that include no useless pixel arrangement and are capable of suppressing decrease in resolution caused by adopting stereo function. A pixel array section including a plurality of pixels arranged in an array is included. Each of the plurality of pixels has a photoelectric conversion function. Each of the plurality of pixels in the pixel array section includes a first pixel section and a second pixel section. The first pixel section includes at least a light receiving function. The second pixel section includes at least a function to detect electric charge that has been subjected to photoelectric conversion. The first and second pixel sections are formed in a laminated state. Further, the first pixel section is formed to have an arrangement in a state shifted in a direction different from first and second directions that are used as references. The second direction is orthogonal to the first direction. The second pixel section is formed in a square arrangement along the first direction and the second direction orthogonal to the first direction.

21 Claims, 42 Drawing Sheets

(51) Int. Cl.
*H04N 13/204* (2018.01)
*H01L 27/146* (2006.01)
*H04N 5/347* (2011.01)

(52) U.S. Cl.
CPC .. *H01L 27/14627* (2013.01); *H01L 27/14629* (2013.01); *H01L 27/14641* (2013.01); *H04N 5/347* (2013.01); *H04N 13/0203* (2013.01); *H04N 13/0217* (2013.01); *H04N 13/0257* (2013.01); *H04N 13/204* (2018.05)

(58) Field of Classification Search
USPC .......................................................... 348/46
See application file for complete search history.

(56) References Cited

U.S. PATENT DOCUMENTS

| | | | |
|---|---|---|---|
| 2009/0040362 A1 | 2/2009 | Glenn | |
| 2009/0090841 A1* | 4/2009 | Kusaka | G01C 3/08 250/201.2 |
| 2009/0147101 A1* | 6/2009 | Tatani | H01L 27/14621 348/224.1 |
| 2009/0153708 A1* | 6/2009 | Hirota | H01L 27/1463 348/294 |
| 2009/0213256 A1 | 8/2009 | Kudoh | |
| 2009/0295979 A1* | 12/2009 | Matsuo | H01L 27/14636 348/335 |
| 2010/0128152 A1* | 5/2010 | Hayasaka | G02B 3/0056 348/280 |
| 2010/0157091 A1* | 6/2010 | Honda | H01L 27/14645 348/223.1 |
| 2011/0019063 A1* | 1/2011 | Watanabe | H01L 27/14603 348/340 |

FOREIGN PATENT DOCUMENTS

| | | | |
|---|---|---|---|
| EP | 2693741 A1 | 2/2014 | |
| JP | 2007-279512 | 10/2007 | |
| JP | 2010-056865 | 3/2010 | |
| JP | 2010-154493 | 7/2010 | |
| JP | 2010-239337 | 10/2010 | |
| JP | 2010239337 A * | 10/2010 | ....... H01L 27/14621 |
| JP | 2010-252277 | 11/2010 | |
| JP | 2011-029379 | 2/2011 | |
| JP | 2011-071890 | 4/2011 | |
| WO | WO 2010/090133 A1 | 8/2010 | |

* cited by examiner

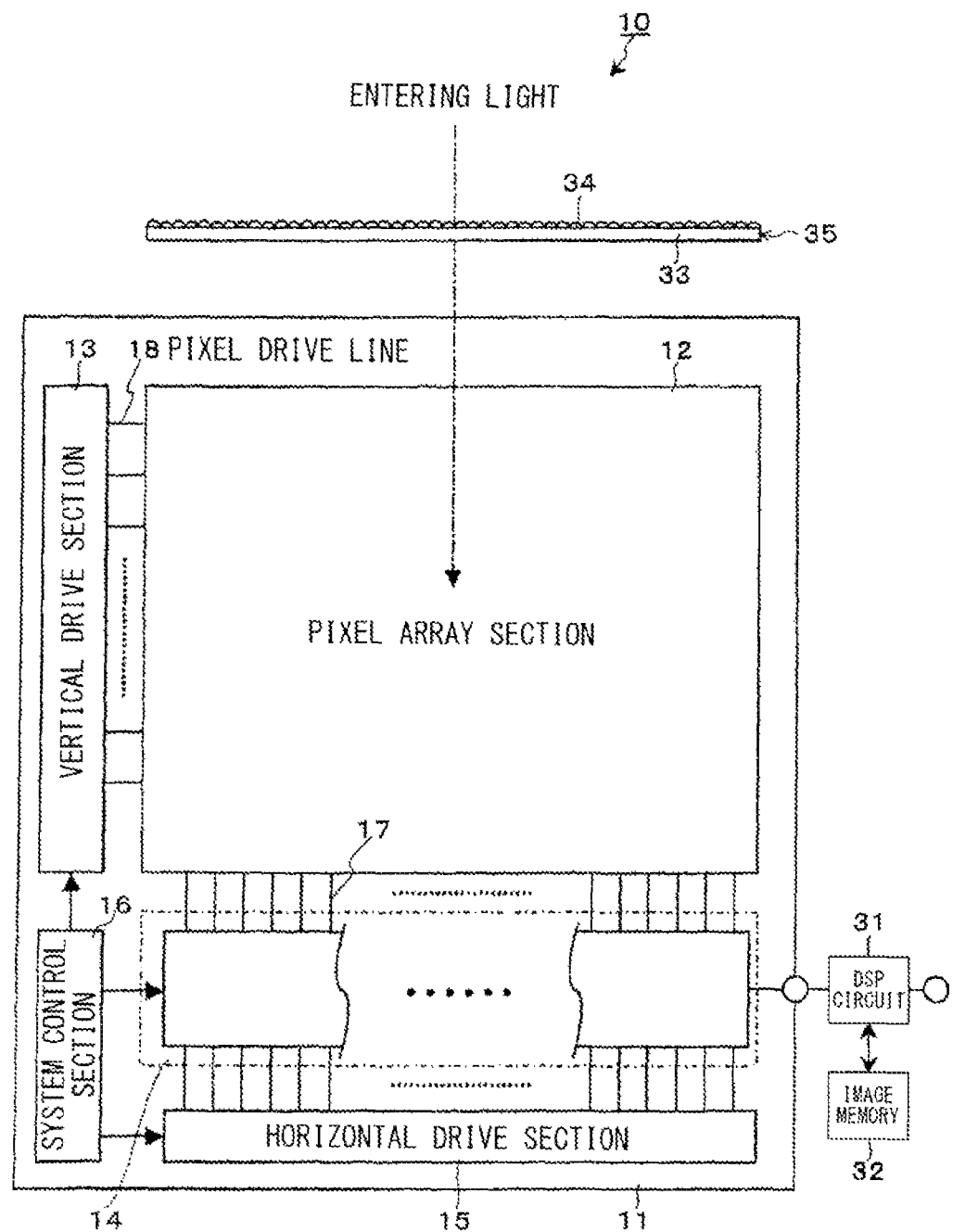
[FIG. 1]

[FIG. 2]
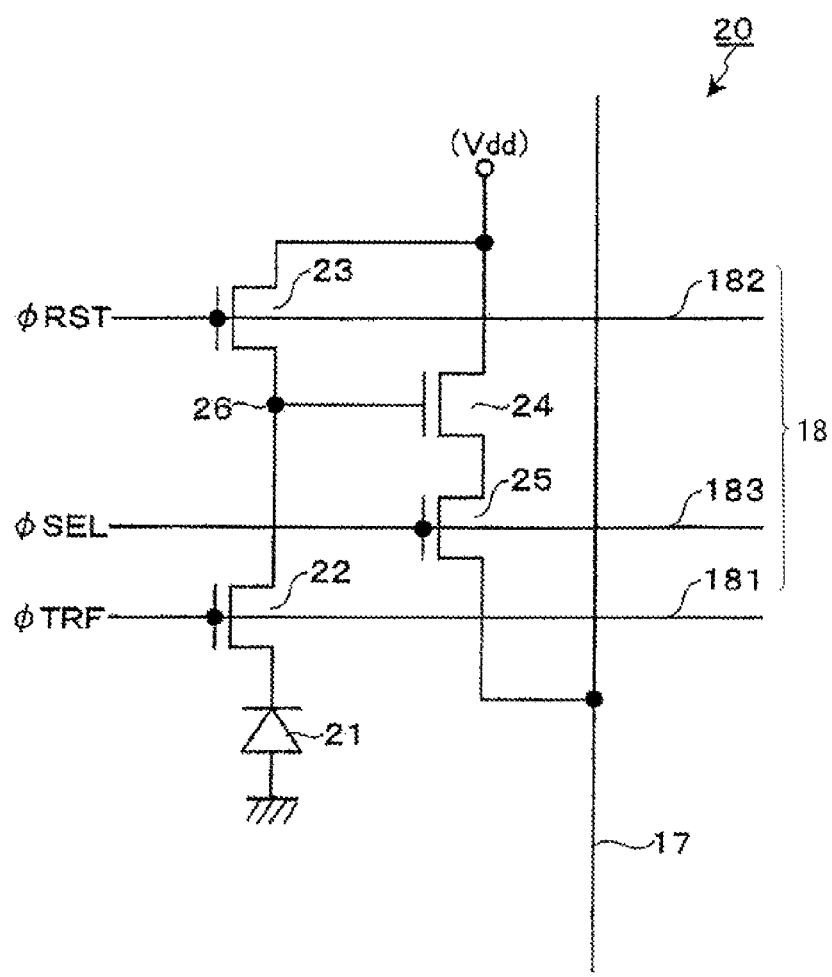

[FIG. 3]
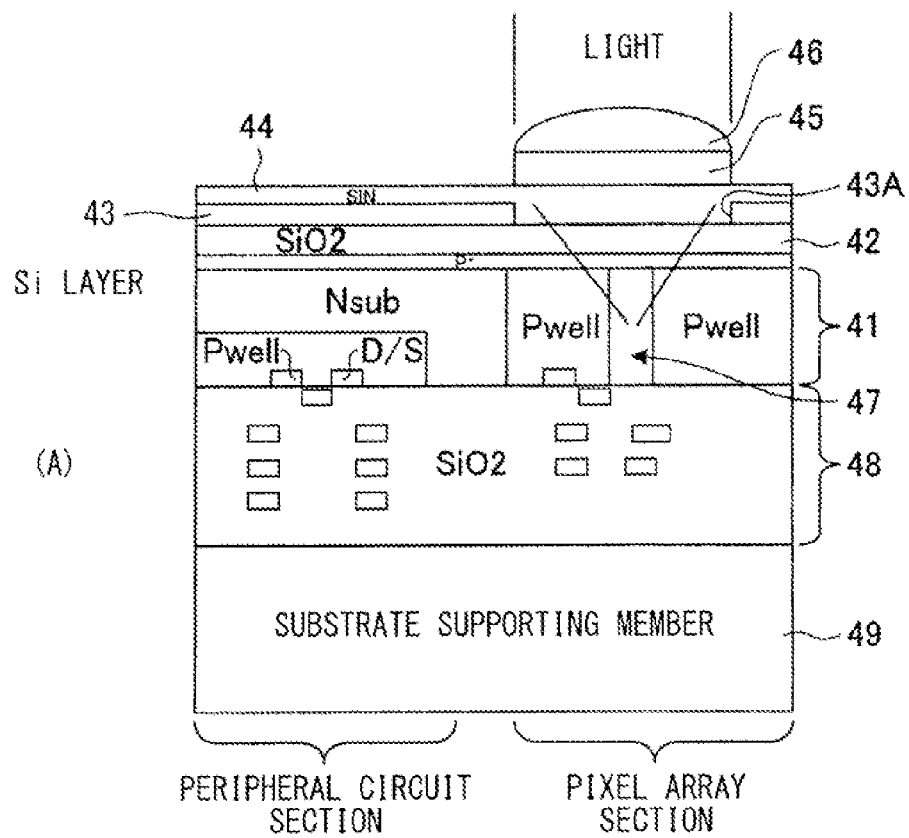
(A)
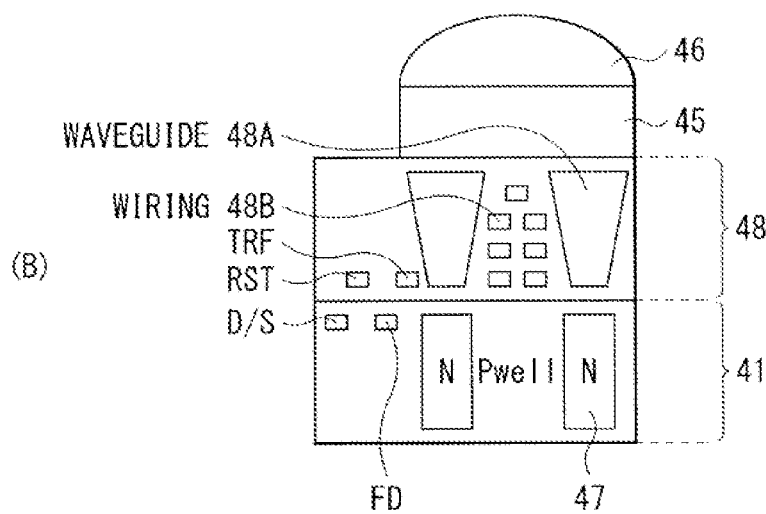
(B)

[ FIG. 4 ]
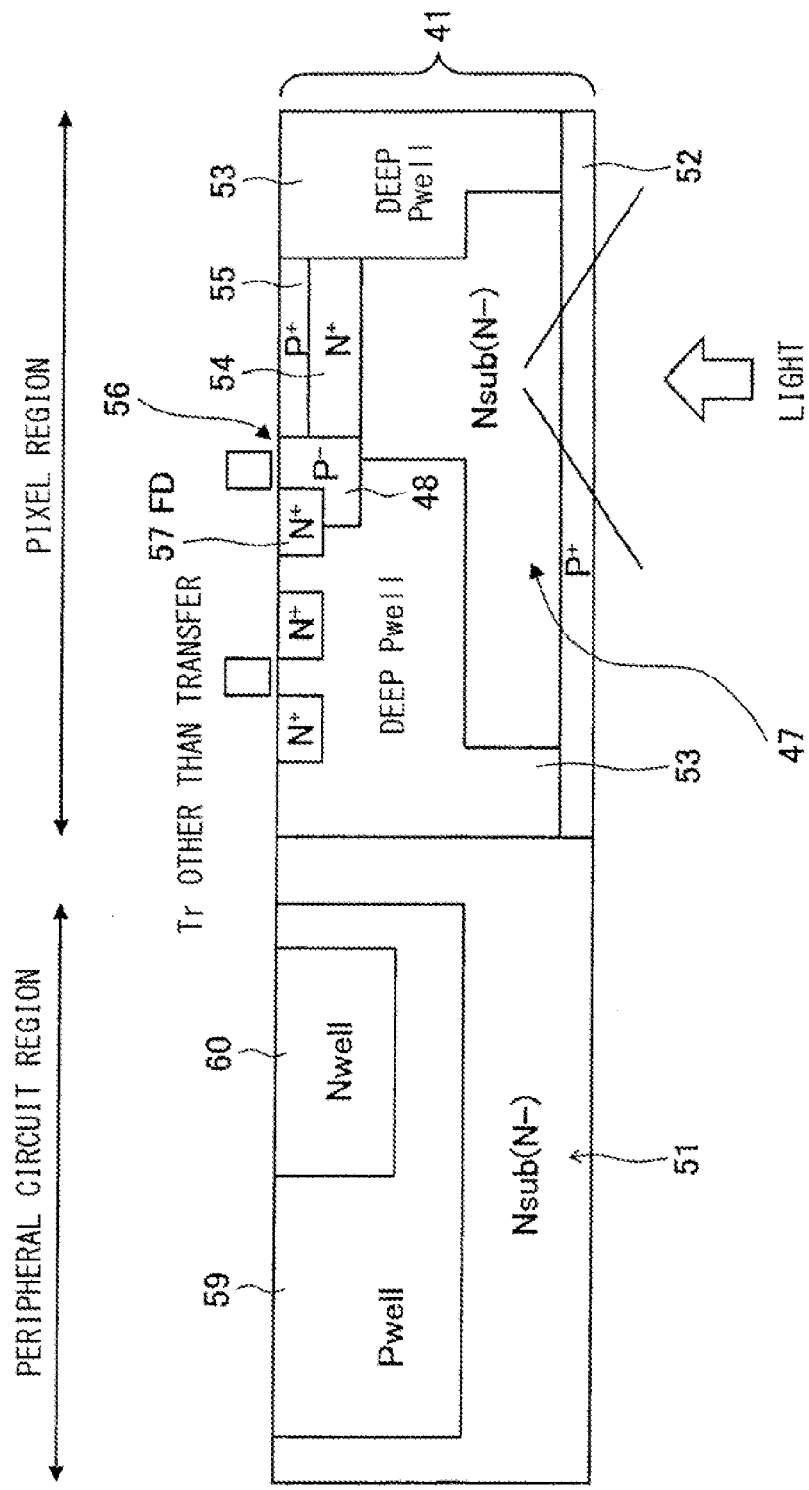

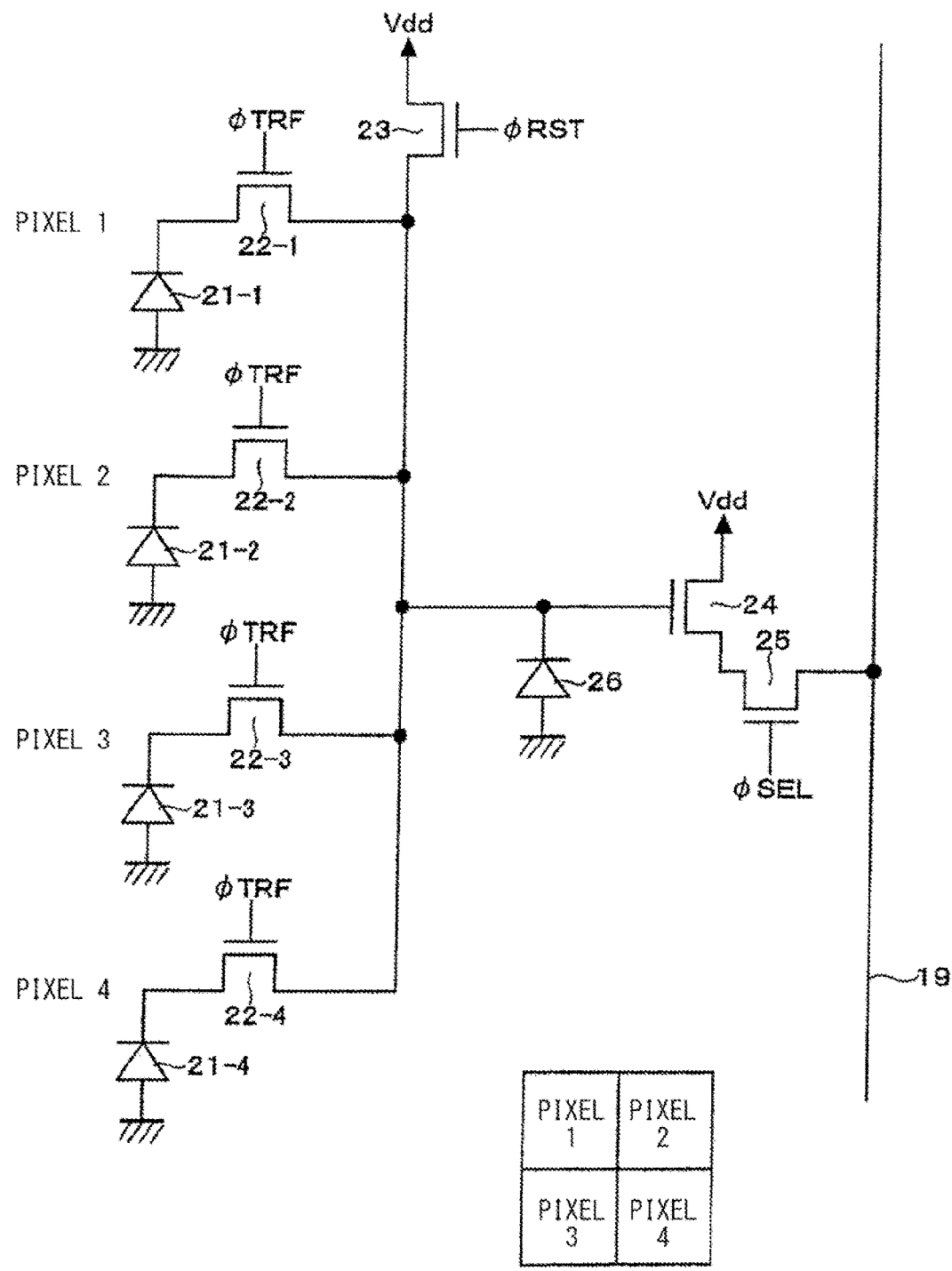
[FIG. 5]

[ FIG. 6 ]
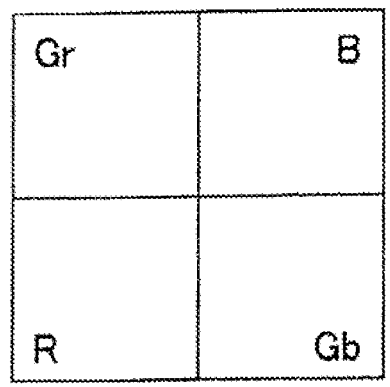
BAYER ARRANGEMENT
[ FIG. 7 ]
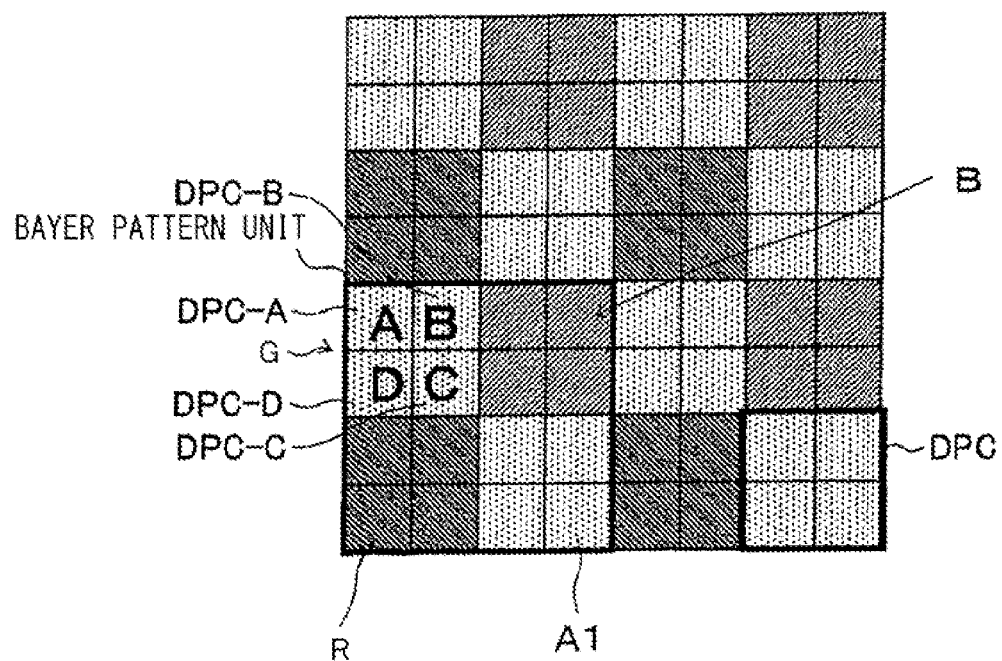

[FIG. 8]
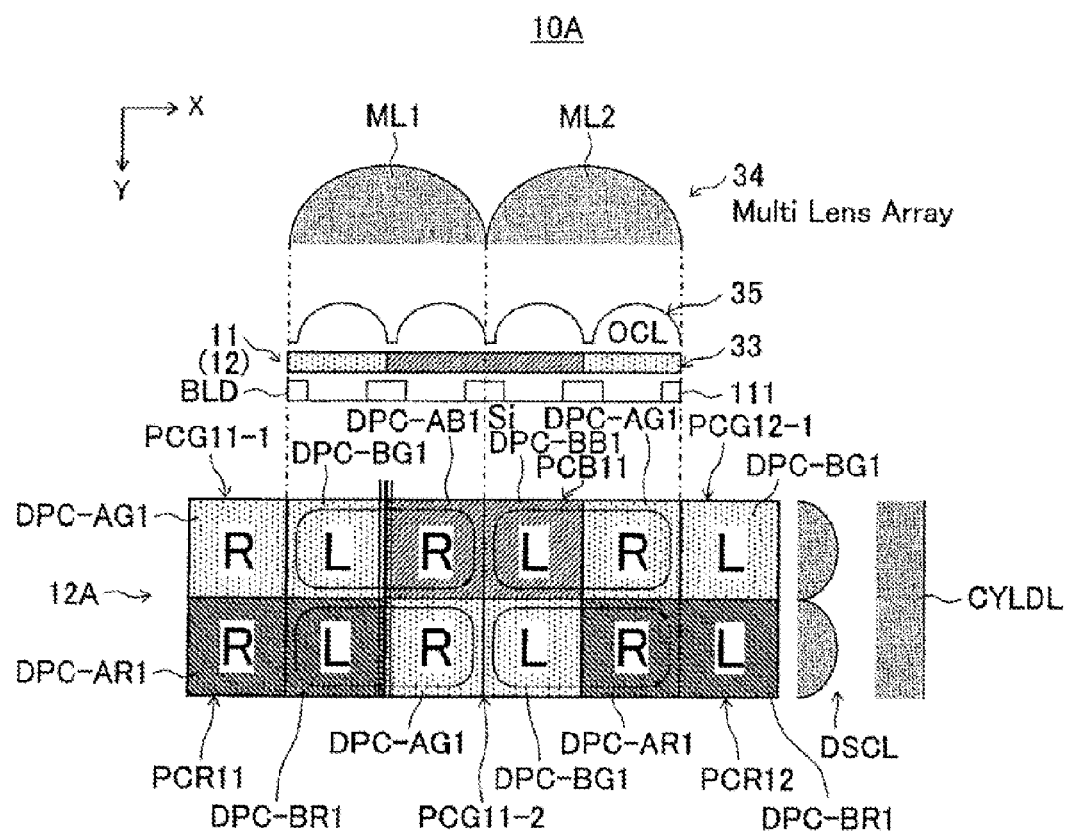

[FIG. 9]
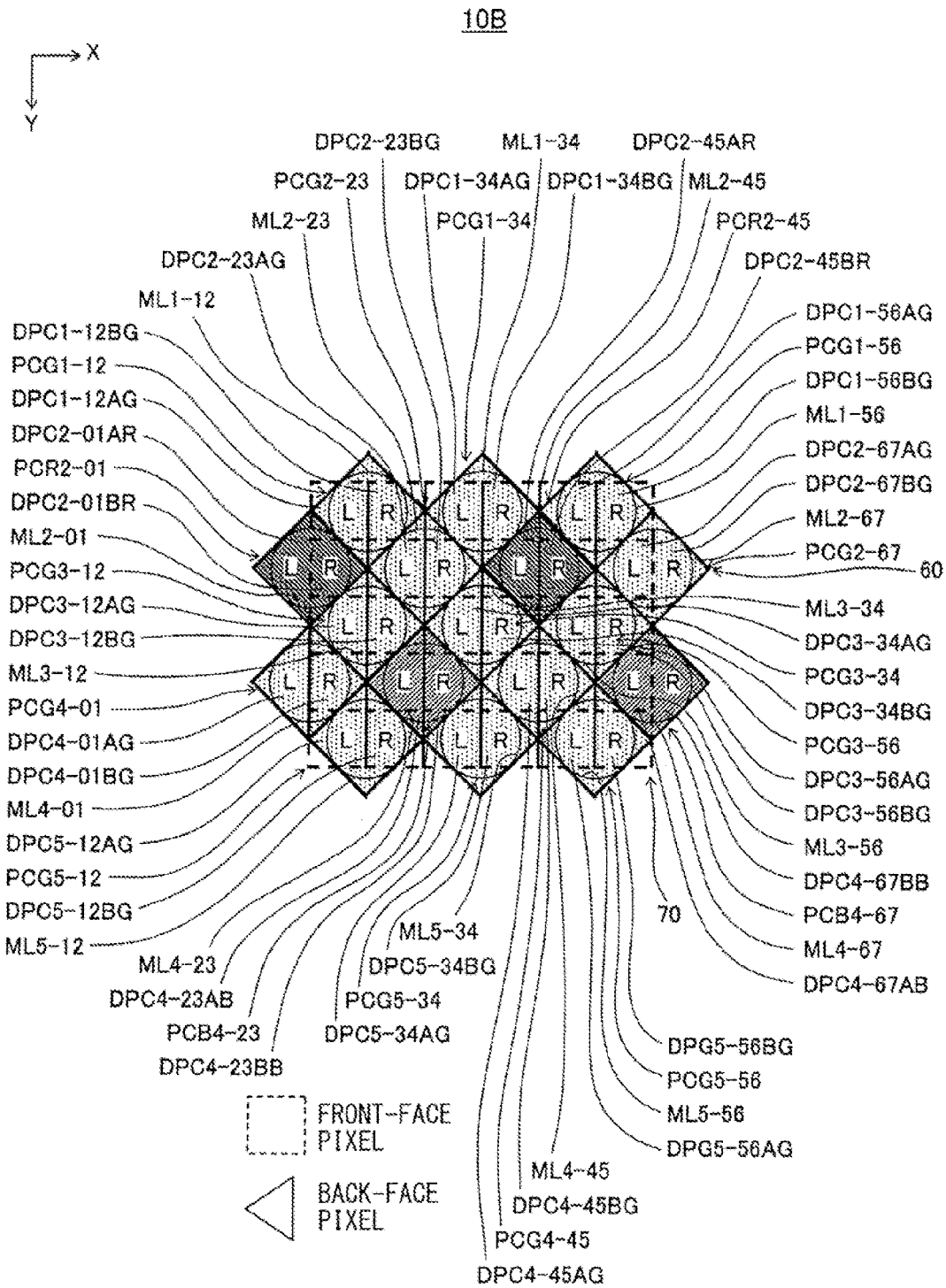

[FIG. 10]
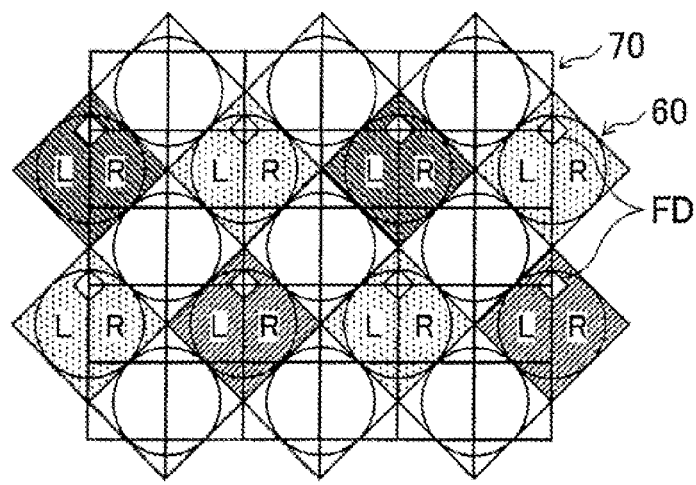

[FIG. 11]
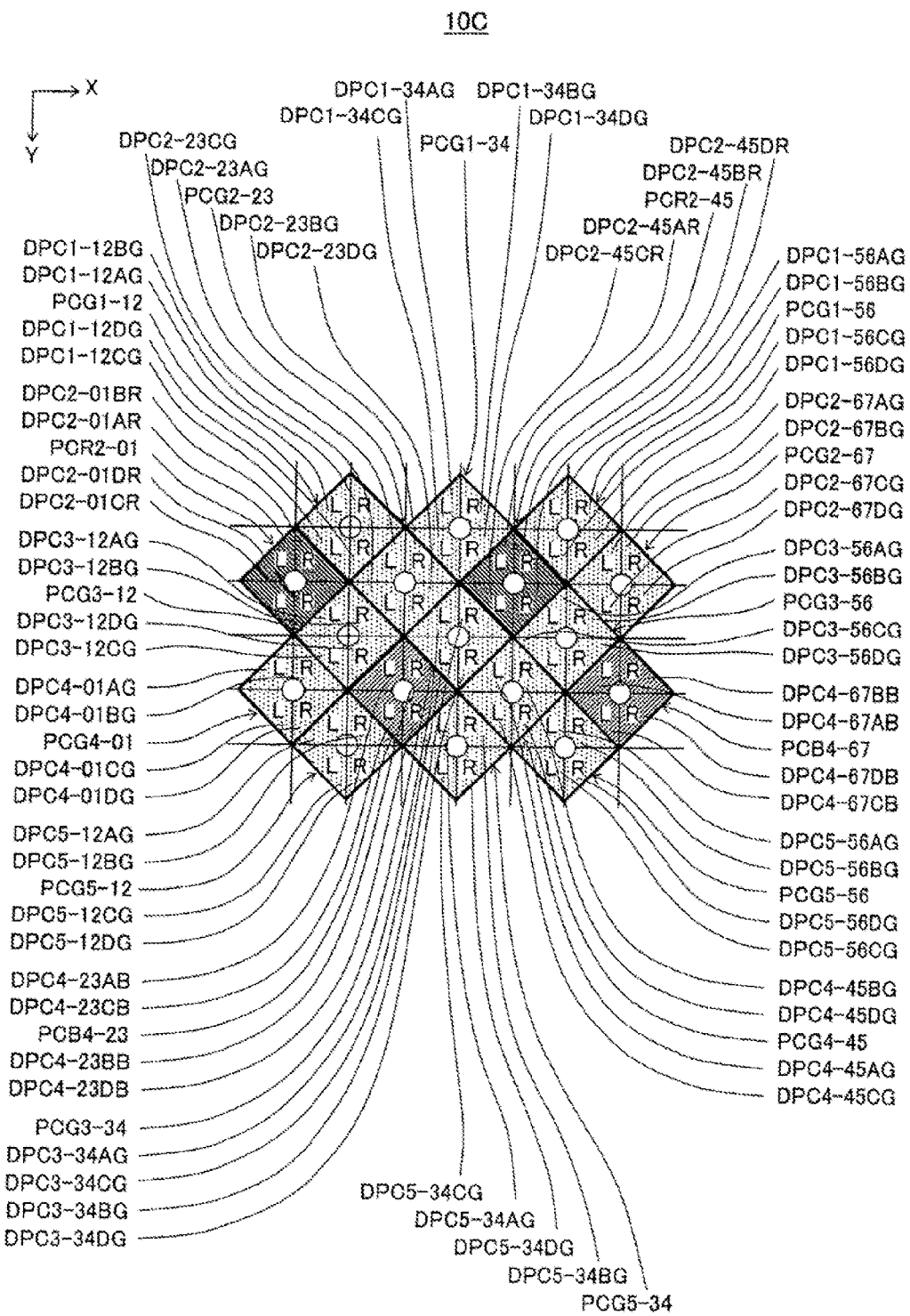

[FIG. 12]
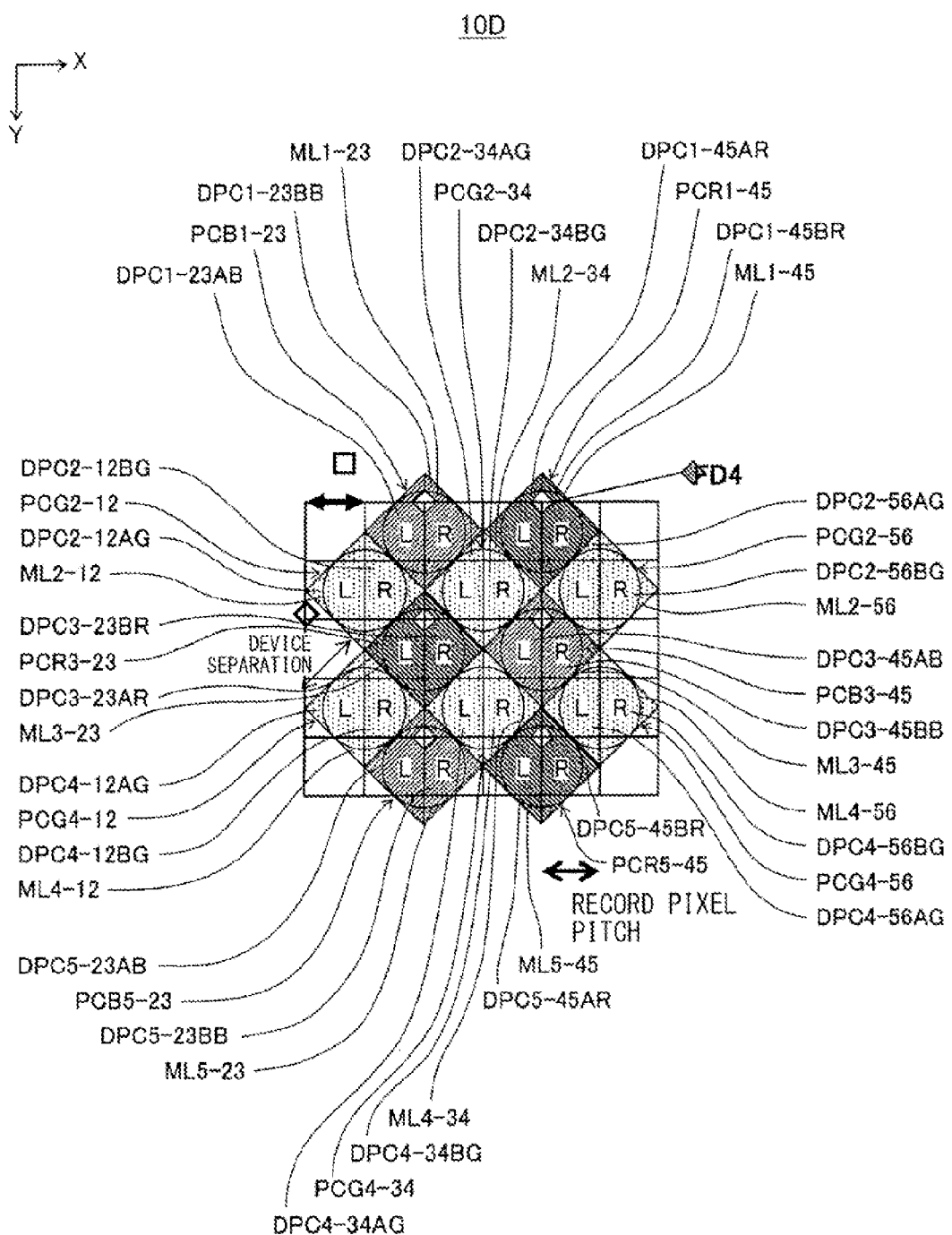

[FIG. 13]
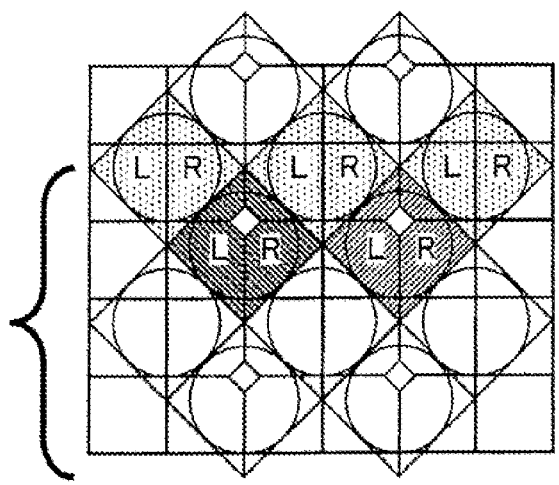
BINNING IS ALLOWED TO BE PERFORMED BY EACH FOUR ROWS
(THINNING OR ADDITION)

[FIG. 14]
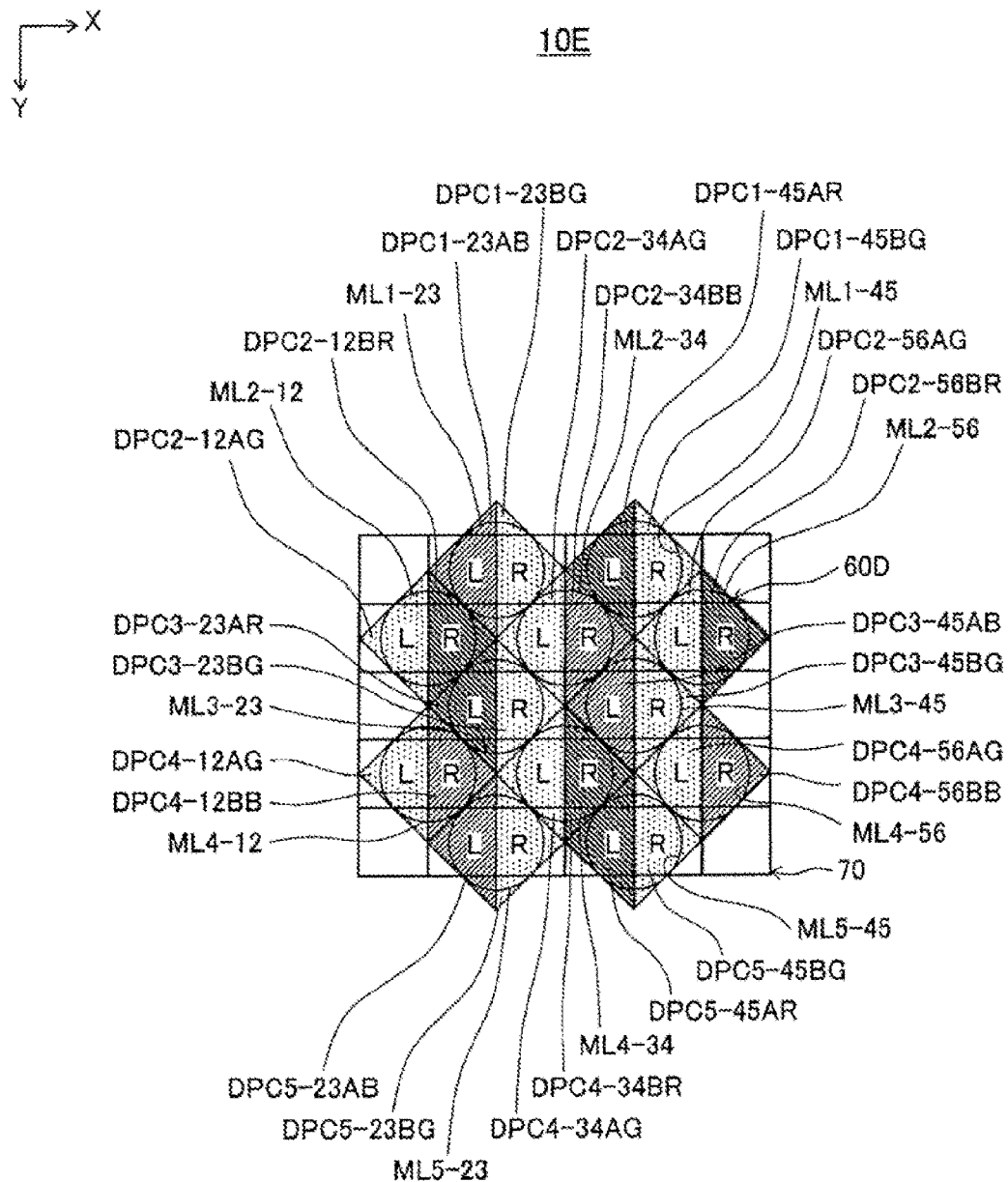

[FIG. 15]
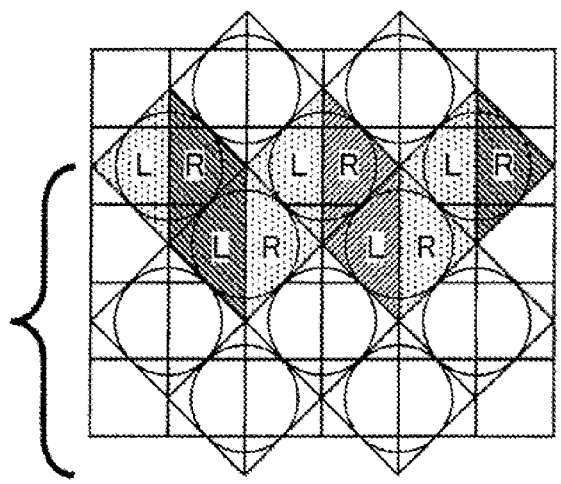
BINNING IS ALLOWED TO BE PERFORMED BY EACH FOUR ROWS
(THINNING OR ADDITION)

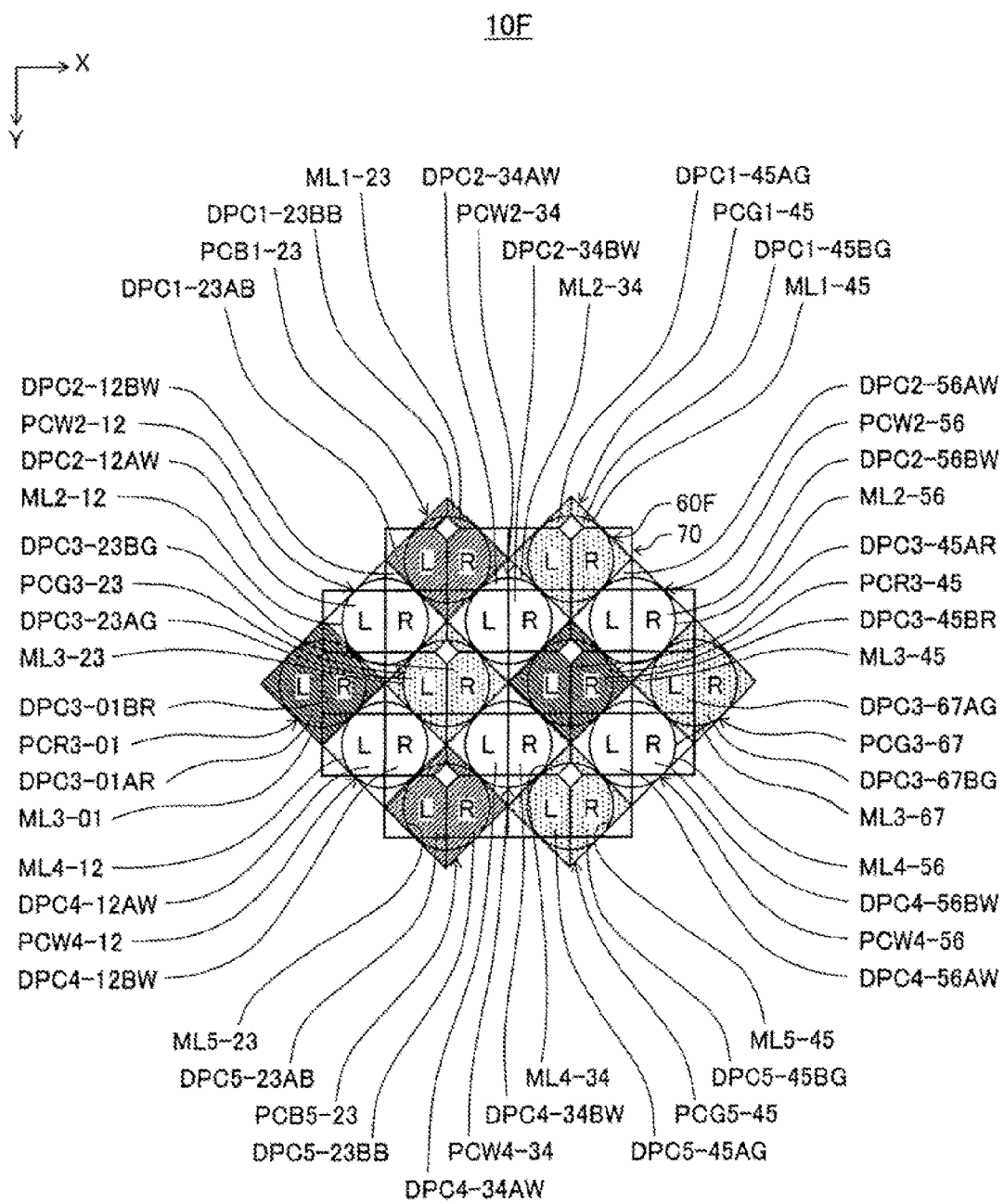
[FIG. 16]

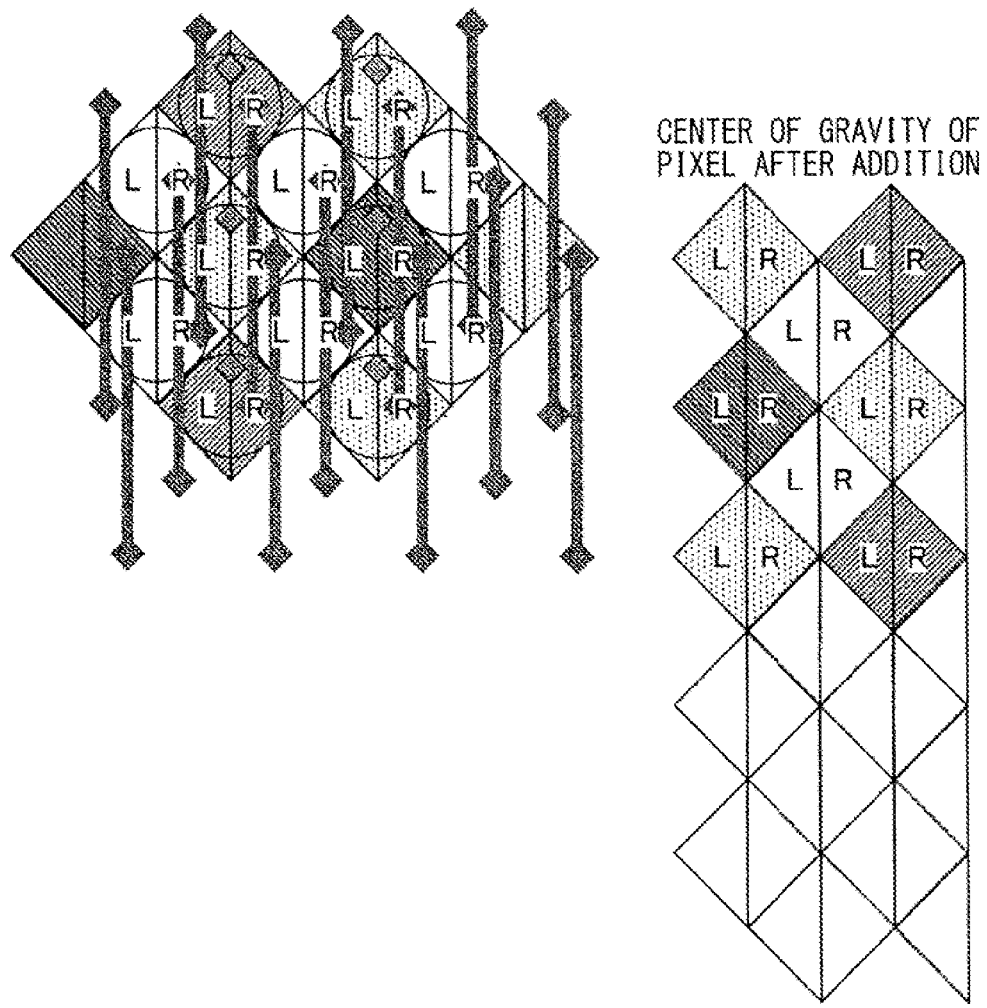
[FIG. 17]

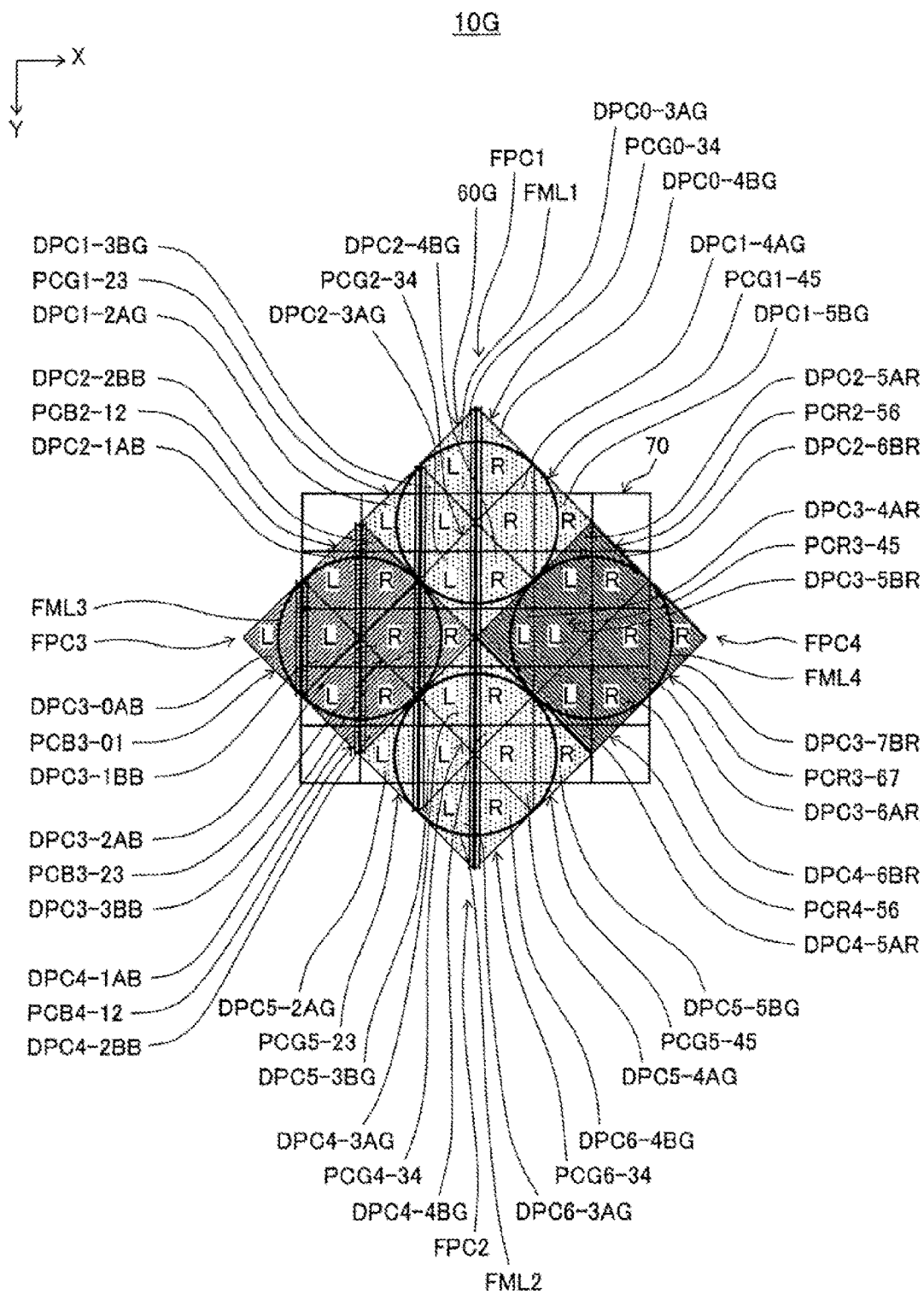
[FIG. 18]

[FIG. 19]
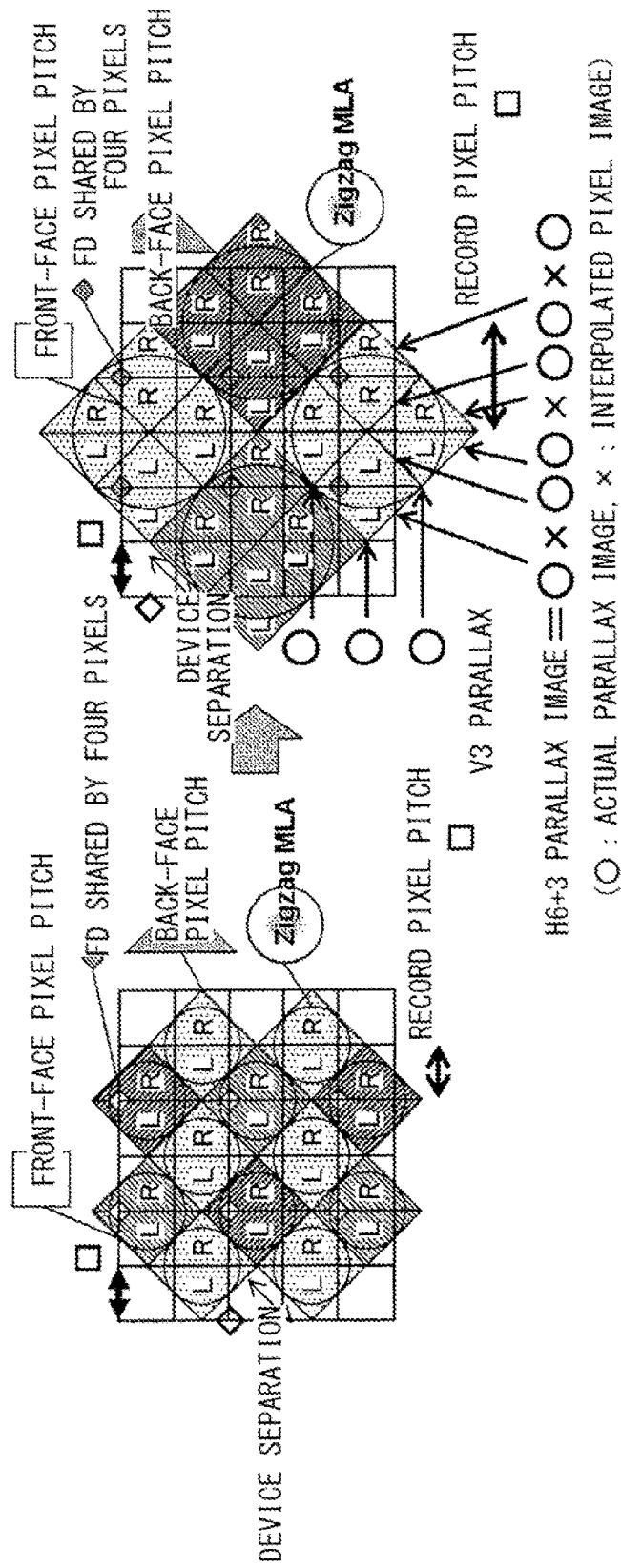

[FIG. 20]
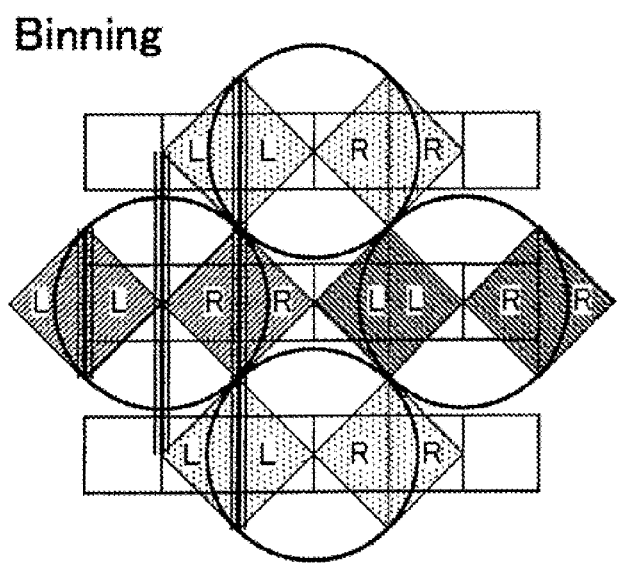
FOUR PARALLAXES ARE ACHIEVABLE ONLY BY G ROWS

[ FIG. 21 ]
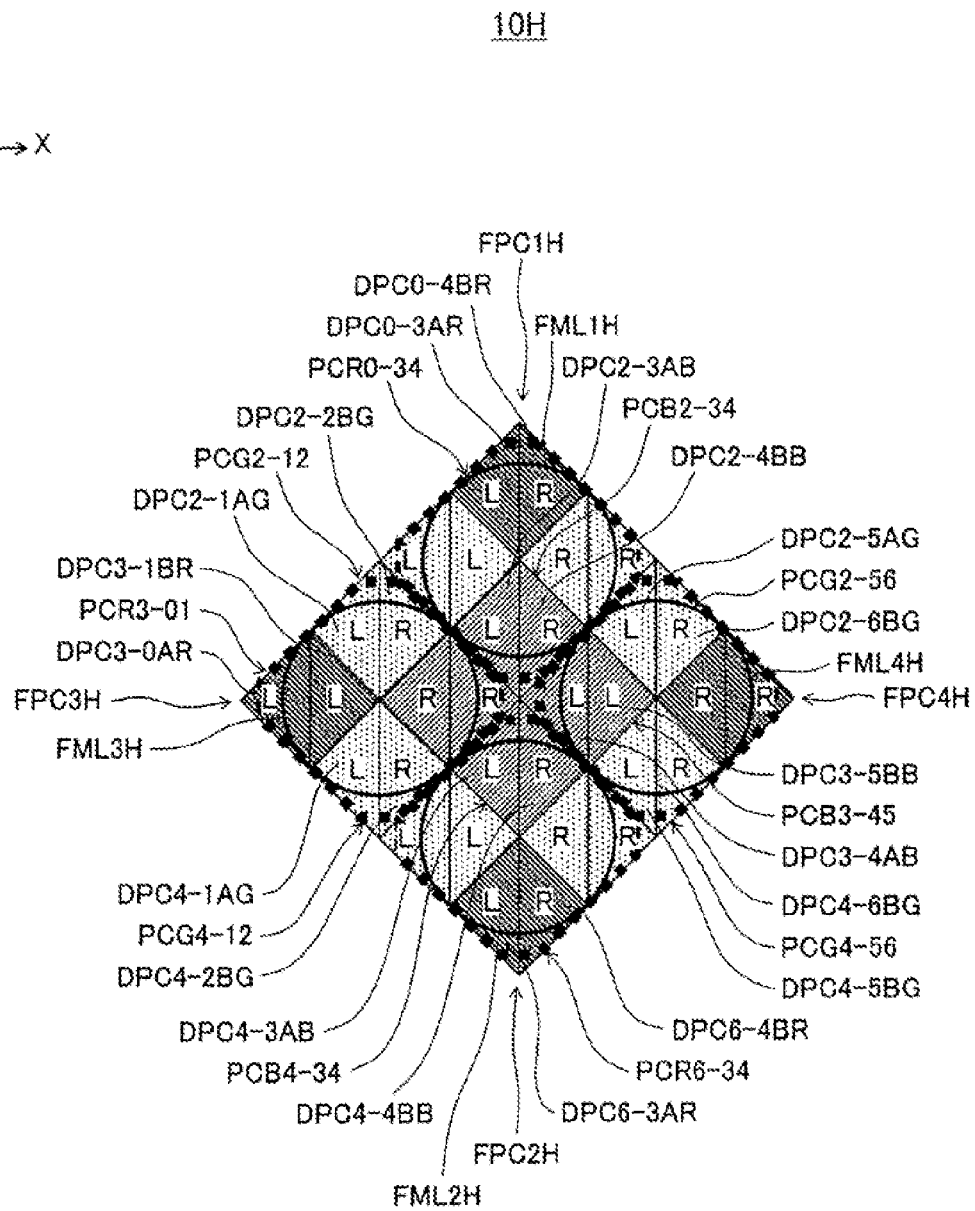

[ FIG. 22 ]
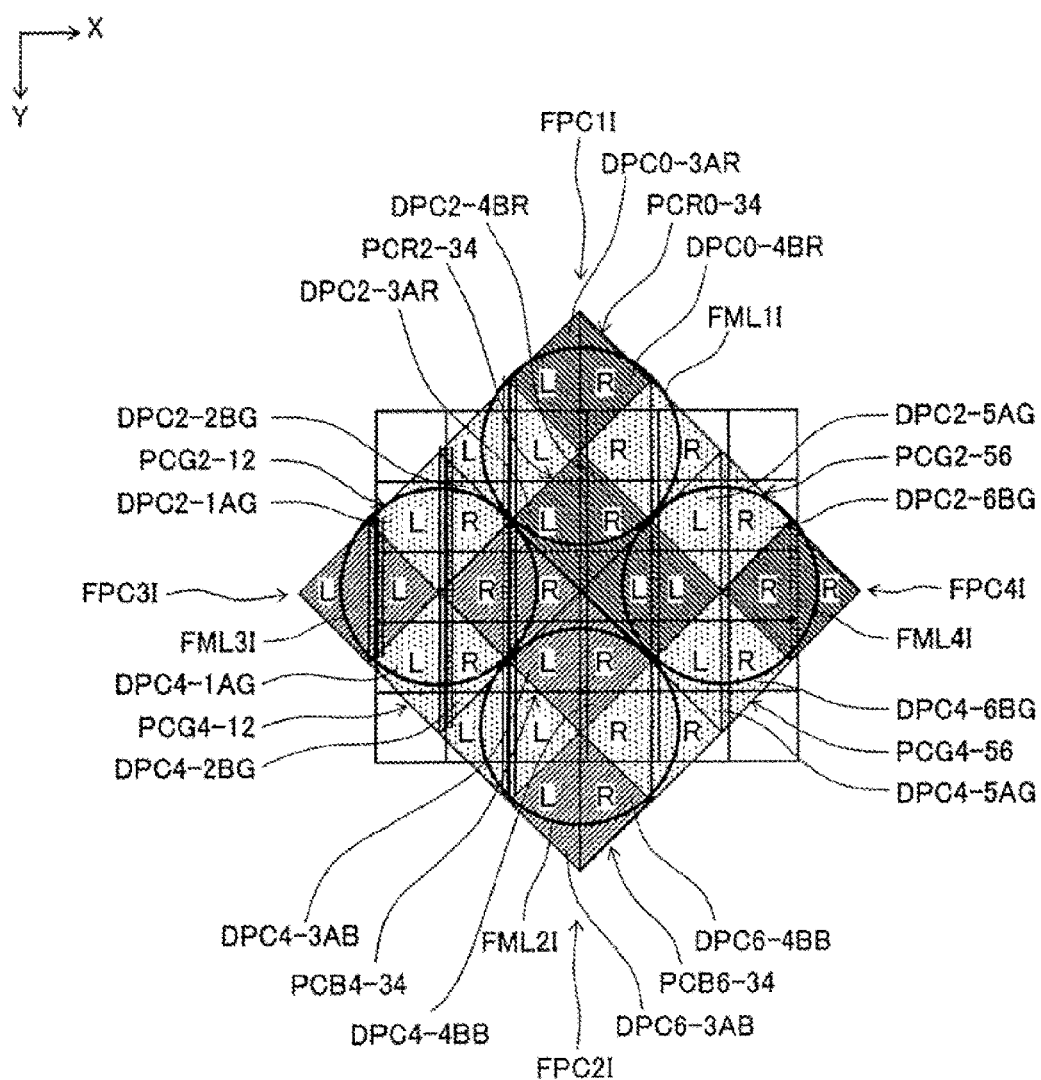

[ FIG. 23 ]
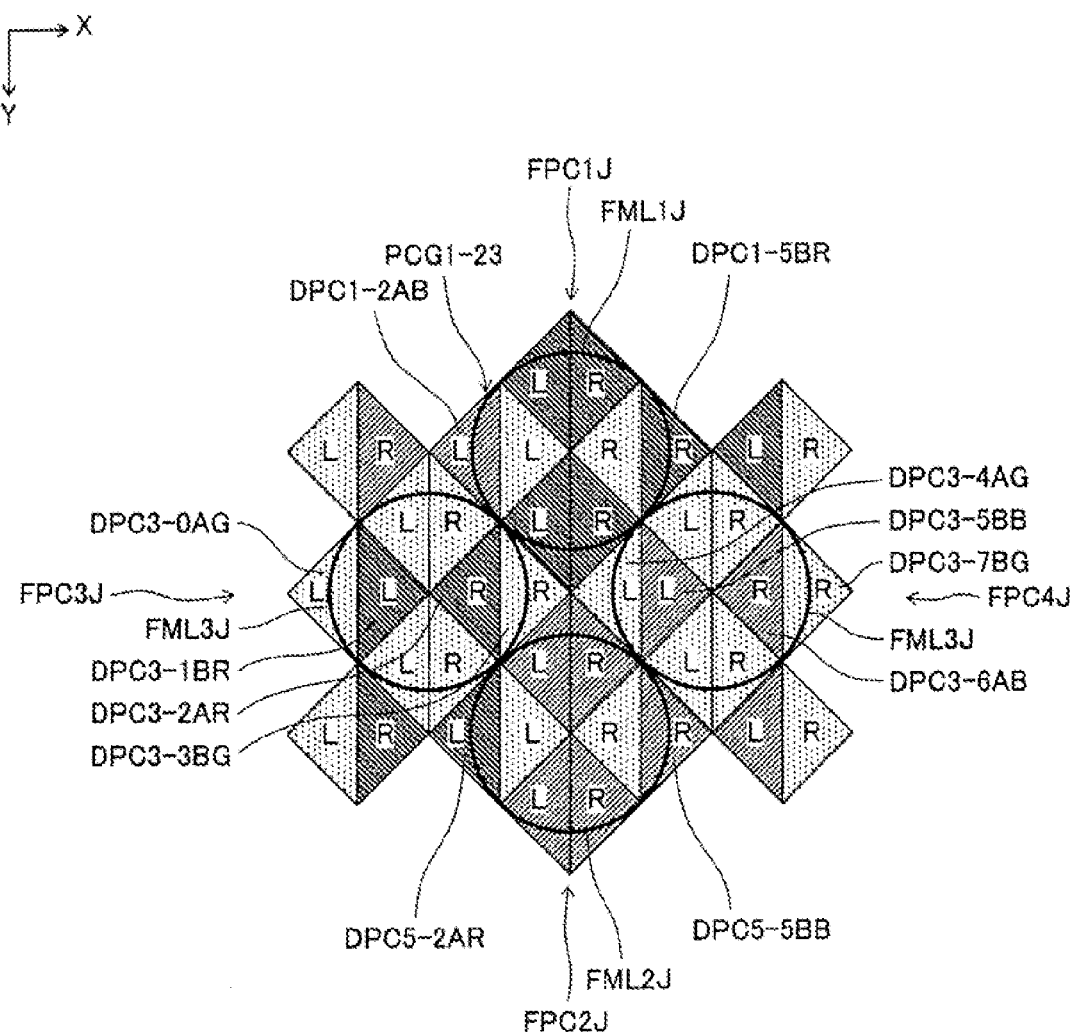

[ FIG. 24 ]
10J
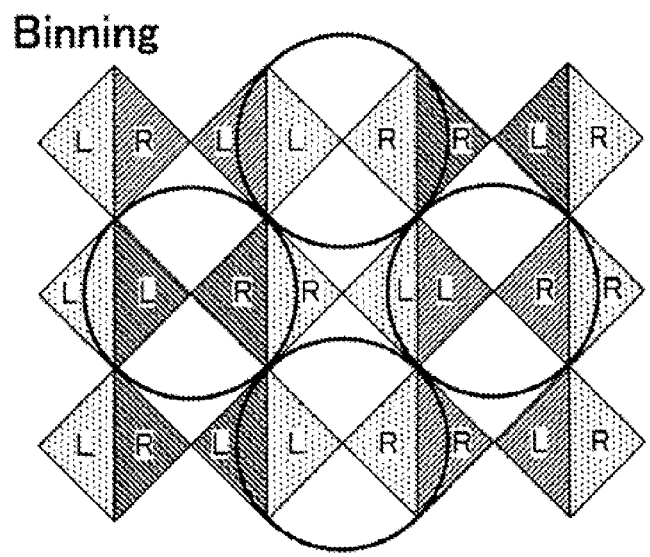
Binning
RGB PARRRALAX EXISTS IN EACH ROW WHEN THINNING IS PERFORMED

[FIG. 25]
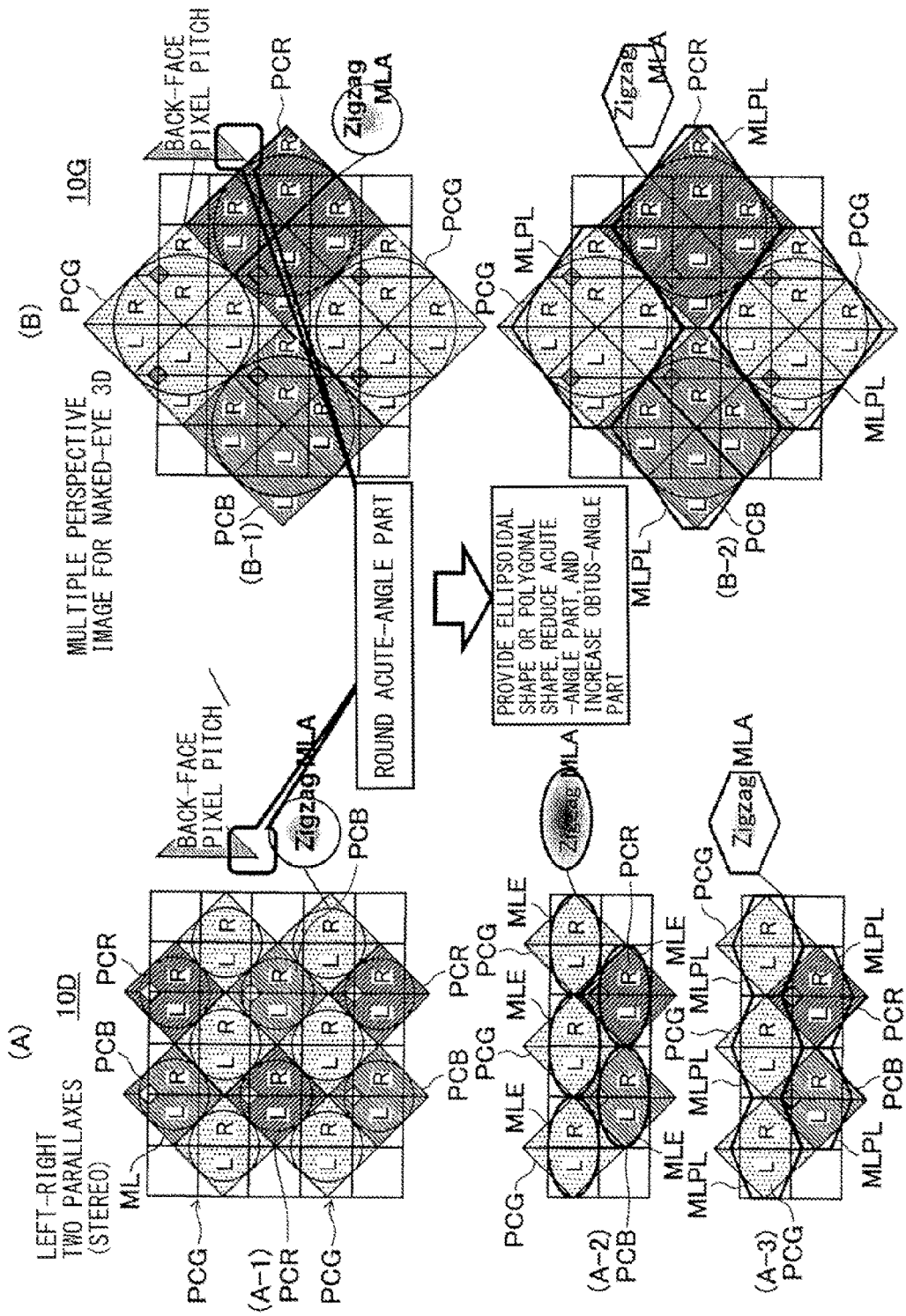

[FIG. 26]
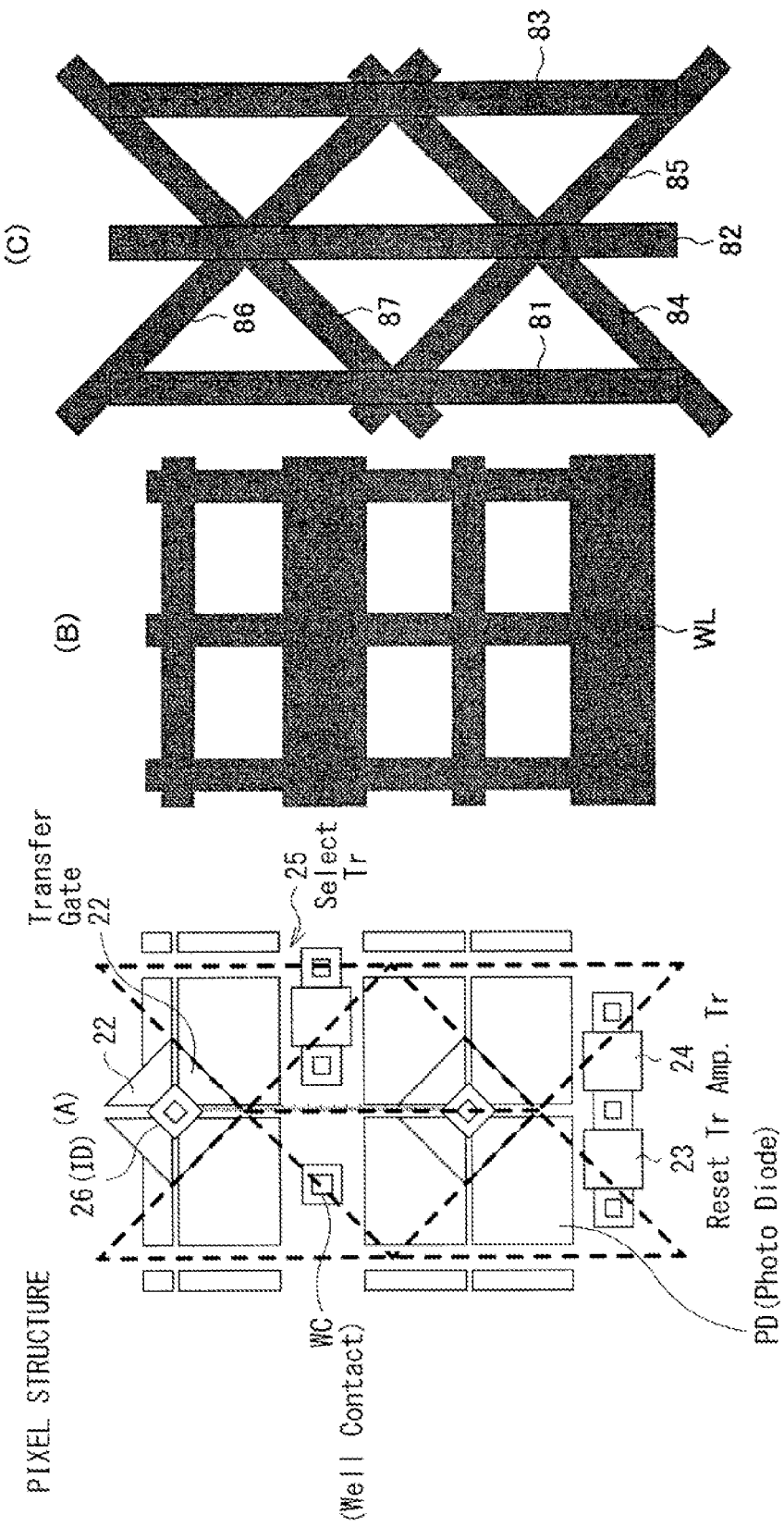

[FIG. 27]
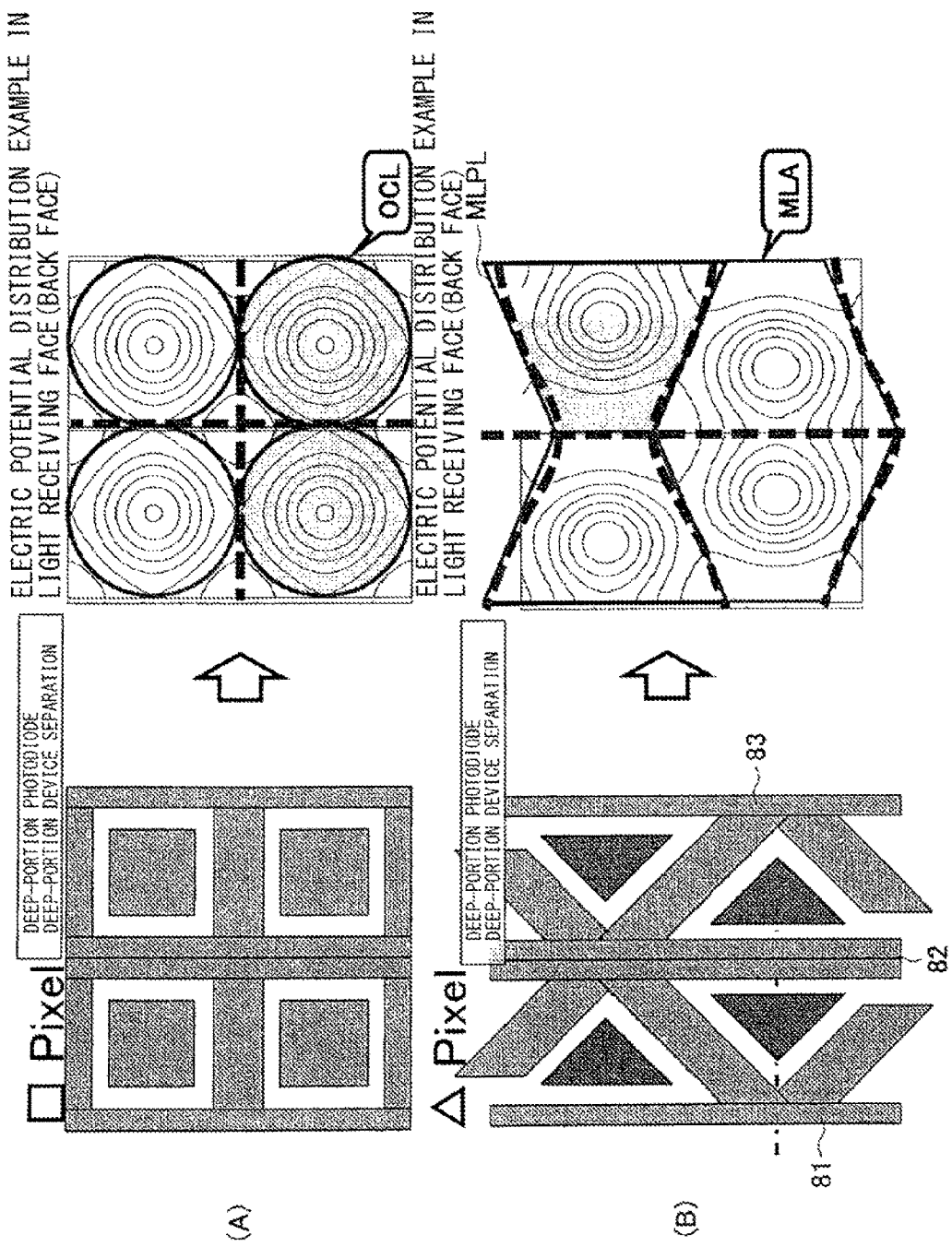

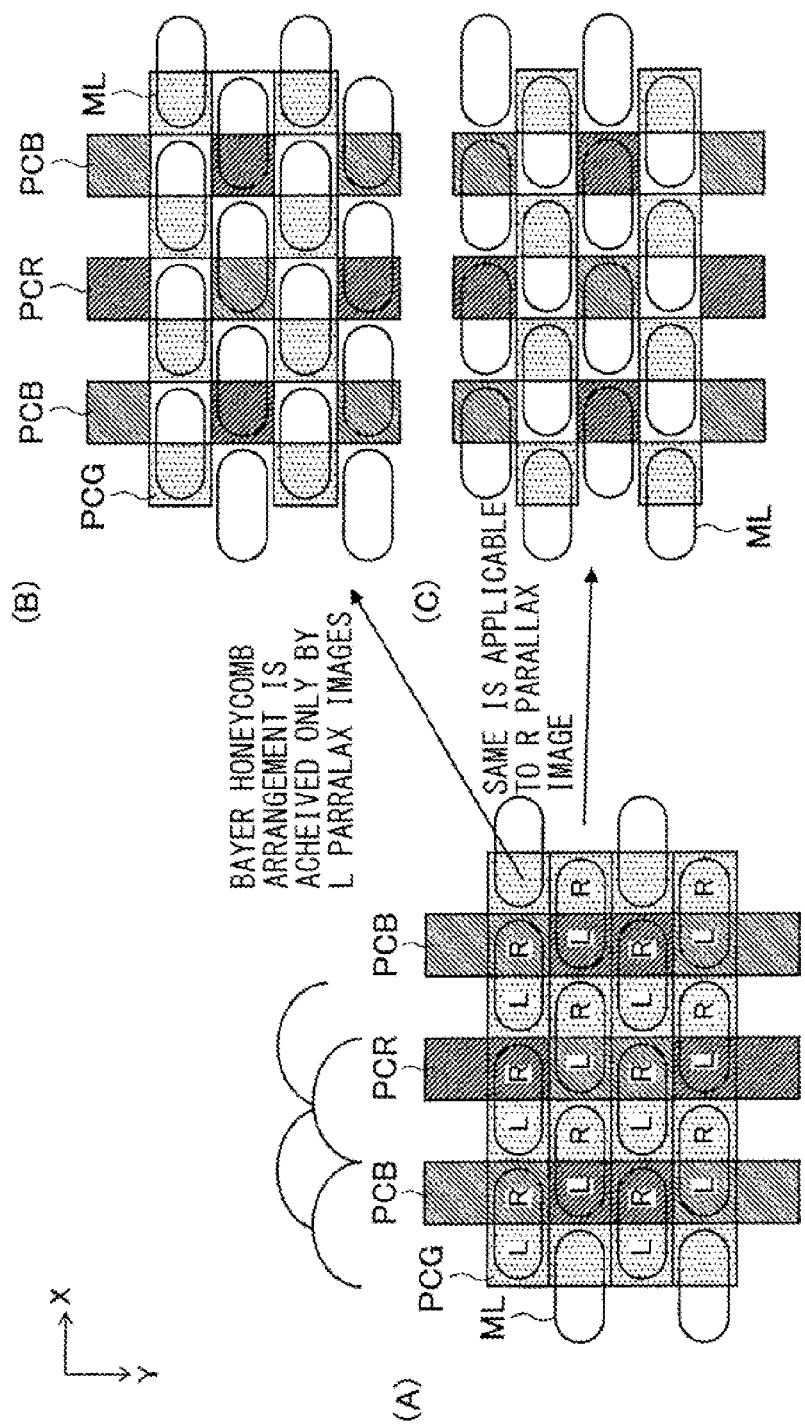

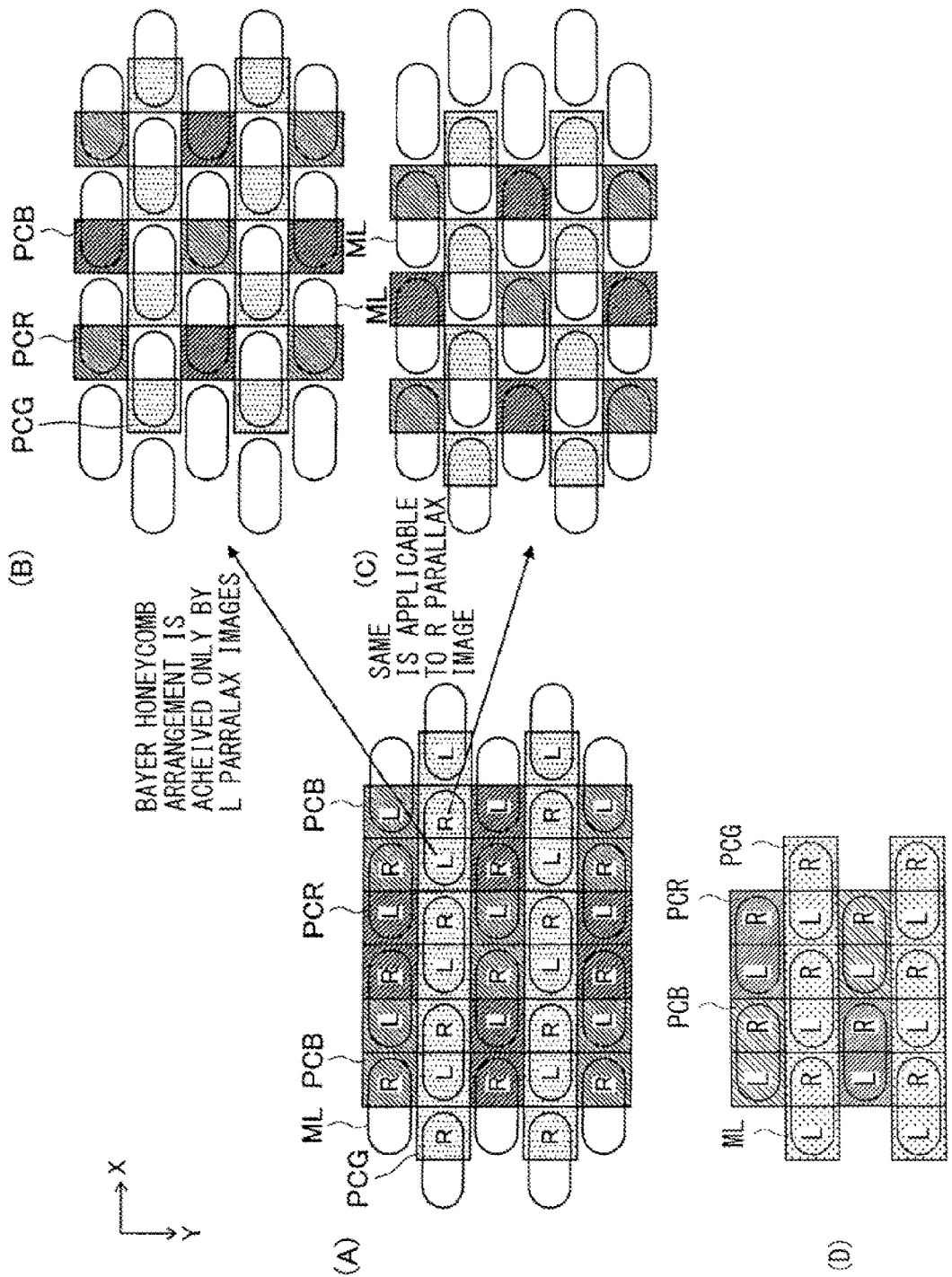
[ FIG. 29 ]

[ FIG. 30 ]
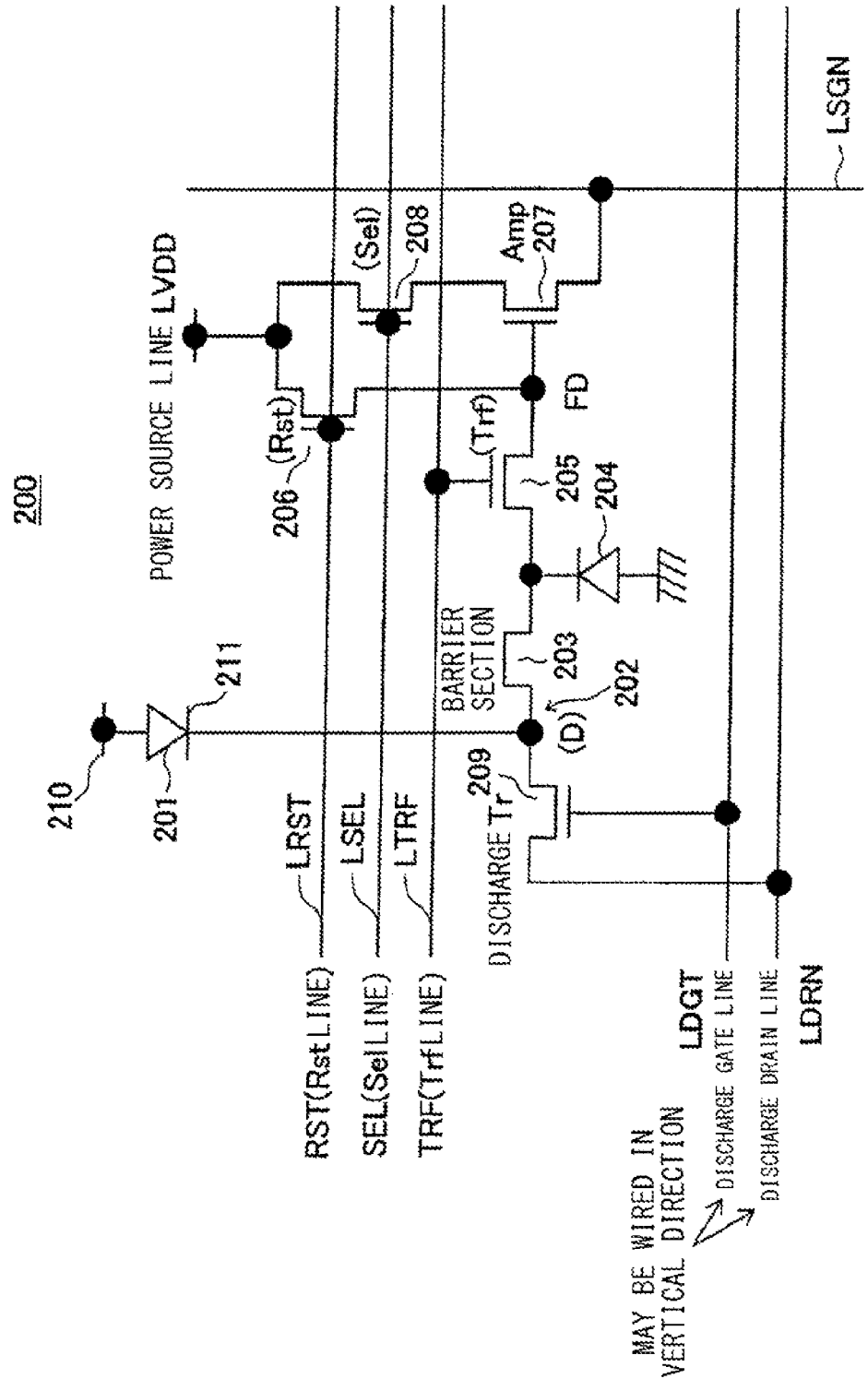

[FIG. 31]
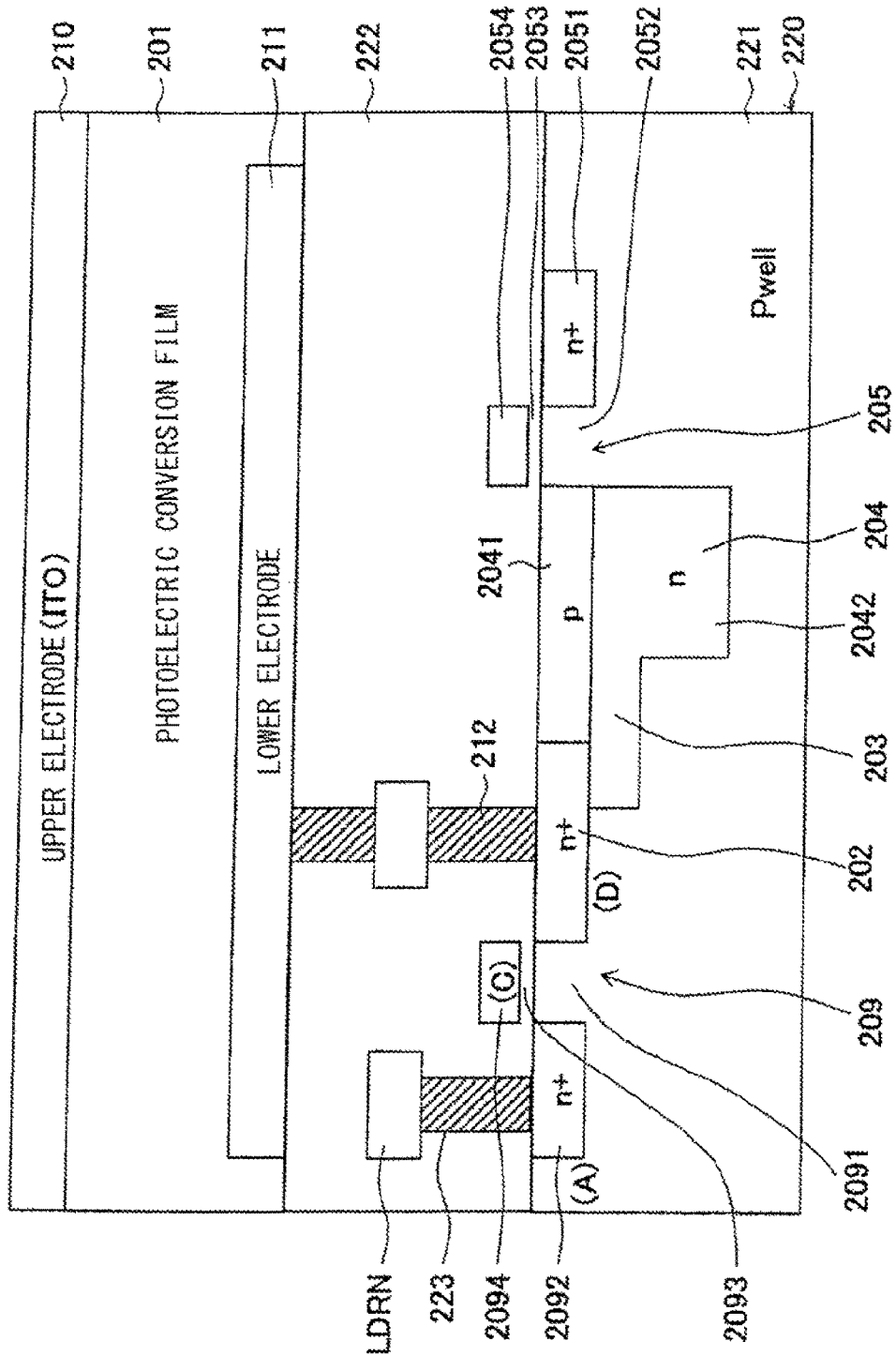

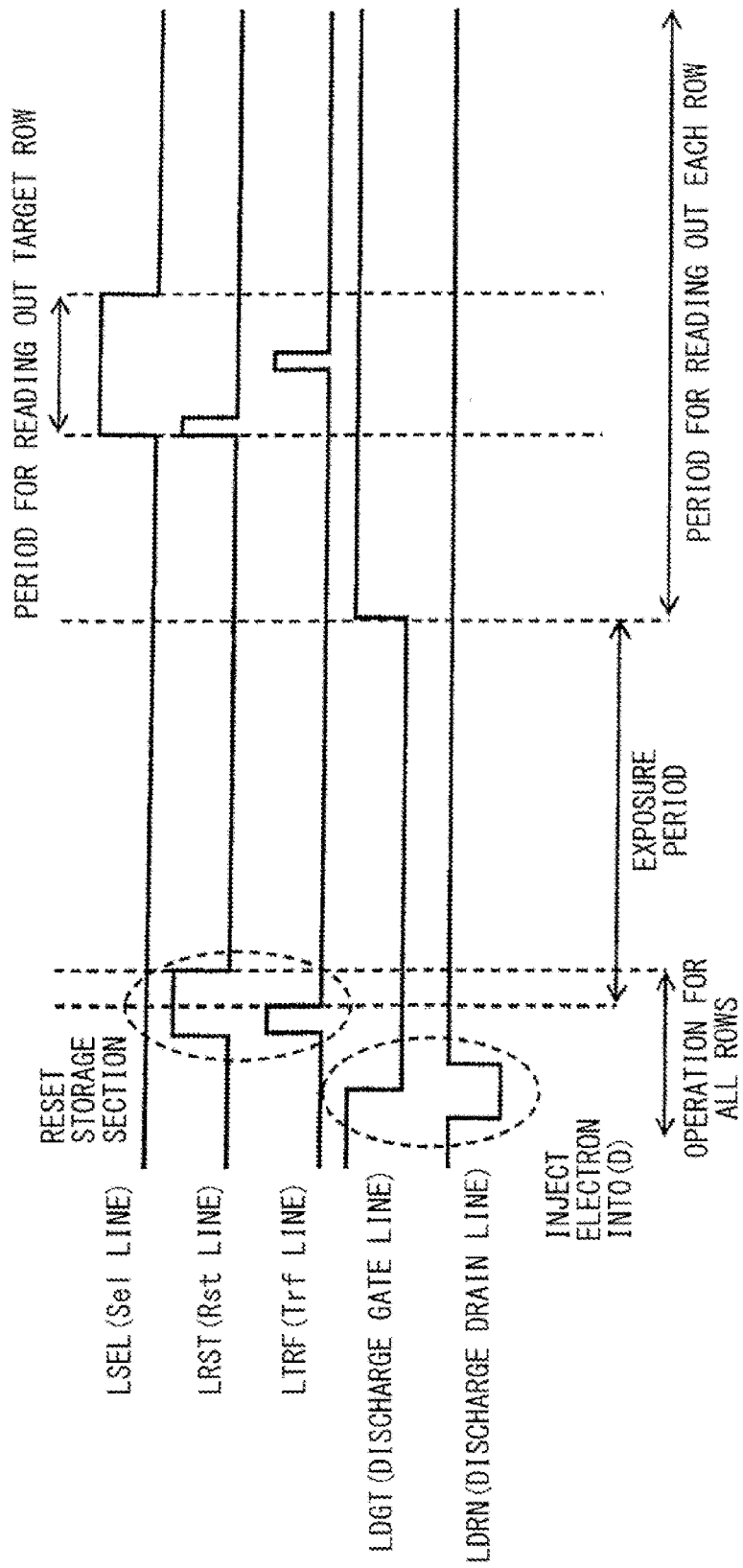
[FIG. 32]

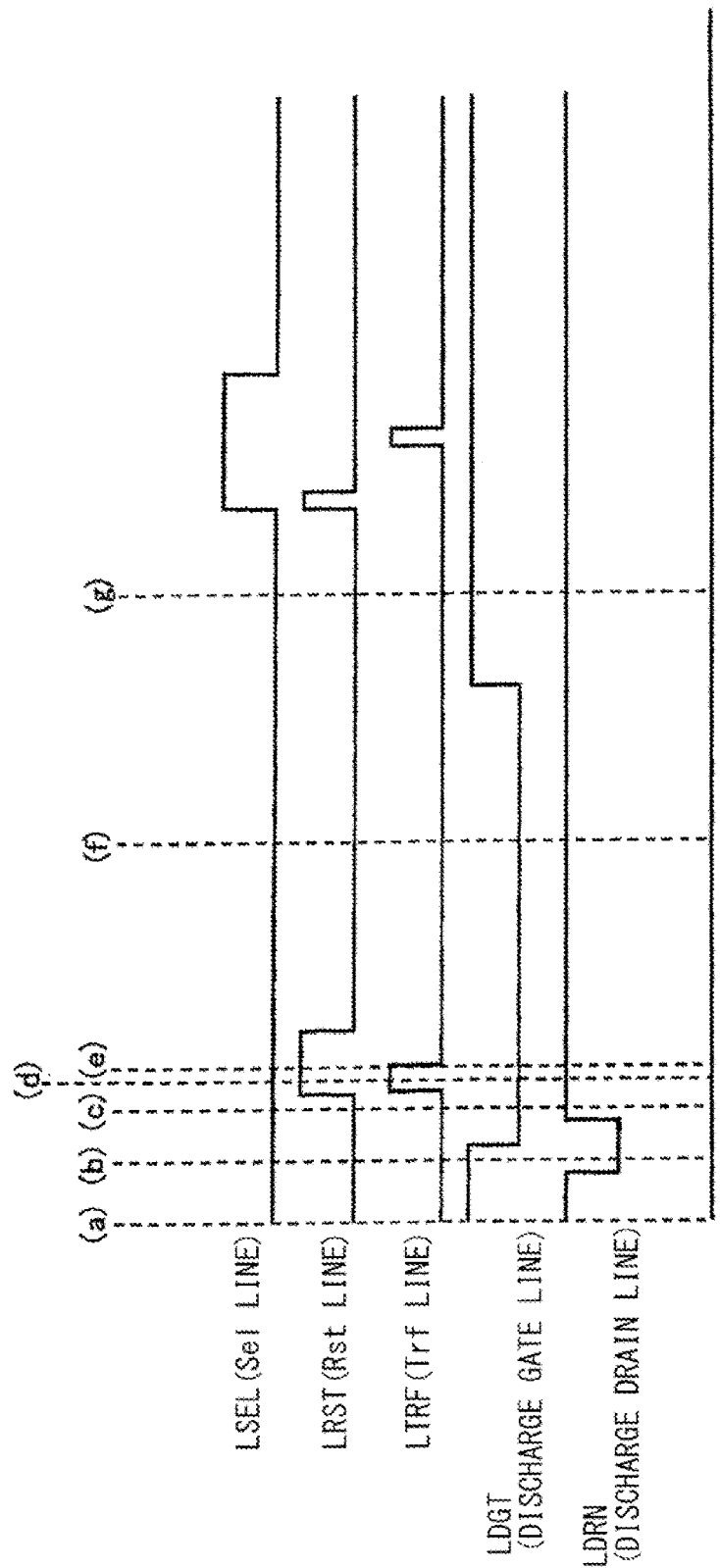
[FIG. 33]

[FIG. 34]
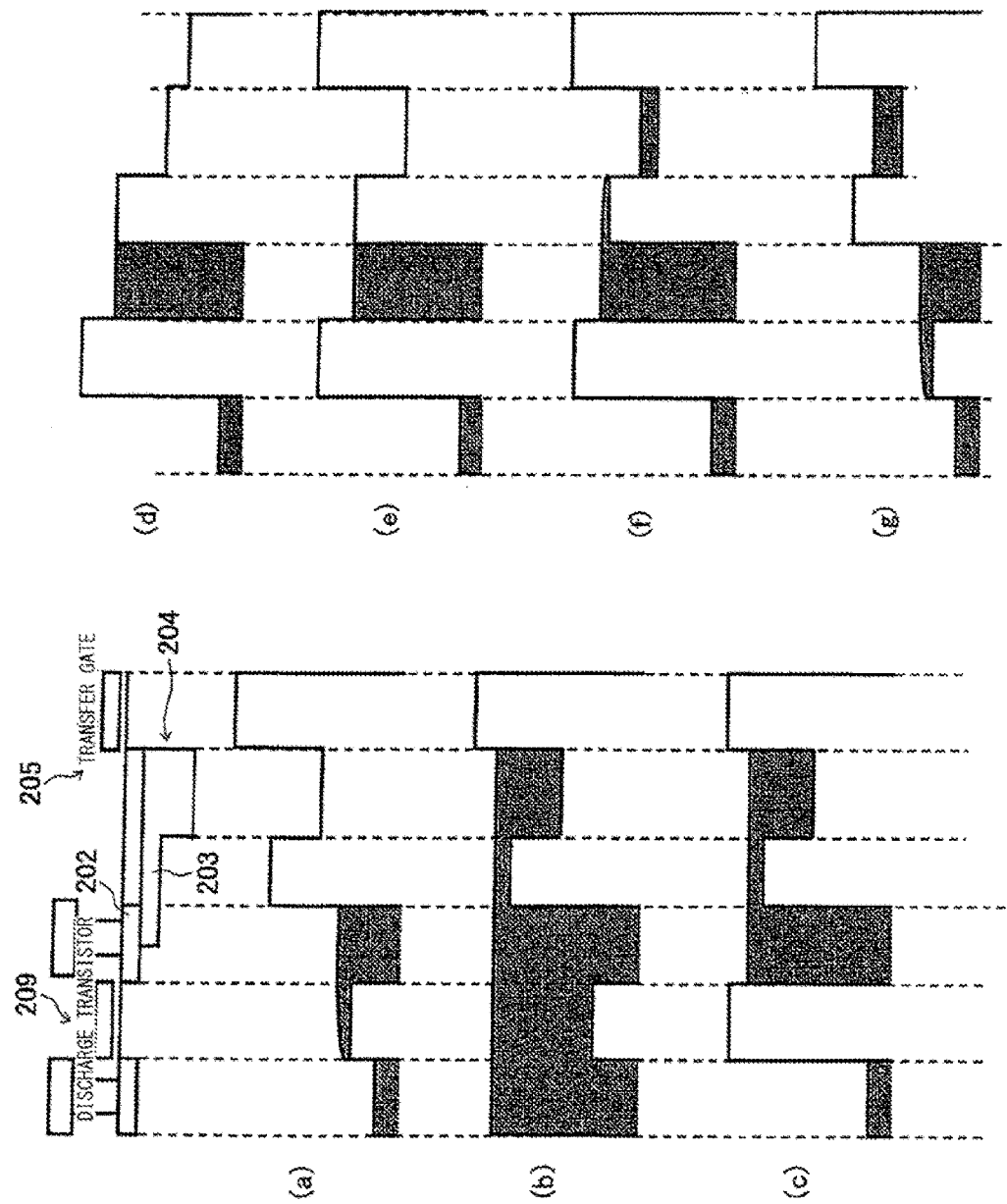

[ FIG. 35 ]
(A)
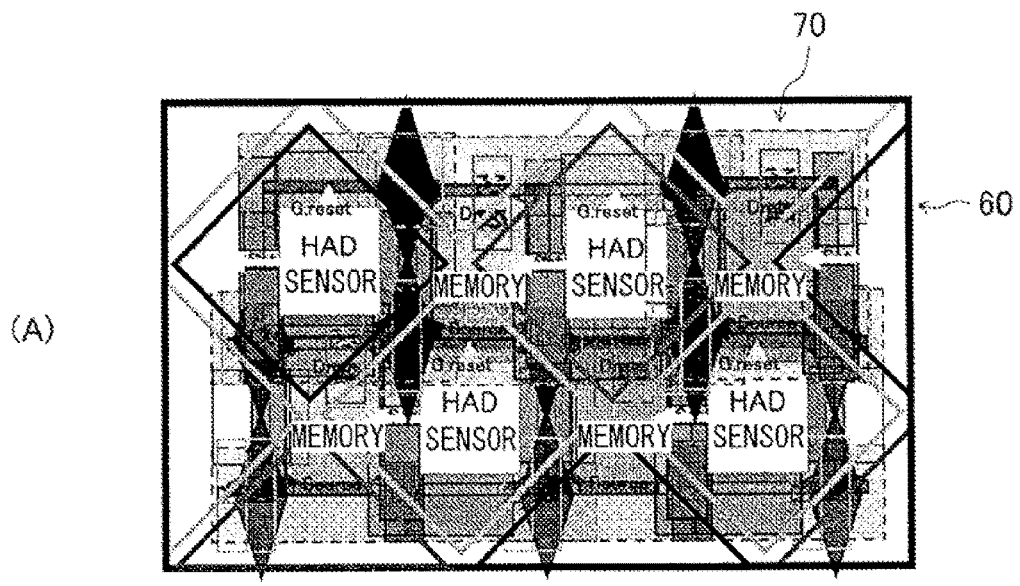
(B)
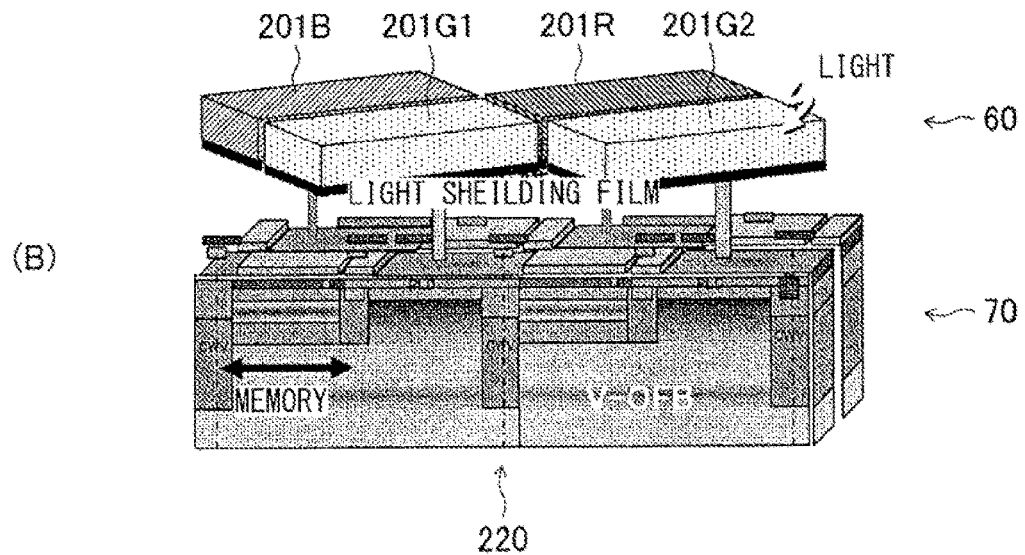

[ FIG. 36 ]
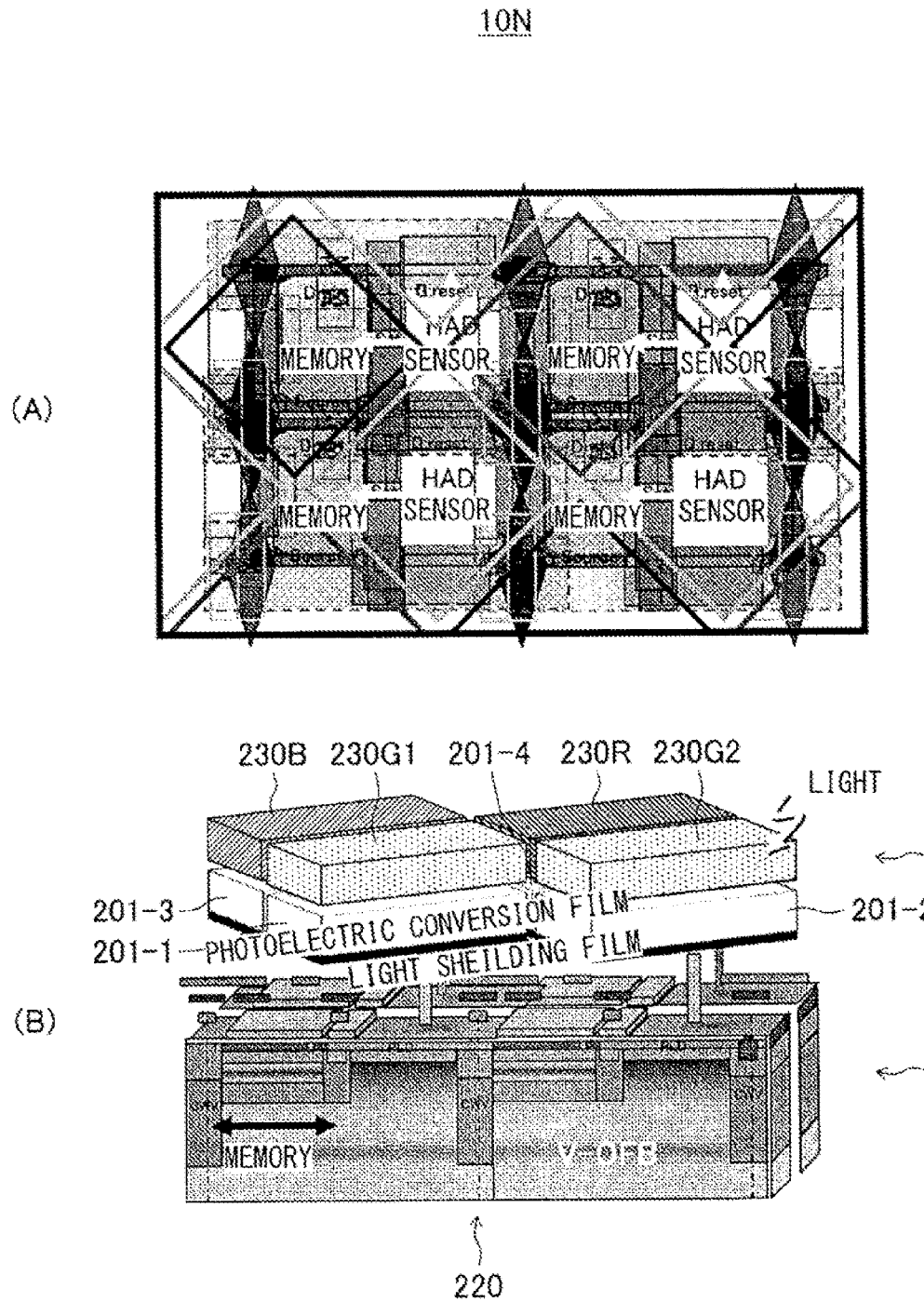

[FIG. 37]
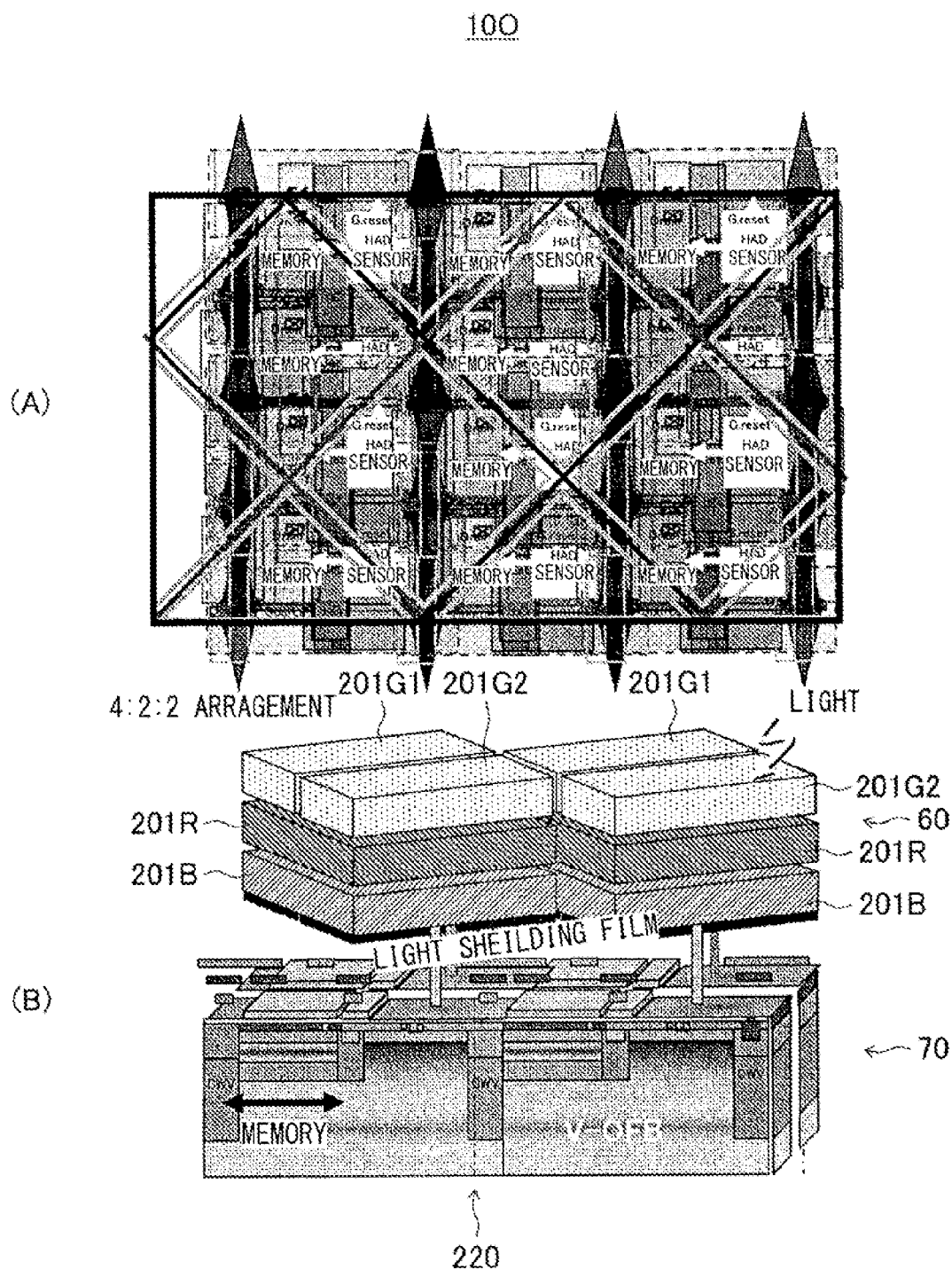

[ FIG. 38 ]
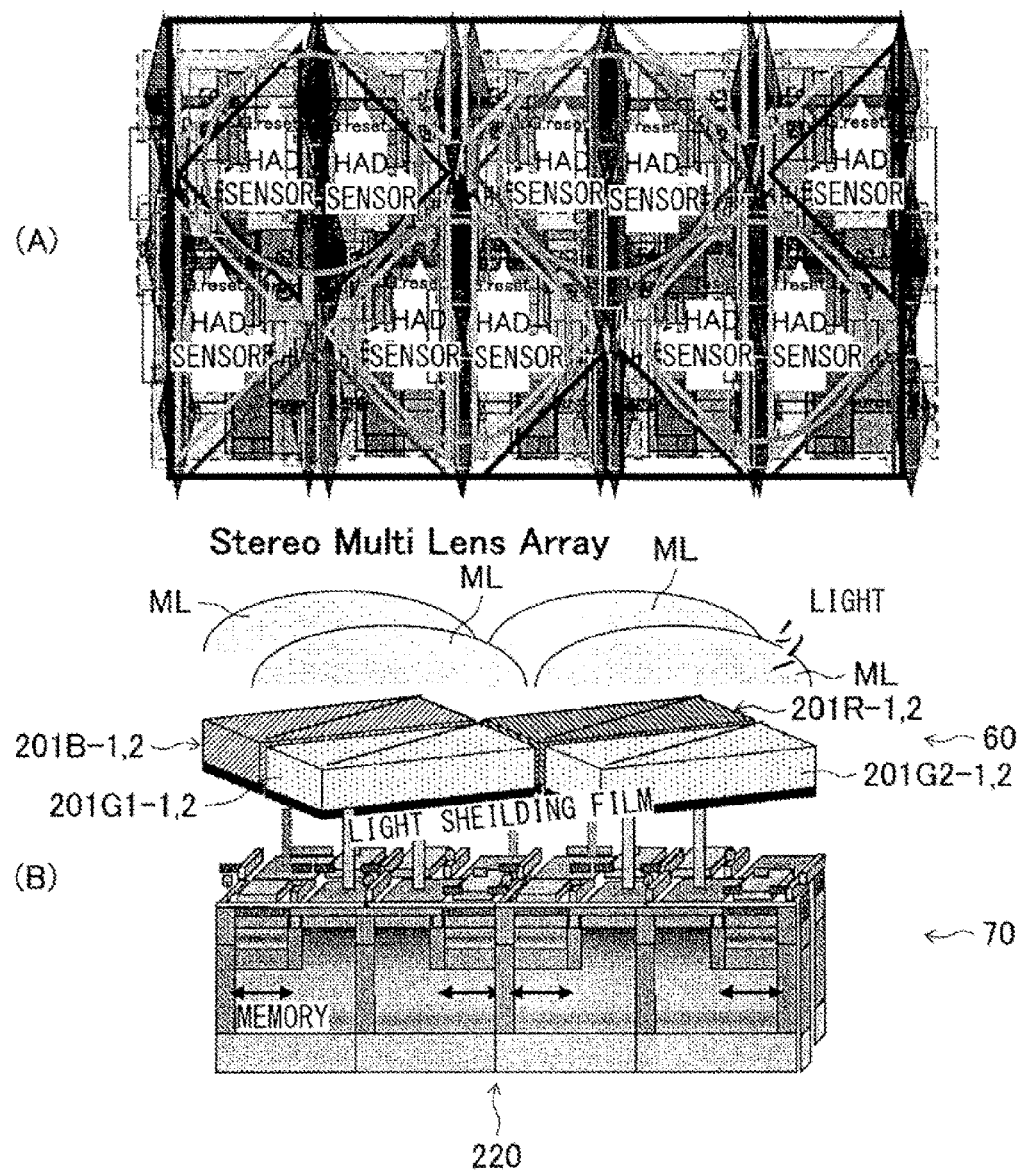

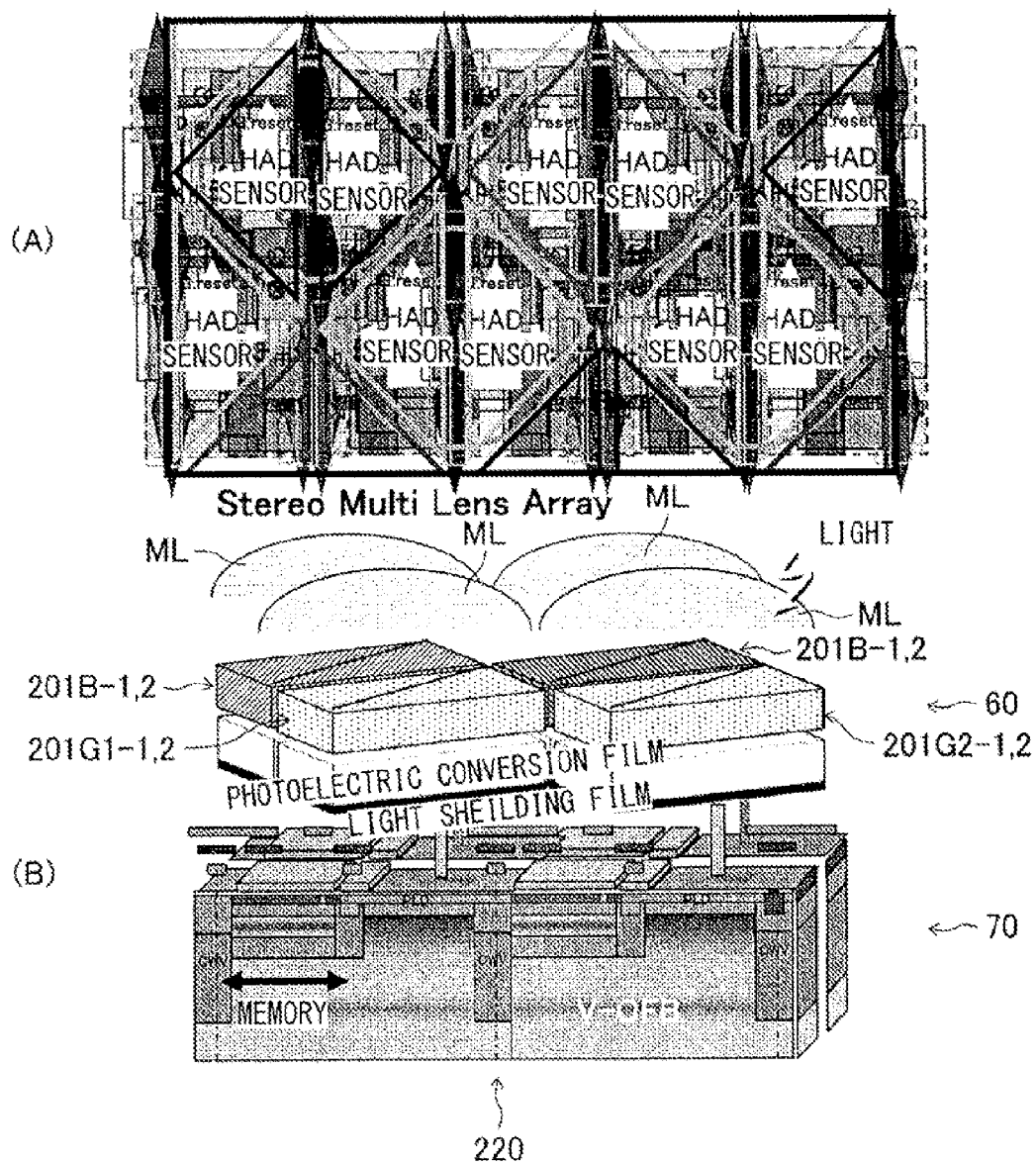
[ FIG. 39 ]

[ FIG. 40 ]
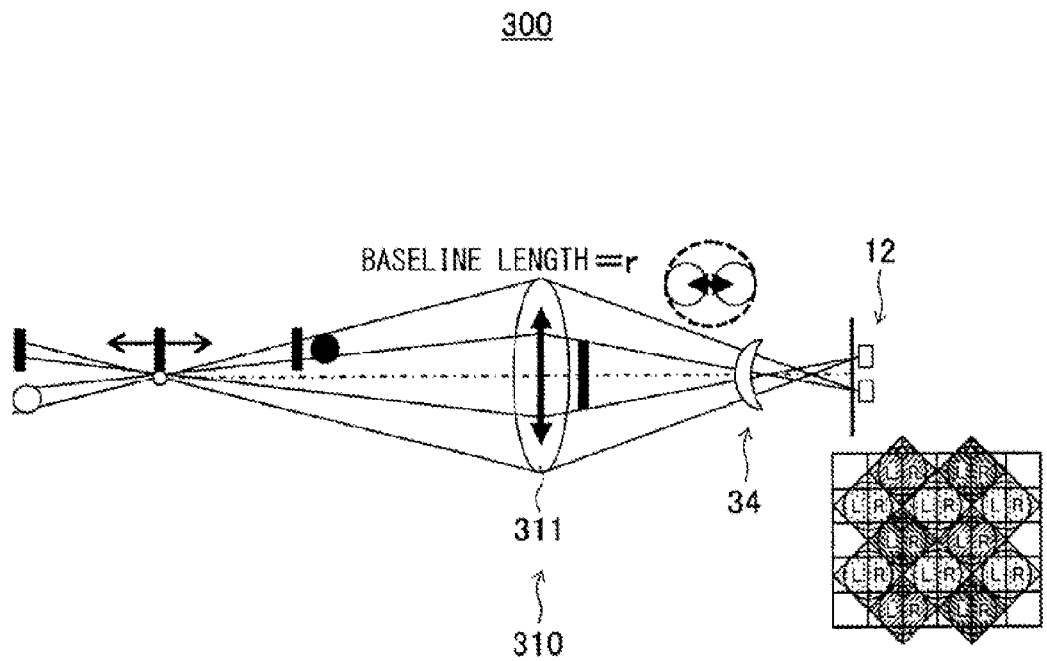

[ FIG. 41 ]
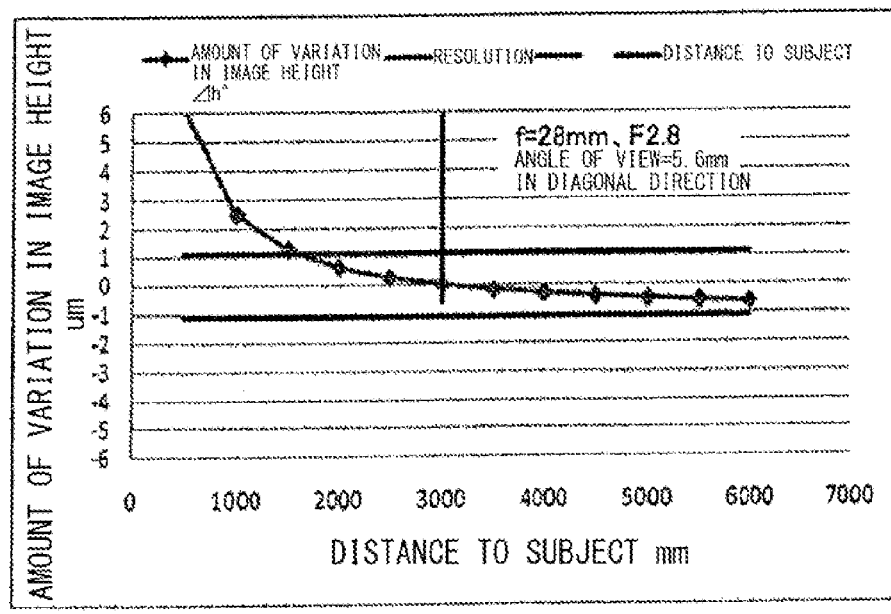

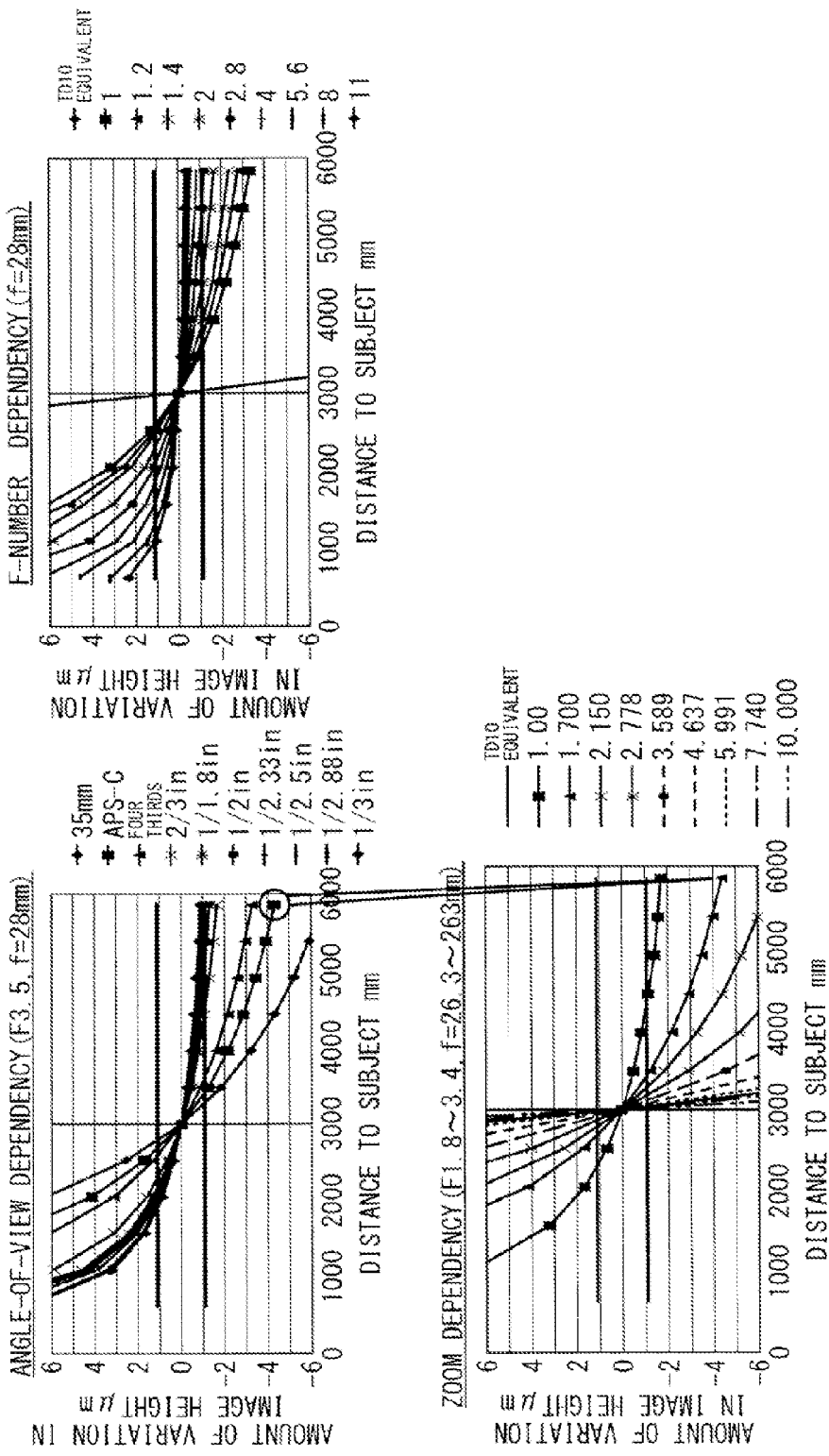

[ FIG. 43 ]
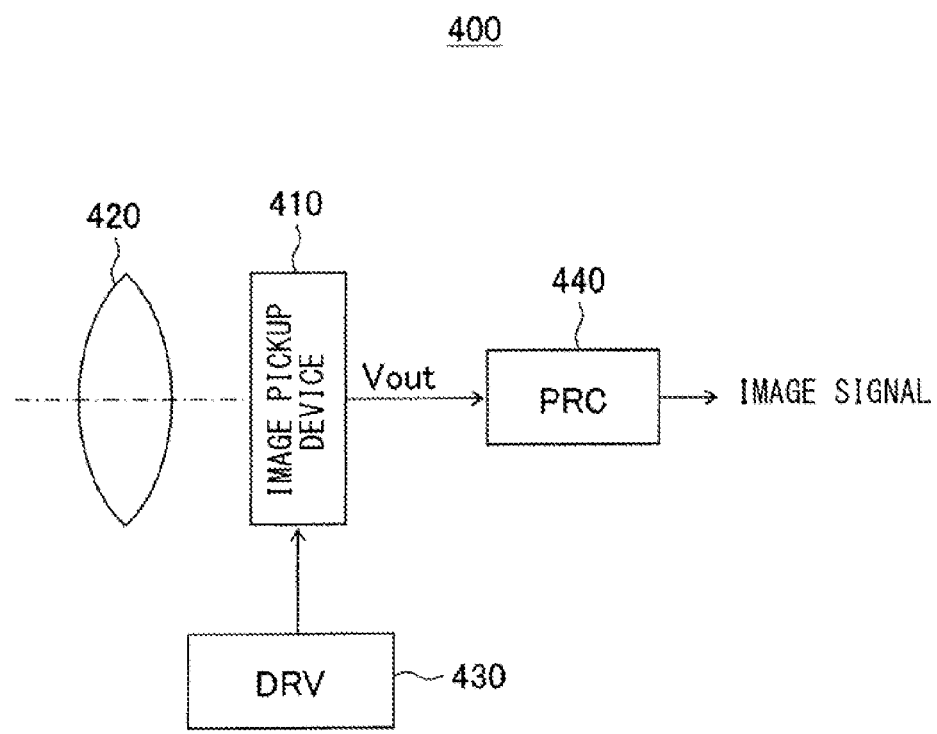

SOLID-STATE IMAGE PICKUP DEVICE AND CAMERA SYSTEM

TECHNICAL FIELD

The present technology relates to a solid-state image pickup device and a camera system that are applicable to a camera such as a stereo camera and a monocular three-dimensional (3D) stereo camera adopting, for example, light field technology.

BACKGROUND ART

As a light field camera, technologies disclosed in Patent Literature 1, Patent Literature 2, etc. have been known.

In the technology disclosed in Patent Literature 1, color coding (color arrangement) of a color filter array has a checkerboard-like arrangement (zigzag arrangement) obtained by rotating RGB Bayer arrangement by 45 degrees and allows four adjacent pixels at top, bottom, left, and right to have the same color. In other words, color coding that allows the respective filters of RGB to be arranged in a square arrangement based on a unit of four pixels having the same color is achieved.

Further, one multilens array is shared by a unit of four pixels (two pixels at top and bottom×two pixel at left and right) that are provided over different colors.

Moreover, also in the technology disclosed in Patent Literature 2, pixels are arranged two-dimensionally in a zigzag arrangement along two directions that are a direction rotated by 45 degrees from a horizontal direction and a direction rotated by 45 degrees from a vertical direction.

With the use of the microlens array, light rays from an object of image pickup are recorded by an image pickup device as light-ray vectors having perspectives different from each other, and thereby, parallax information is obtained. Allowing the image pickup device to have such a pixel arrangement as described above causes pixel pitches in the horizontal direction and the vertical direction to be smaller compared to a case in which pixels having the same size are two-dimensionally arranged along the horizontal and vertical directions.

CITATION LIST

Patent Literature

Patent Literature 1: Japanese Unexamined Patent Application Publication No. 2010-239337
Patent Literature 2: Japanese Unexamined Patent Application Publication No. 2010-154493

SUMMARY OF THE INVENTION

However, in the technologies disclosed in Patent Literatures 1 and 2, the zigzag light field based on a four-pixel unit is adopted. Therefore, when only a stereo function is used, the pixels at top and bottom are useless, which disadvantageously leads to degradation in resolution.

Further, it may be difficult to achieve stereo light field having two parallaxes of right and left with the use of square pixels.

Further, a light receiving face is the same face as a detection face in a currently-available pixel structure. Therefore, only combination of the same square can be achieved.

Accordingly, it is desirable to provide a solid-state image pickup device and a camera system that have no useless pixel arrangement and are capable of suppressing decrease in resolution which may be caused by adopting stereo function.

A solid-state image pickup device according to an embodiment of the present technology includes: a pixel array section including a plurality of pixels arranged in an array, each of the plurality of pixels having a photoelectric conversion function, each of the plurality of pixels in the pixel array section including a first pixel section including at least a microlens, a second pixel section including an electric charge detection element, and a photoelectric conversion element included in the first or second pixel section, the first and second pixel sections being formed in a laminated state, the second pixel section having a two-dimensional arrangement along a first direction and a second direction that is orthogonal to the first direction, and the first pixel section having a two-dimensional arrangement along directions different from the first and second directions.

A camera system according to an embodiment of the present technology includes a solid-state image pickup device, and an optical system configured to form an image of a subject on the foregoing solid-state image pickup device of the present technology.

According to the embodiment of the present invention, no useless pixel arrangement is provided, and decrease in resolution caused by adopting the stereo function is suppressed.

BRIEF DESCRIPTION OF THE DRAWINGS

FIG. 1 is a system configuration diagram illustrating an outline of a configuration of a solid-state image pickup device (CMOS image sensor) according to the present embodiment.

FIG. 2 is a circuit diagram illustrating an example of a circuit configuration of a unit pixel.

FIG. 3 is a diagram illustrating an example of a basic pixel structure of a solid-state image pickup device of a back-face illumination type.

FIG. 4 is a diagram illustrating an example of a well structure of a semiconductor substrate shown in FIG. 3.

FIG. 5 is a circuit diagram illustrating an example of a circuit configuration in a case where adjacent four-pixel addition is performed in a pixel.

FIG. 6 is a diagram illustrating Bayer arrangement as an example of a pixel arrangement.

FIG. 7 is a conceptual diagram of pixel division according to the present embodiment.

FIG. 8 is a diagram illustrating a first characteristic configuration example of the solid-state image pickup device (CMOS image sensor) according to the present embodiment.

FIG. 9 is a diagram illustrating a second characteristic configuration example of the solid-state image pickup device (CMOS image sensor) according to the present embodiment.

FIG. 10 is a diagram conceptually illustrating a pixel arrangement when a thinning operation is performed on a pixel arrangement shown in FIG. 9.

FIG. 11 is a diagram illustrating a third characteristic configuration example of the solid-state image pickup device (CMOS image sensor) according to the present embodiment.

FIG. 12 is a diagram illustrating a fourth characteristic configuration example of the solid-state image pickup device (CMOS image sensor) according to the present embodiment.

FIG. 13 is a diagram conceptually illustrating a pixel arrangement when binning operation is performed on a pixel arrangement shown in FIG. 12.

FIG. 14 is a diagram illustrating a fifth characteristic configuration example of the solid-state image pickup device (CMOS image sensor) according to the present embodiment.

FIG. 15 is a diagram conceptually illustrating a pixel arrangement when the binning operation is performed on a pixel arrangement shown in FIG. 14.

FIG. 16 is a diagram illustrating a sixth characteristic configuration example of the solid-state image pickup device (CMOS image sensor) according to the present embodiment.

FIG. 17 is a diagram conceptually illustrating a pixel arrangement when addition processing is performed on a pixel arrangement shown in FIG. 16.

FIG. 18 is a diagram illustrating a seventh characteristic configuration example of the solid-state image pickup device (CMOS image sensor) according to the present embodiment.

FIG. 19 is a diagram for discussing the example shown in FIG. 18 in terms of multiple perspectives in the Bayer arrangement.

FIG. 20 is a diagram conceptually illustrating a pixel arrangement when the binning processing is performed on the example shown in FIG. 18.

FIG. 21 is a diagram illustrating an eighth characteristic configuration example of the solid-state image pickup device (CMOS image sensor) according to the present embodiment.

FIG. 22 is a diagram illustrating a ninth characteristic configuration example of the solid-state image pickup device (CMOS image sensor) according to the present embodiment.

FIG. 23 is a diagram illustrating a tenth characteristic configuration example of the solid-state image pickup device (CMOS image sensor) according to the present embodiment.

FIG. 24 is a diagram conceptually illustrating a pixel arrangement when the binning processing is performed on the example shown in FIG. 23.

FIG. 25 is a diagram illustrating an eleventh characteristic configuration example of the solid-state image pickup device (CMOS image sensor) according to the present embodiment.

FIG. 26 is a diagram illustrating a twelfth characteristic configuration example of the solid-state image pickup device (CMOS image sensor) according to the present embodiment.

FIG. 27 is a diagram illustrating examples of electric potential distribution in light receiving faces in a typical pixel structure and in a pixel structure shown in FIG. 26.

FIG. 28 is a diagram illustrating a thirteenth characteristic configuration example of the solid-state image pickup device (CMOS image sensor) according to the present embodiment.

FIG. 29 is a diagram illustrating a fourteenth characteristic configuration example of the solid-state image pickup device (CMOS image sensor) according to the present embodiment.

FIG. 30 is a circuit diagram illustrating a configuration example of a laminated-type pixel according to the present embodiment.

FIG. 31 is a partially-omitted/simplified cross-sectional view illustrating the configuration example of the laminated-type pixel according to the present embodiment.

FIG. 32 is a timing chart for explaining operation of the pixel shown in FIG. 30 and FIG. 31.

FIG. 33 is a first diagram illustrating a potential diagram for each operation timing in FIG. 30 and FIG. 31.

FIG. 34 is a second diagram illustrating a potential diagram for each operation timing in FIG. 30 and FIG. 31.

FIG. 35 is a diagram illustrating a fifteenth characteristic configuration example of the solid-state image pickup device (CMOS image sensor) according to the present embodiment.

FIG. 36 is a diagram illustrating a sixteenth characteristic configuration example of the solid-state image pickup device (CMOS image sensor) according to the present embodiment.

FIG. 37 is a diagram illustrating a seventeenth characteristic configuration example of the solid-state image pickup device (CMOS image sensor) according to the present embodiment.

FIG. 38 is a diagram illustrating an eighteenth characteristic configuration example of the solid-state image pickup device (CMOS image sensor) according to the present embodiment.

FIG. 39 is a diagram illustrating a nineteenth characteristic configuration example of the solid-state image pickup device (CMOS image sensor) according to the present embodiment.

FIG. 40 is a diagram illustrating a configuration example of a monocular 3D stereo camera to which the solid-state image pickup device (CMOS image sensor) according to the present embodiment is applied.

FIG. 41 is a diagram illustrating dependency, on distance to a subject, of an amount of variation in image height in the monocular 3D stereo camera to which the solid-state image pickup device (CMOS image sensor) according to the present embodiment is applied.

FIG. 42 is a diagram illustrating an amount of variation in imaging with respect to the distance to the subject in the monocular 3D stereo camera to which the solid-state image pickup device (CMOS image sensor) according to the present embodiment is applied.

FIG. 43 is a diagram illustrating an example of a configuration of a camera system to which the solid-state image pickup device according to the present embodiment is applied.

MODE(S) FOR CARRYING OUT THE INVENTION

An embodiment of the present invention will be described below related to the drawings.

It is to be noted that the description will be given in the following order.
1. Configuration Example of Solid-state Image Pickup Device (an example of a CMOS image sensor)
2. Characteristic Configuration of Present Embodiment
2-1. First Characteristic Configuration Example
2-2. Second Characteristic Configuration Example
2-3. Third Characteristic Configuration Example
2-4. Fourth Characteristic Configuration Example
2-5. Fifth Characteristic Configuration Example
2-6. Sixth Characteristic Configuration Example
2-7. Seventh Characteristic Configuration Example
2-8. Eighth Characteristic Configuration Example
2-9. Ninth Characteristic Configuration Example
2-10. Tenth Characteristic Configuration Example
2-11. Eleventh Characteristic Configuration Example
2-12. Twelfth Characteristic Configuration Example 2-13. Thirteenth Characteristic Configuration Example
2-14. Fourteenth Characteristic Configuration Example
2-15. Fifteenth Characteristic Configuration Example
2-16. Sixteenth Characteristic Configuration Example
2-17. Seventeenth Characteristic Configuration Example
2-18. Eighteenth Characteristic Configuration Example
2-19. Nineteenth Characteristic Configuration Example
3. Configuration Example of Monocular 3D Stereo Camera to which Present Embodiment is Applicable
4. Configuration Example of Camera System 1. Configuration Example of Solid-State Image Pickup Device

[System Configuration]

FIG. 1 is a system configuration diagram illustrating an outline of a configuration of a solid-state image pickup device according to the present embodiment, for example, of a CMOS image sensor that is a kind of a solid-state image pickup device of an X-Y address type.

A CMOS image sensor 10 according to the present embodiment includes a pixel array section 12 formed on a semiconductor substrate (hereinafter, may be simply referred to as "sensor chip" in some cases) 11 and peripheral circuit sections integrated on the same semiconductor substrate 11 for the pixel array section 12.

As the peripheral circuit sections, for example, a vertical drive section 13, a column processing section 14, a horizontal drive section 15, and a system control section 16 may be arranged. Further, a DSP (Digital Signal Processor) circuit 31 and an image memory 32 are arranged outside the sensor chip 11. The DSP circuit 31 configures a signal processing system.

In the pixel array section 12, unillustrated unit pixels (hereinafter, may be simply referred to as "pixel" in some cases) are arranged in an array. The unit pixel includes a photoelectric conversion element or a photoelectric conversion film that converts entering visible light into electric charge having an amount in accordance with the amount of the light.

In the pixel array section 12, basically, part of the unit pixels adopts a checkerboard-like zigzag arrangement obtained by rotating each unit pixel, for example, by 45 degrees using a square arrangement as a reference.

Each unit pixel receives entering light and is configured to have a photoelectric conversion function for received light, an electric charge storing function, and an electric charge storing function to detect stored electric charge.

Each unit pixel is configured so that a first pixel section and a second pixel section are laminated (overlapped) as will be described later. The first pixel section has at least a light receiving function. The second pixel section is so formed as to face the first pixel section, and has at least the electric charge detection function.

As a structure of the pixel, for example, a structure of a solid-state image pickup device of a back-face illumination type or a structure of a solid-state image pickup device of a laminated type may be adopted. In the structure of the solid-state image pickup device of the back-face illumination type, light enters on one face side (back face side) of a substrate, and elements such as a transistor for electric charge detection are formed on the other face side (front face side) thereof. In the structure of the solid-state image pickup device of the laminated type, a photoelectric conversion film is formed in a light receiving section.

A specific circuit configuration and a specific lamination structure of the unit pixel will be described later. In the example shown in FIG. 1, a color filter array 33, a photoelectric conversion film, and the like are formed on the light receiving face (light entering face) side of the pixel array section 12, and a multilens array (MLA) 34 is arranged on an upper side thereof. Further, an on-chip lens OCL is arranged above the color filter array 33, the photoelectric conversion film, and the like.

Basically, in the present embodiment, a configuration in which LR parallax separation is performed with the use of a multilens array (MLA) is adopted as a stereo version of the light field, as will be described later.

Further, the present embodiment is so configured that, a WDR image in 3D stereo is obtainable by a monocular configuration as will be described later.

It is to be noted that, in the present description, a solid-state image pickup device performing color shooting with the use of a color filter is described as an example. However, a configuration in which the color filter is not provided (a solid-state image pickup device performing monochrome shooting) may be adopted depending on applications.

Further, pixel drive lines 18 are wired to the pixel array section 12 along a lateral direction in the diagram (a pixel arrangement direction in pixel rows/the horizontal direction) for the respective rows of the pixel arrangement in a matrix state. Vertical signal lines 17 are formed along a top-to-bottom direction in the diagram (a pixel arrangement direction in pixel columns/the vertical direction) for the respective columns thereof.

One end of the pixel drive line 18 is connected to an output terminal corresponding to each row of the vertical drive section 13. The pixel drive line 18 is illustrated as being configured of one line in FIG. 1, however, it is not limited to one.

The vertical drive section 13 is configured of a shift register, an address decoder, and/or the like. A specific configuration thereof will not be illustrated here. However, the vertical drive section 13 has a configuration including a read-out scanning system and a sweep-out scanning system. The read-out scanning system sequentially performs selection scanning, based on row unit, on the unit pixels whose signal is to be read out.

On the other hand, the sweep-out scanning system performs sweep-out scanning on the read-out row on which read-out scanning is to be performed by the read-out scanning system. In the sweep-out system, unnecessary electric charge is swept out (is reset) from the photoelectric conversion element in the unit pixel in the read-out row prior to the read-out scanning by a time period of shutter speed.

Through this sweeping out (reset) of the unnecessary electric charge by the seep-out scanning system, a so-called electronic shutter operation is performed.

Here, electronic shutter operation refers to an operation to discard photoelectric charge in the photoelectric conversion element etc. and to start new exposure (to start storing photoelectric charge).

Signals read out through the read-out operation by the read-out scanning system corresponds to an amount of light entered after a read-out operation or an electronic shutter operation immediately before that read-out operation.

Further, a time period from a timing of reading out through the immediately-before read-out operation or a timing of sweeping out through the immediately-before electronic shutter operation to a timing of reading out through the current read-out operation is a time period for storing photoelectric charge (exposure time period) in the unit pixel.

In the present embodiment, wide dynamic range is obtainable by adopting a device for controlling this exposure time period, changing transmittance of the color filter, or the like, as will be described later.

A signal outputted from each unit pixel in the pixel row on which the selection scanning is performed by the vertical drive section 13 is supplied to the column processing section 14 via each vertical signal line 17.

The column processing section 14 performs a predetermined signal processing on an analog pixel signal outputted from each pixel in the selected row for each pixel column in the pixel array section 12.

Examples of the signal processing in the column processing section 14 may include CDS (Correlated Double Sampling) processing.

The CDS processing is a process to take in a reset level and a signal level that are outputted from each pixel in the selected row and determine a difference between these levels to obtain signals for pixels in one row, and to remove fixed-pattern noise of the pixel.

The column processing section 14 may be provided with an A-D conversion function for digitalizing the analog pixel signal.

The horizontal drive section 15 is configured of a shift register, an address decoder, and/or the like, and sequentially performs selection scanning on circuit sections corresponding to the pixel columns in the column processing section 14.

Through the selection scanning by this horizontal drive section 15, pixel signals subjected to signal processing by the column processing section 14 for the respective pixel columns are sequentially outputted to the outside of the sensor chip 11.

In other words, the pixel signals corresponding to the color coding (color arrangement) of the color filter array 33, the photoelectric conversion film, and/or the like are outputted as they are as RAW data from the sensor chip 11.

The system control section 16 receives clock signals, data instructing operation modes, and the like that are provided from the outside of the sensor chip 11. Also, the system control section 16 outputs data such as data on internal information of the present CMOS image sensor 10.

The system control section 16 includes a timing generator that generates various timing signals, and performs drive control of the vertical drive section 13, the column processing section 14, the horizontal drive section 15, and the like, based on the various timing signals generated by the timing generator.

The DSP circuit 31 that is an external circuit of the sensor chip 11 may temporally store, for example, image data for one frame that is outputted from the sensor chip 11 in the image memory 32, and may execute demosaic processing and/or the like based on the pixel information stored in the image memory 32.

The demosaic processing is a processing to complement color information with respect to a signal of each pixel that only has single-color information, through collecting lacking color information from signals of the surrounding pixels and providing the information to the signal of each pixel, and thereby, to create a full-color image.

[First Configuration Example of Unit Pixel]

FIG. 2 is a circuit diagram illustrating an example of a circuit configuration of a unit pixel 20.

As shown in FIG. 2, the unit pixel 20 according to the present embodiment includes a photoelectric conversion element such as a photodiode (PD) 21, and may include four transistors that are a transfer transistor 22, a reset transistor 23, an amplifier transistor 24, and a selection transistor 25. It is to be noted that various transistors such as the transfer transistor 22, the reset transistor 23, the amplifier transistor 24, and the selection transistor 25 correspond to specific examples of the electric charge detection element in the present technology.

Here, as the four transistors that are the transfer transistor 22, the reset transistor 23, the amplifier transistor 24, and the selection transistor 25, for example, N-channel MOS transistors may be used. However, the combination of conductivity types of the transfer transistor 22, the reset transistor 23, the amplifier transistor 24, and the selection transistor 25 described as an example here is a mere example, which is not limitative.

For this unit pixel 20, for example, three drive lines that may be a transfer line 181, a reset line 182, and a selection line 183 are wired, as the pixel drive line 18, to be shared by the respective pixels in the same pixel row.

One end of each of the transfer line 181, the reset line 182, and the selection line 183 is connected to an output terminal corresponding to each pixel row of the vertical drive section 13 based on a pixel row unit.

An anode electrode of the photodiode 21 is connected to a negative power source (such as ground) and performs photoelectric conversion to convert the received light into photoelectric charge (here, photoelectron) having an amount in accordance with an amount of the received light.

A cathode electrode of the photodiode 21 is electrically connected to a gate electrode of the amplifier transistor 24 via the transfer transistor 22.

A node 26 electrically connected to the gate electrode of the amplifier transistor 24 is called a FD (Floating Diffusion) section.

The transfer transistor 22 is connected between the cathode electrode of the photodiode 21 and the FD section 16.

A gate electrode of the transfer transistor 22 is provided with an active transfer pulse φTRF at a high level (such as Vdd level) (hereinafter, described as "High-active") via the transfer line 181.

By being provided with the transfer pulse φTRF, the transfer transistor 22 is turned on and transfers, to the FD section 26, the photoelectric charge obtained through photoelectric conversion in the photodiode 21.

A drain electrode of the reset transistor 23 is connected to a pixel power source Vdd, and a source electrode thereof is connected to the FD section 26.

A High-active reset pulse φRST is supplied to a gate electrode of the reset transistor 23 via the reset line 182 prior to transfer of signal electric charge from the photodiode 21 to the FD section 26.

By being provided with the reset pulse φRST, the reset transistor 23 is turned on, and the FD section 26 is reset through discarding the electric charge in the FD section 26 to the pixel power source Vdd.

A gate electrode of the amplifier transistor 24 is connected to the FD section 26, and a drain electrode thereof is connected to the pixel power source Vdd.

Further, the amplifier transistor 24 outputs, as a reset signal (reset level) Vreset, an electric potential of the FD section 26 after the FD section 26 has been reset by the reset transistor 23. The amplifier transistor 24 outputs, as a light storage signal (signal level) Vsig, an electric potential of the FD section 26 after signal electric charge has been transferred thereto by the transfer transistor 22.

For example, a drain electrode of the selection transistor 25 may be connected to a source electrode of the amplifier transistor 24, and a source electrode of the selection transistor 25 is connected to the vertical signal line 17.

A High-active selection pulse φSEL is supplied to a gate electrode of the selection transistor 25 via the selection line 183.

By being provided with the selection pulse φSEL, the selection transistor 25 is turned on and allows the unit pixel 20 to be in a selected state, and relays the signal outputted from the amplifier transistor 24 to the vertical signal line 17.

It is to be noted that, concerning the selection transistor 25, a circuit configuration in which the selection transistor 25 is connected between the pixel power source Vdd and the drain of the amplifier transistor 24 may be adopted.

Further, the unit pixel 20 is not limited to a pixel configuration configured of the four transistors having the above-described configuration.

For example, a pixel configuration configured of three transistors in which the amplifier transistor 24 also serves as the selection transistor 25 or the like may be adopted, and the pixel circuit configuration thereof is not limitative.

[Pixel Structure of a Back-Face Illumination Type]

A solid-state image pickup device having unit pixels having the above-described configuration may be formed as a solid-state image pickup device of a back-face illumination type, in which, for example, light may enter on one face side (back face side) of the substrate and elements such as a transistor for electric charge detection may be formed on the other face side (front face side) thereof.

Part (A) of FIG. 3 is a diagram illustrating an example of a basic pixel structure of the solid-state image pickup device of a back-face illumination type.

FIG. 4 is a diagram illustrating an example of a well structure of the semiconductor substrate shown in FIG. 3.

FIGS. 3 and 4 simply illustrate a configuration in which a pixel region (pixel array section) in which pixels are formed and a peripheral circuit region (peripheral circuit section) are formed in parallel.

Further, for the sake of simplification of the drawing, only one pixel is shown in the pixel region.

In Part (A) of FIG. 3, a silicon (Si) layer (element layer) 41 having a thickness of about 10 μm to 20 μm both inclusive is formed by polishing a wafer by CMP (Chemical Mechanical Polishing). A desirable range of the thickness is 5 μm to 15 μm both inclusive for visible light, is 15 μm to 50 μm both inclusive for infrared light, and is 3 μm to 7 μm both inclusive for a ultraviolet region. A light shielding film 43 (BLD) is formed on one face side (back face side) of the silicon layer 41 with an $SiO_2$ film 42 in between.

The light shielding film 43 is laid out in consideration only of optical factors, unlike the wirings. An opening section 43A is formed in this light shielding film 43. A silicon nitride (SiN) film 44 is formed as a passivation film on further back face side of the light shielding film 43, and further, the color filter 45 and the on-chip lens (microlens) 46 are formed on a light entering path on the back face side of the opening section 43A.

In other words, the pixel structure allows light entering from the one face side of the silicon layer 41 to be led to a light receiving face of a photodiode (PD) 47 formed on the silicon layer 41 via the on-chip lens (microlens) 46 and the color filter 45.

The photodiode 47 corresponds to the photodiode 21 shown in FIG. 2, and has the photoelectric conversion function and the electric charge storing function. Here, the photo diode 47 forms the light receiving section (first pixel section) together with the on-chip lens 46 and the color filter 45.

A wiring layer 48 in which transistors, metal wirings, and/or the like are formed is formed on the other face side (front face side) of the silicon layer 41. Further, a substrate supporting member 49 is attached under the wiring layer 48.

A typical CMOS image sensor adopts a pixel structure of a front-face light receiving type in which a wiring layer side is considered as a front face side, and entering light is taken in from the wiring layer side.

In contrast, the CMOS image sensor according to the present embodiment has a pixel structure of a back-face illumination (light receiving) type since entering light is taken in from a face (back face) side opposite to the wiring layer 48.

As can be seen clearly from this pixel structure of the back-face illumination (light receiving) type, only the light shielding film 43 exists as a metal layer between the on-chip lens (microlens) 46 to the photodiode 47. Further, height of this light shielding film 43 from the photodiode 47 is low, which corresponds to the thickness (for example, about 0.5 μm) of the $SiO_2$ film 42. Therefore, limitation in light concentration due to shielding by the metal layer is allowed not to be caused.

It is to be noted that the pixel structure of the back-face illumination type described herein is a mere example, and pixel structures having various forms are adoptable. For example, a pixel structure of a front-face illumination type as shown in Part (B) of FIG. 3 may be adoptable. This pixel structure of the front-face illumination type includes the wiring layer 48, the color filter 45, and the on-chip lens 46 in order on the silicon layer 41 including the photodiode 47. In the wiring layer 48, wirings 48B are provided in multiple layers, and a waveguide 48A is formed that guides light concentrated by the on-chip lens 46 to the photodiode 47 in a layer below. Gates of various transistors are provided near an interface of the silicon layer 41 with respect to the wiring layer 48, and FD (Floating Diffusion) is formed near an interface of the wiring layer 48 with respect to the silicon layer 41.

FIG. 4 is a simple cross-sectional structure diagram illustrating an example of a well structure of the silicon layer 41 shown in Part (A) of FIG. 3. In FIG. 4, portions equivalent to those in Part (A) of FIG. 3 are denoted with the same signs.

In the present example, an N-type substrate 51 is used. The thickness of the silicon layer 41 may be favorably 5 μm to 15 μm both inclusive for visible light as described above, and is set as 10 μm in the present example. This allows favorable photoelectric conversion of visible light. A shallow P+ layer 52 is formed over the entire face of the pixel section on the one face of the silicon layer 41.

The pixel separation region is formed of a deep P well 53, and is connected to the P+ layer 52 on the one face.

The photodiode 47 does not form a P well. Therefore, the photodiode 47 is formed utilizing the N-type substrate 51. The N-type region (substrate) 51 is a photoelectric conversion region. The photoelectric conversion region has small area and low concentration, and therefore, is completely depleted.

On the photodiode 47, an N+ region 54 that stores signal electric charge (in the present example, electron) is formed, and a P+ layer 55 to be an embedded photodiode is formed further thereon.

It is to be noted that the photodiode 47 is formed so that a surface area on the light-receiving face side is larger than a surface area on the wiring layer 48 side as can be clearly seen from FIG. 4. Thus, entering light is allowed to be taken in efficiently.

The signal electric charge that has been subjected to photoelectric conversion in this photodiode 47 and is stored in the N+ region 54 is transferred to an FD (Floating Diffusion) 57 of an N+ type region by the transfer transistor 56 (the transfer transistor 22 in FIG. 2).

The photodiode 47 side is electrically separated from the FD 57 by the P-layer (48).

The transistors (the amplifier transistor 24, the selection transistor 25, and the reset transistor 23 shown in FIG. 2) other than the transfer transistor 22 in the pixel are formed in a typical manner in the deep P well 53.

On the other hand, concerning the peripheral circuit region, a P well 59 is formed at a depth that does not reach the P+ layer 52 at the back face. Further, an N well 60 is formed inside this P well 59. A CMOS circuit is formed in a region of these wells 59 and 60.

[Pixel Addition]

By the way, typically, for picking up moving images, a frame rate is increased, and pixel addition is performed in order to achieve high-speed picking up of moving images. In the pixel addition, signals of a plurality of adjacent pixels are added to one another and are then read out.

This pixel addition may be performed in the pixel, on the vertical signal line 17, by the column processing section 14, in later signal processing section, etc.

Here, as an example, a pixel configuration in a case where, for example, signals of four pixels that are adjacent to one another in top, bottom, left, and right in square arrangement of 2×2 are added in a pixel will be described.

FIG. 5 is a circuit diagram illustrating an example of a circuit configuration in a case where the adjacent four-pixel addition is performed in the pixel. In the drawing, portions equivalent to those in FIG. 2 are denoted with the same signs.

In FIG. 5, photodiodes 21 in the four pixels adjacent to one another at top, bottom, left, and right are referred to as photodiodes 21-1, 21-2, 21-3, and 21-4. With respect to these photodiodes 21-1, 21-2, 21-3, and 21-4, four transfer transistors 22-1, 22-2, 22-3, and 22-4 are provided, and one reset transistor 23, one amplifier transistor 24, and one selection transistor 25 are provided.

In other words, one electrode of the transfer transistor 22-1, one electrode of the transfer transistor 22-2, one electrode of the transfer transistor 22-3, and one electrode of the transfer transistor 22-4 are connected to cathode electrodes of the photodiodes 21-1, 21-2, 21-3, and 21-4, respectively. The other electrodes are connected commonly to the gate electrode of the amplifier transistor 24.

The FD section 26 that is shared by the photodiodes 21-1, 21-1, 21-3, and 21-4 is electrically connected to the gate electrode of this amplifier transistor 24.

The drain electrode of the reset transistor 23 is connected to the pixel power source Vdd, and the source electrode of the reset transistor 23 is connected to the FD section 26.

In the pixel configuration corresponding to addition of adjacent four pixels having the above-described configuration, pixel addition between the adjacent four pixels is achieved through supplying the transfer pulse φTRF to the four transfer transistors 22-1, 22-2, 22-3, and 22-4 at the same timing.

In other words, the signal electric charges transferred from the photodiodes 21-1, 21-2, 21-3, and 21-4 to the FD section 26 by the transfer transistors 22-1, 22-2, 22-3, and 22-4 are added in the FD section 26 (may be referred to as FD addition in some cases).

On the other hand, signal output based on pixel unit is achieved through supplying the transfer pulse φTRF to the transfer transistors 22-1, 22-2, 22-3, and 22-4 at different timings.

In other words, the frame rate is improved by performing pixel addition in the case of picking up moving images, and resolution is improved by reading out the signals in all the pixels separately in the case of picking up still images.

[Pixel Arrangement]

As described above, the pixel array section 12 is basically configured of a plurality of pixels arranged in a matrix (in rows and columns).

For example, Bayer arrangement as shown in FIG. 6 may be adopted as a pixel arrangement of the pixel array section 12.

In the pixel array section 12 in the present embodiment, one pixel is divided into a plurality of divided pixel cells DPC including a photoelectric conversion element formed of a photodiode.

Specifically, in the solid-state image pickup device (CMOS image sensor) 10, one pixel under the same color filter in the Bayer arrangement is divided into two or more divided pixel cells DPC. In this case, the two or more divided pixel cells DPC that have been divided with varying sensitivity or with varying storing time period may be divided with varying sensitivity or varying storing time period (exposure time period).

A case where one pixel is divided into four divided pixel cells DPC-A to DPCD will be described below as an example.

FIG. 7 is a conceptual diagram of pixel division according to the present embodiment.

FIG. 7 illustrates a division method in a case of the Bayer arrangement. FIG. 7 illustrates an example in which one pixel under the same color filter (one pixel facing the color filter) is divided into four. For example, the respective divided pixels may have sensitivity or storing time period different from one another.

In FIG. 7, a case in which a G (green) pixel PCG is divided into four pixels of DPC-A, DPC-B, DPC-C, and DPC-D is shown as an example. For example, the G pixel PCG may be divided into two pixels of DPC-A and DPC-B.

2. Characteristic Configuration of Present Embodiment

In the present embodiment, the CMOS image sensor 10 having the above-described configuration is configured as a solid-state image pickup device applicable to a stereo camera, a monocular three-dimensional (3D) stereo camera, or the like that adopts the light field technology.

Characteristic configuration of the solid-state image pickup device applicable to the stereo camera, the monocular three-dimensional (3D) stereo camera, or the like will be specifically described below.

Hereinbelow, for the sake of easy understanding, a basic configuration example of a square arrangement (rectangular arrangement) will be described, and then, a configuration example of a zigzag arrangement which has a checkerboard-like pattern will be described.

It is to be noted that, in the description below, in X-Y coordinate shown in the drawing, an X direction corresponds to the first direction and a Y direction corresponds to the second direction. In some cases, the X direction may be referred to as a horizontal direction or a lateral direction and the Y direction may be referred to as a vertical direction or a longitudinal direction.

2-1. First Characteristic Configuration Example

FIG. 8 is a diagram illustrating a first characteristic configuration example of a solid-state image pickup device (CMOS image sensor) according to the present embodiment.

A CMOS image sensor 10A shown in FIG. 8 is applicable to a stereo camera, and performs LR parallax separation with use of the multilens array 34 as a stereo version of light field.

In this configuration, horizontal resolution becomes ½. However, this configuration is useful since this configuration matches side-by-side recording scheme.

Here, "L" indicates left in stereo, and "R" indicates right in stereo. L and R may be reversed depending on optical characteristics. In such a case, the present example is applicable by considering L and R to be reversed.

In the CMOS image sensor 10A, the pixel array section 12A adopts a division method for each pixel in a case where the square arrangement (rectangular arrangement) and also the Bayer arrangement are achieved.

In FIG. 8, the color filter array 33 is formed so that a G pixel PCG11-1, an R pixel PCR11, a G pixel PCG11-2, and a B pixel PCB11 form Bayer arrangement of 2×2. Such an arrangement is formed in rows and columns.

In the example shown in FIG. 8, only a part is illustrated. FIG. 8 illustrates an example in which the G pixel PCG 12-1 in the adjacent Bayer arrangement is arranged adjacent to the B pixel PCB11 in the lateral direction, and an R pixel PCR12 in the adjacent Bayer arrangement is arranged adjacent to the G pixel PCG11-2 in the lateral direction.

In the example shown in FIG. 8, the G pixel PCG11-1, the B pixel PCB11, and the G pixel PCG12-1 are arranged in a first row, and the R pixel PCR11, the G pixel PCG11-2, and the R pixel PCR12 are arranged in a second row.

Further, in the example shown in FIG. 8, each of the G pixel PCG11-1, the R pixel PCR11, the G pixel PCG11-2, the B pixel PCB11, the G pixel PCG11-2, and the R pixel PCR12 is divided into two in the lateral direction (X direction).

The G pixel PCG11-1 includes two divided pixels that are pixels DPC-AG1 and DPC-BG1. In this example, the divided pixel DPC-AG1 is allocated for R in stereo and the divided pixel DPC-BG1 is allocated for L in stereo.

The R pixel PCR11 includes two divided pixels that are pixels DPC-AR1 and DPC-BR1. In this example, the divided pixel DPC-AR1 is allocated for R in stereo and the divided pixel DPC-BR1 is allocated for L in stereo.

The B pixel PCB11 includes two divided pixels that are pixels DPC-AB1 and DPC-BB1. In this example, the divided pixel DPC-AB1 is allocated for R in stereo and the divided pixel DPC-BB1 is allocated for L in stereo.

The G pixel PCG11-2 includes two divided pixels that are pixels DPC-AG1 and DPC-BG1. In this example, the divided pixel DPC-AG1 is allocated for R in stereo and the divided pixel DPC-BG1 is allocated for L in stereo.

The G pixel PCG12-1 includes two divided pixels that are pixels DPC-AG1 and DPC-BG1. In this example, the divided pixel DPC-AG1 is allocated for R in stereo and the divided pixel DPC-BG1 is allocated for L in stereo.

The R pixel PCR12 includes two divided pixels that are pixels DPC-AR1 and DPC-BR1. In this example, the divided pixel DPC-AR1 is allocated for R in stereo and the divided pixel DPC-BR1 is allocated for L in stereo.

In the present example, the respective divided pixels in the same column (arrangement in the Y direction) in the pixel arrangement are allocated with the same R or L function for stereo.

In other words, the respective divided pixels in the same row (arrangement in the X direction) in the pixel arrangement are alternately allocated with the R or L function for stereo.

As shown in FIG. 8, light shielding sections BLD, wirings, and the like are formed on the semiconductor substrate 11. The color filter array 33 is formed in an upper layer thereof. The on-chip lens (OCL) array 35 is formed in an upper layer of the color filter array 33.

The respective on-chip lenses OCL in the on-chip lens array 35 are formed in rows and columns so as to correspond to the respective divided pixels in the pixel array section 12A.

Further, the multilens array 34 in which multilenses ML are formed in rows and columns is arranged to face the light entering side of the on-chip lens array 35.

In the example shown in FIG. 8, the pixels sharing each multilens ML in the multilens array 34 in the lateral direction (X direction) are arranged to have not the same color but different colors, unlike in a typical arrangement.

In the example shown in FIG. 8, two multilenses, that are, a first multilens system ML1 and a second multilens system ML2 are shown.

The first multilens system ML1 is arranged so as to be shared in a first row by the divided pixel DPC-BG1 for L in stereo in the G pixel PCG11-1 and the divided pixel DPC-AB1 for R in stereo in the B pixel PCB11 that is adjacent to the G pixel PCG11-1.

Similarly, the first multilens system ML1 is arranged so as to be shared in a second row by the divided pixel DPC-BR1 for L in stereo in the R pixel PCR11 and the divided pixel DPC-AG1 for R in stereo in the G pixel PCG11-2 that is adjacent to the R pixel PCR11.

The second multilens system ML2 is arranged so as to be shared in the first row by the divided pixel DPC-BB1 for L in stereo in the B pixel PCB11 and the divided pixel DPC-AG1 for R in stereo in the G pixel PCG12-1 that is adjacent to the B pixel PCB11.

Similarly, the second multilens system ML2 is arranged so as to be shared in the second row by the divided pixel DPC-BG1 for L in stereo in the G pixel PCG11-2 and the divided pixel DPC-AR1 for R in stereo in the R pixel PCR12 that is adjacent to the G pixel PCG11-2.

The color pixels sharing one multilens ML are allowed to have not the same color but different colors in such a way. Therefore, mixture (extinction ratio) of L and R in stereo is allowed to be improved by a lens gap and this different color separation.

Further, it is selectable whether the vertical direction (Y direction) is configured of a discrete lens DSCL or a cylindrical lens CYLDL.

In a case without the on-chip lens OCL, light condensation rate is improved by adopting the discrete lens DSCL.

It is to be noted that, in the example shown in FIG. 8, the lens provided over two divided pixels has a flat shape extending in the lateral direction (X direction) in order to avoid being influenced by a lens that is adjacent thereto in the vertical direction (Y direction) and is shared by divided pixels.

2-2. Second Characteristic Configuration Example

FIG. 9 is a diagram illustrating a second characteristic configuration example of the solid-state image pickup device (CMOS image sensor) according to the present embodiment.

In a CMOS image sensor 10B shown in FIG. 9, part of the pixel arrangement has a zigzag arrangement (oblique arrangement, honeycomb arrangement). Here, the zigzag arrangement refers to a two-dimensional arrangement along a direction different from two directions (the first direction and the second direction) that are orthogonal to each other in the square arrangement. Specifically, the zigzag arrangement is a checkerboard-like arrangement in which each unit pixel is shifted (rotated), for example, by 45 degrees from the square arrangement (rectangular arrangement) which is used as a reference.

Further, the unit pixel is configured to allow a first pixel section 60 and a second pixel section 70 to be laminated (overlapped). The first pixel section 60 has at least a light receiving function (includes a microlens (the on-chip lens 46)). The second pixel section 70 is so formed as to face the first pixel section, and has at least the electric charge detection function (includes an electric charge detection element).

For example, in a case of the back-face illumination type, as shown in Part (A) of FIG. 3, the silicon layer 41 (the photodiode 47), the color filter 45, and the on-chip lens 46 are provided in order on the wiring layer 48. In such a configuration, combination of the first pixel section 60 and the second pixel section 70 may be as follows. That is, the first pixel section 60 may include the on-chip lens 46, and the second pixel section 70 may include the wiring layer 48 and the photodiode 47 together with the above-described electric charge detection element. Alternatively, the first pixel section 60 may include the color filter 45 together with the on-chip lens 46, and the second pixel section 70 may include the wiring layer 48 and the photodiode 47 together with the above-described electric charge detection element. Alternatively, the first pixel section 60 may include the color filter 45 and the photodiode 47 together with the on-chip lens 46, and the second pixel section 70 may include the wiring layer 48 together with the above-described electric charge detection element.

Here, as an example, the first pixel section 60 is arranged on the back-face side, and may include the color filter 45 and the on-chip lens 46 shown in Part (A) of FIG. 3, or may include the color filter 45 and the on-chip lens 46.

The second pixel section 70 is arranged on the front-face side, and may include, for example, the photodiode 47 and the wiring layer 48 shown in Part (A) of FIG. 3, or may be configured to include an electric detection transistor (an amplifier transistor, or the like), the wiring layer 48, and the like.

Further, in the present embodiment, the first pixel section 60 is formed to have the zigzag arrangement, and the second pixel section 70 is formed to have the square arrangement (rectangular arrangement).

It is to be noted that, in FIG. 9, for the sake of simplification in the drawing, the color filter array, the on-ship lens, and the like are omitted.

Alternatively, in a case of the front-face illumination type as shown in Part (B) in FIG. 3, the wiring layer 48 (the waveguide 48A, the wiring 48B), the color filter 45, and the on-chip lens 46 are provided in order on the silicon layer 41. In such a configuration, combination of the first pixel section 60 and the second pixel section 70 may be as follows. That is, the first pixel section 60 may include the on-chip lens 46, and the second pixel section 70 may include the wiring layer 48 and the photodiode 47 together with the above-described electric charge detection element. Alternatively, the first pixel section 60 may include the color filter 45 together with the on-chip lens 46, and the second pixel section 70 may include the wiring layer 48 and the photodiode 47 together with the above-described electric charge detection element. Alternatively, the first pixel section 60 may include the color filter 45 and the wiring layer 48 together with the on-chip lens 46, and the second pixel section 70 may include the photodiode 47 together with the above-described electric charge detection element.

Further, in the present description, a case where the first pixel section has the zigzag arrangement (oblique arrangement) and the second pixel section has the square arrangement is described as an example. However, conversely, the first pixel section may have the square arrangement, and the second pixel section may have the zigzag arrangement. When each arrangement direction in the two-dimensional arrangement in the first pixel section is (relatively) different from each arrangement direction in the two-dimensional arrangement in the second pixel section, the effects of the present technology is obtainable.

In the example shown in FIG. 9, the second pixel section 70 is formed as a five-row-six-column square arrangement in five rows that are from a p-th row to a (p+4)th row and in six columns that are from a q-th column to a (q+5)th column.

The example shown in FIG. 9 illustrates a zigzag arrangement in five rows that are from the p-th row to the (p+4)th row and in eight columns that are from a (q−1)th column to a (q+6)th column.

The row arrangement and the column arrangement in the first pixel section 60 are formed to correspond to the row arrangement and the column arrangement in the second pixel section 70.

In the first pixel section 60, G pixels, R pixels, and B pixels are arranged as follows. Here, for the sake of easy understanding, description will be given assuming p=q=1.

In the first row, a G pixel PCG1-12 is formed over the first column and the second column in a state rotated, for example, by 45 degrees from the Y direction to the X direction using the square arrangement as a reference.

The G pixel PCG1-12 includes triangular divided pixels DPC1-12AG and DPC1-12BG that are divided into two by the Y axis as a center. The divided pixel DPC1-12AG is arranged in the first column, and the divided pixel DPC1-12BG is arranged in the second column.

The divided pixel DPC1-12AG is allocated for L in stereo, and the divided pixel DPC1-12BG is allocated for R in stereo.

Further, a multilens ML1-12 is arranged over the two divided pixels DPC1-12AG and DPC1-12BG having the same color so as to be shared thereby.

In the first row, a G pixel PCG1-34 is formed over the third column and the fourth column in a state rotated, for example, by 45 degrees from the Y direction to the X direction using the square arrangement as a reference.

The G pixel PCG1-34 includes triangular divided pixels DPC1-34AG and DPC1-34BG that are divided into two by the Y axis as a center. The divided pixel DPC1-34AG is arranged in the third column, and the divided pixel DPC1-34BG is arranged in the fourth column.

The divided pixel DPC1-34AG is allocated for L in stereo, and the divided pixel DPC1-34BG is allocated for R in stereo.

Further, a multilens ML1-34 is arranged over the two divided pixels DPC1-34AG and DPC1-34BG having the same color so as to be shared thereby.

In the first row, a G pixel PCG1-56 is formed over the fifth column and the sixth column in a state rotated, for example, by 45 degrees from the Y direction to the X direction using the square arrangement as a reference.

The G pixel PCG1-56 includes triangular divided pixels DPC1-56AG and DPC1-56BG that are divided into two by the Y axis as a center. The divided pixel DPC1-56AG is arranged in the fifth column, and the divided pixel DPC1-56BG is arranged in the sixth column.

The divided pixel DPC1-56AG is allocated for L in stereo, and the divided pixel DPC1-56BG is allocated for R in stereo.

Further, a multilens ML1-56 is arranged over the two divided pixels DPC1-56AG and DPC1-56BG having the same color so as to be shared thereby.

In the second row, an R pixel PCR2-01 is formed over the zero-th column and the first column in a state rotated, for example, by 45 degrees from the Y direction to the X direction using the square arrangement as a reference.

The R pixel PCR2-01 includes triangular divided pixels DPC2-01AR and DPC2-01BR that are divided into two by the Y axis as a center. The divided pixel DPC2-01AR is arranged in the zero-th column, and the divided pixel DPC2-01BR is arranged in the first column.

The divided pixel DPC2-01AR is allocated for L in stereo, and the divided pixel DPC2-01BR is allocated for R in stereo.

Further, a multilens ML2-01 is arranged over the two divided pixels DPC2-01AR and DPC2-01BR having the same color so as to be shared thereby.

In the second row, a G pixel PCG2-23 is formed over the second column and the third column in a state rotated, for example, by 45 degrees from the Y direction to the X direction using the square arrangement as a reference.

The G pixel PCG2-23 includes triangular divided pixels DPC2-23AG and DPC2-23BG that are divided into two by the Y axis as a center. The divided pixel DPC2-23AG is arranged in the second column, and the divided pixel DPC2-23BG is arranged in the third column.

The divided pixel DPC2-23AG is allocated for L in stereo, and the divided pixel DPC2-23BG is allocated for R in stereo.

Further, a multilens ML2-23 is arranged over the two divided pixels DPC2-23AG and DPC2-23BG having the same color so as to be shared thereby.

In the second row, an R pixel PCR2-45 is formed over the fourth column and the fifth column in a state rotated, for example, by 45 degrees from the Y direction to the X direction using the square arrangement as a reference.

The R pixel PCR2-45 includes triangular divided pixels DPC2-45AR and DPC2-45BR that are divided into two by the Y axis as a center. The divided pixel DPC2-45AR is arranged in the fourth column, and the divided pixel DPC2-45BR is arranged in the fifth column.

The divided pixel DPC2-45AR is allocated for L in stereo, and the divided pixel DPC2-45BR is allocated for R in stereo.

Further, a multilens ML2-45 is arranged over the two divided pixels DPC2-45AR and DPC2-45BR having the same color so as to be shared thereby.

In the third row, a G pixel PCG3-12 is formed over the first column and the second column in a state rotated, for example, by 45 degrees from the Y direction to the X direction using the square arrangement as a reference.

The G pixel PCG3-12 includes triangular divided pixels DPC3-12AG and DPC3-12BG that are divided into two by the Y axis as a center. The divided pixel DPC3-12AG is arranged in the sixth column, and the divided pixel DPC3-12BG is arranged in the seventh column.

The divided pixel DPC3-12AG is allocated for L in stereo, and the divided pixel DPC3-12BG is allocated for R in stereo.

Further, a multilens ML3-12 is arranged over the two divided pixels DPC3-12AG and DPC3-12BG having the same color so as to be shared thereby.

In the third row, a G pixel PCG3-12 is formed over the first column and the second column in a state rotated, for example, by 45 degrees from the Y direction to the X direction using the square arrangement as a reference.

The G pixel PCG3-12 includes triangular divided pixels DPC3-12AG and DPC3-12BG that are divided into two by the Y axis as a center. The divided pixel DPC3-12AG is arranged in the first column, and the divided pixel DPC3-12BG is arranged in the second column.

The divided pixel DPC3-12AG is allocated for L in stereo, and the divided pixel DPC3-12BG is allocated for R in stereo.

Further, a multilens ML3-12 is arranged over the two divided pixels DPC3-12AG and DPC3-12BG having the same color so as to be shared thereby.

In the third row, a G pixel PCG3-34 is formed over the third column and the fourth column in a state rotated, for example, by 45 degrees from the Y direction to the X direction using the square arrangement as a reference.

The G pixel PCG3-34 includes triangular divided pixels DPC3-34AG and DPC3-34BG that are divided into two by the Y axis as a center. The divided pixel DPC3-34AG is arranged in the third column, and the divided pixel DPC3-34BG is arranged in the fourth column.

The divided pixel DPC3-34AG is allocated for L in stereo, and the divided pixel DPC3-34BG is allocated for R in stereo.

Further, a multilens ML3-34 is arranged over the two divided pixels DPC3-34AG and DPC3-34BG having the same color so as to be shared thereby.

In the third row, a G pixel PCG3-56 is formed over the fifth column and the sixth column in a state rotated, for example, by 45 degrees from the Y direction to the X direction using the square arrangement as a reference.

The G pixel PCG3-56 includes triangular divided pixels DPC3-56AG and DPC3-56BG that are divided into two by the Y axis as a center. The divided pixel DPC3-56AG is arranged in the fifth column, and the divided pixel DPC3-34BG is arranged in the sixth column.

The divided pixel DPC3-56AG is allocated for L in stereo, and the divided pixel DPC3-56BG is allocated for R in stereo.

Further, a multilens ML3-56 is arranged over the two divided pixels DPC3-56AG and DPC3-56BG having the same color so as to be shared thereby.

In the fourth row, a G pixel PCG4-01 is formed over the zero-th column and the first column in a state rotated, for example, by 45 degrees from the Y direction to the X direction using the square arrangement as a reference.

The G pixel PCG4-01 includes triangular divided pixels DPC4-01AG and DPC4-01BG that are divided into two by the Y axis as a center. The divided pixel DPC4-01AG is arranged in the zero-th column, and the divided pixel DPC4-01BG is arranged in the first column.

The divided pixel DPC4-01AG is allocated for L in stereo, and the divided pixel DPC4-01BG is allocated for R in stereo.

Further, a multilens ML4-01 is arranged over the two divided pixels DPC4-01AG and DPC4-01BG having the same color so as to be shared thereby.

In the fourth row, a B pixel PCB4-23 is formed over the second column and the third column in a state rotated, for example, by 45 degrees from the Y direction to the X direction using the square arrangement as a reference.

The B pixel PCB4-23 includes triangular divided pixels DPC4-23AG and DPC4-23BB that are divided into two by the Y axis as a center. The divided pixel DPC4-23AB is arranged in the second column, and the divided pixel DPC4-23BB is arranged in the third column.

The divided pixel DPC4-23AB is allocated for L in stereo, and the divided pixel DPC4-23BB is allocated for R in stereo.

Further, a multilens ML2-23 is arranged over the two divided pixels DPC4-23AB and DPC4-23BB having the same color so as to be shared thereby.

In the fourth row, a G pixel PCG4-45 is formed over the fourth column and the fifth column in a state rotated, for example, by 45 degrees from the Y direction to the X direction using the square arrangement as a reference.

The G pixel PCG4-45 includes triangular divided pixels DPC2-45AG and DPC4-45BG that are divided into two by the Y axis as a center. The divided pixel DPC4-45AG is arranged in the fourth column, and the divided pixel DPC4-45BG is arranged in the fifth column.

The divided pixel DPC4-45AG is allocated for L in stereo, and the divided pixel DPC4-45BG is allocated for R in stereo.

Further, a multilens ML4-45 is arranged over the two divided pixels DPC4-45AG and DPC4-45BG having the same color so as to be shared thereby.

In the fourth row, a B pixel PCB4-67 is formed over the sixth column and the seventh column in a state rotated, for example, by 45 degrees from the Y direction to the X direction using the square arrangement as a reference.

The B pixel PCB4-67 includes triangular divided pixels DPC4-67AB and DPC4-67BB that are divided into two by the Y axis as a center. The divided pixel DPC4-67AB is arranged in the sixth column, and the divided pixel DPC4-67BB is arranged in the seventh column.

The divided pixel DPC4-67AB is allocated for L in stereo, and the divided pixel DPC4-67BB is allocated for R in stereo.

Further, a multilens ML4-67 is arranged over the two divided pixels DPC4-67AB and DPC4-67BB having the same color so as to be shared thereby.

In the fifth row, a G pixel PCG5-12 is formed over the first column and the second column in a state rotated, for example, by 45 degrees from the Y direction to the X direction using the square arrangement as a reference.

The G pixel PCG5-12 includes triangular divided pixels DPC5-12AG and DPC5-12BG that are divided into two by the Y axis as a center. The divided pixel DPC5-12AG is arranged in the first column, and the divided pixel DPC5-12BG is arranged in the second column.

The divided pixel DPC5-12AG is allocated for L in stereo, and the divided pixel DPC5-12BG is allocated for R in stereo.

Further, a multilens ML5-12 is arranged over the two divided pixels DPC5-12AG and DPC5-12BG having the same color so as to be shared thereby.

In the fifth row, a G pixel PCG5-34 is formed over the third column and the fourth column in a state rotated, for example, by 45 degrees from the Y direction to the X direction using the square arrangement as a reference.

The G pixel PCG5-34 includes triangular divided pixels DPC5-34AG and DPC5-34BG that are divided into two by the Y axis as a center. The divided pixel DPC5-34AG is arranged in the third column, and the divided pixel DPC5-34BG is arranged in the fourth column.

The divided pixel DPC5-34AG is allocated for L in stereo, and the divided pixel DPC5-34BG is allocated for R in stereo.

Further, a multilens ML5-34 is arranged over the two divided pixels DPC5-34AG and DPC5-34BG having the same color so as to be shared thereby.

In the fifth row, a G pixel PCG5-56 is formed over the fifth column and the sixth column in a state rotated, for example, by 45 degrees from the Y direction to the X direction using the square arrangement as a reference.

The G pixel PCG5-56 includes triangular divided pixels DPC5-56AG and DPC5-56BG that are divided into two by the Y axis as a center. The divided pixel DPC5-56AG is arranged in the fifth column, and the divided pixel DPC5-56BG is arranged in the sixth column.

The divided pixel DPC5-56AG is allocated for L in stereo, and the divided pixel DPC5-56BG is allocated for R in stereo.

Further, a multilens ML5-56 is arranged over the two divided pixels DPC5-56AG and DPC5-56BG having the same color so as to be shared thereby.

In the pixel arrangement shown in FIG. 9, only the G pixels are arranged in the first row, the third row, and the fifth row. The R pixels and the G pixels are arranged alternately in the second row. The G pixels and the B pixels are arranged alternately in the fourth rows.

The configuration shown in FIG. 9 includes no useless pixel arrangement. Therefore, decrease in resolution caused by adopting stereo function is allowed to be suppressed.

Further, the detection transistor, the wirings, and the like are allowed to be provided based on square unit. Therefore, miniaturization is allowed to be performed.

Moreover, the light receiving face is allowed to detect LR two parallaxes in the structure where the zigzag honeycomb is divided into two in left and right. Therefore, even if the number of pixels is decreased to ½, the zigzag honeycomb processing allows the record pixel number to be restored to double. Therefore, decrease in resolution caused by adopting stereo function is allowed to be compensated.

FIG. 10 is a diagram conceptually illustrating a pixel arrangement when a thinning operation is performed on the pixel arrangement shown in FIG. 9.

In this example, all of the G pixels in the first, third, and fifth rows are taken away. As a result, linear-thinning is performed and a Bayer stereo arrangement is formed. Further, as described above, the FD is shared by four pixels.

In such a way, the Bayer stereo arrangement is formed when the thinning operation is performed. Therefore, a pixel addition system corresponding to typical Bayer arrangement is applicable as it is.

Read-out pixel signals corresponding to the pixel arrangement shown in FIG. 9 are subjected to demosaic processing. Through the demosaic processing, the zigzag arrangement (checkerboard-like arrangement) obtained by rotating the square arrangement (rectangular arrangement) by 45 degrees is allowed to be a square arrangement (rectangular arrangement) in the DSP circuit 31 based on the pixel signals temporally recorded in the image memory 32.

2-3. Third Characteristic Configuration Example

FIG. 11 is a diagram illustrating a third characteristic configuration example of the solid-state image pickup device (CMOS image sensor) according to the present embodiment.

In FIG. 11, for the sake of simplification in the diagram, only the first pixel section 60C is shown, and the multilenses and the second pixel section which are similar to those shown in FIG. 9 are omitted.

A CMOS image sensor 10C shown in FIG. 11 is different from the CMOS image sensor 10B shown in FIG. 9 in the following points.

In the CMOS image sensor 10C shown in FIG. 11, each of the G pixel, the R pixel, and the B pixel is divided not into two but into four in a form of 2×2. Two conditions that are parallax and wide dynamic range (WDR) are distributed to four pixels having the same color.

It is to be noted that the four triangular divided pixels having the same color share one multilens ML which is not illustrated.

In a first row, the G pixel PCG1-12 includes four divided pixels DPC1-12AG, DPC1-12BG, DPC1-12CG, and DPC1-12DG divided by the Y axis and the X axis as a center.

The G pixel PCG1-34 includes four divided pixels DPC1-34AG, DPC1-34BG, DPC1-34CG, and DPC1-34DG divided by the Y axis and the X axis as a center.

The G pixel PCG1-56 includes four divided pixels DPC1-56AG, DPC1-56BG, DPC1-56CG, and DPC1-56DG divided by the Y axis and the X axis as a center.

In a second row, the R pixel PCR2-01 includes four divided pixels DPC2-01AR, DPC2-01BR, DPC2-01CR, and DPC2-01DR divided by the Y axis and the X axis as a center.

The G pixel PGG2-23 includes four divided pixels DPC2-23AG, DPC2-23BG, DPC2-23CG, and DPC2-23DG divided by the Y axis and the X axis as a center.

The R pixel PCR2-45 includes four divided pixels DPC2-45AR, DPC2-45BR, DPC2-45CR, and DPC2-45DR divided by the Y axis and the X axis as a center.

The G pixel PGG2-67 includes four divided pixels DPC2-67AG, DPC2-67BG, DPC2-67CG, and DPC2-67DG divided by the Y axis and the X axis as a center.

In a third row, the G pixel PCG3-12 includes four divided pixels DPC3-12AG, DPC3-12BG, DPC3-12CG, and DPC3-12DG divided by the Y axis and the X axis as a center.

The G pixel PCG3-34 includes four divided pixels DPC3-34AG, DPC3-34BG, DPC3-34CG, and DPC3-34DG divided by the Y axis and the X axis as a center.

The G pixel PCG3-56 includes four divided pixels DPC3-56AG, DPC3-56BG, DPC3-56CG, and DPC3-56DG divided by the Y axis and the X axis as a center.

In a fourth row, the G pixel PCG4-01 includes four divided pixels DPC4-01AG, DPC4-01BG, DPC4-01CG, and DPC4-01DG divided by the Y axis and the X axis as a center.

The B pixel PCB4-23 includes four divided pixels DPC4-23AB, DPC4-23BB, DPC4-23CB, and DPC4-23 DB divided by the Y axis and the X axis as a center.

The G pixel PCG4-45 includes four divided pixels DPC4-45AG, DPC4-45BG, DPC4-45CG, and DPC4-45DG divided by the Y axis and the X axis as a center.

The B pixel PCB4-67 includes four divided pixels DPC4-67AB, DPC4-67BB, DPC4-67CB, and DPC4-67 DB divided by the Y axis and the X axis as a center.

In a fifth row, the G pixel PCG5-12 includes four divided pixels DPC5-12AG, DPC5-12BG, DPC5-12CG, and DPC5-12DG divided by the Y axis and the X axis as a center.

The G pixel PCG5-34 includes four divided pixels DPC5-34AG, DPC5-34BG, DPC5-34CG, and DPC5-34DG divided by the Y axis and the X axis as a center.

The G pixel PCG5-56 includes four divided pixels DPC5-56AG, DPC5-56BG, DPC5-56CG, and DPC5-56DG divided by the Y axis and the X axis as a center.

Read-out pixel signals corresponding to the pixel arrangement shown in FIG. 11 are subjected to demosaic processing. Through the demosaic processing, the zigzag arrangement (checkerboard-like arrangement) obtained by rotating the square arrangement (rectangular arrangement) by 45 degrees is allowed to be a square arrangement (rectangular arrangement) in the DSP circuit 31 based on the pixel signals temporally recorded in the image memory 32.

2-4. Fourth Characteristic Configuration Example

FIG. 12 is a diagram illustrating a fourth characteristic configuration example of the solid-state image pickup device (CMOS image sensor) according to the present embodiment.

A CMOS image sensor 10D shown in FIG. 12 is different from the CMOS image sensor shown in FIG. 9 in that the pixel arrangement before thinning is a zigzag Bayer stereo arrangement.

Also, in the example shown in FIG. 12, the second pixel section 70 is formed as a five-row-six-column square arrangement in five rows that are from a p-th row to a (p+4)th row and in six columns that are from a q-th column to a (q+5)th column.

The example shown in FIG. 12 illustrates a zigzag arrangement in five rows that are from the p-th row to the (p+4)th row and in six columns that are from the q-th column to the (q+5)th column.

The row arrangement and the column arrangement in the first pixel section 60 are formed to correspond to the row arrangement and the column arrangement in the second pixel section 70.

In the first pixel section 60D, G pixels, R pixels, and B pixels are arranged as follows.

Here, for the sake of easy understanding, description will be given assuming p=q=1, as in the case of the example shown in FIG. 9.

In a first row, a B pixel PCB1-23 is formed over the second column and the third column in a state rotated, for example, by 45 degrees from the Y direction to the X direction using the square arrangement as a reference.

The B pixel PCB1-23 includes triangular divided pixels DPC1-23AB and DPC1-23BB that are divided into two by the Y axis as a center. The divided pixel DPC1-23AB is arranged in the second column, and the divided pixel DPC1-23BB is arranged in the third column.

The divided pixel DPC1-23AB is allocated for L in stereo, and the divided pixel DPC1-23BB is allocated for R in stereo.

Further, a multilens ML1-23 is arranged over the two divided pixels DPC1-23AB and DPC1-23BB having the same color so as to be shared thereby.

In the first row, an R pixel PCR1-45 is formed over the fourth column and the fifth column in a state rotated, for example, by 45 degrees from the Y direction to the X direction using the square arrangement as a reference.

The R pixel PCR1-45 includes triangular divided pixels DPC1-45AR and DPC1-45BR that are divided into two by the Y axis as a center. The divided pixel DPC1-45AR is arranged in the fourth column, and the divided pixel DPC1-45BR is arranged in the fifth column.

The divided pixel DPC1-45AR is allocated for L in stereo, and the divided pixel DPC1-45BR is allocated for R in stereo.

Further, a multilens ML1-45 is arranged over the two divided pixels DPC1-45AR and DPC1-45BR having the same color so as to be shared thereby.

In a second row, a G pixel PCG2-12 is formed over the first column and the second column in a state rotated, for example, by 45 degrees from the Y direction to the X direction using the square arrangement as a reference.

The G pixel PCG2-12 includes triangular divided pixels DPC2-12AG and DPC2-12BG that are divided into two by the Y axis as a center. The divided pixel DPC2-12AG is arranged in the first column, and the divided pixel DPC2-12BG is arranged in the second column.

The divided pixel DPC2-12AG is allocated for L in stereo, and the divided pixel DPC2-12BG is allocated for R in stereo.

Further, a multilens ML2-12 is arranged over the two divided pixels DPC2-12AG and DPC2-12BG having the same color so as to be shared thereby.

In the second row, a G pixel PCG2-34 is formed over the third column and the fourth column in a state rotated, for example, by 45 degrees from the Y direction to the X direction using the square arrangement as a reference.

The G pixel PCG2-34 includes triangular divided pixels DPC2-34AG and DPC2-34BG that are divided into two by the Y axis as a center. The divided pixel DPC2-34AG is arranged in the third column, and the divided pixel DPC2-34BG is arranged in the fourth column.

The divided pixel DPC2-34AG is allocated for L in stereo, and the divided pixel DPC2-34BG is allocated for R in stereo.

Further, a multilens ML2-34 is arranged over the two divided pixels DPC2-34AG and DPC2-34BG having the same color so as to be shared thereby.

In the second row, a G pixel PCG2-56 is formed over the fifth column and the sixth column in a state rotated, for example, by 45 degrees from the Y direction to the X direction using the square arrangement as a reference.

The G pixel PCG2-56 includes triangular divided pixels DPC2-56AG and DPC2-56BG that are divided into two by the Y axis as a center. The divided pixel DPC2-56AG is arranged in the fifth column, and the divided pixel DPC2-56BG is arranged in the sixth column.

The divided pixel DPC2-56AG is allocated for L in stereo, and the divided pixel DPC2-56BG is allocated for R in stereo.

Further, a multilens ML2-56 is arranged over the two divided pixels DPC2-56AG and DPC2-56BG having the same color so as to be shared thereby.

In a third row, an R pixel PCR3-23 is formed over the second column and the third column in a state rotated, for example, by 45 degrees from the Y direction to the X direction using the square arrangement as a reference.

The R pixel PCR3-23 includes triangular divided pixels DPC3-23AR and DPC3-23BR that are divided into two by the Y axis as a center. The divided pixel DPC3-23AR is arranged in the second column, and the divided pixel DPC3-23BR is arranged in the third column.

The divided pixel DPC3-23AR is allocated for L in stereo, and the divided pixel DPC3-23BR is allocated for R in stereo.

Further, a multilens ML3-23 is arranged over the two divided pixels DPC3-23AR and DPC3-23BR having the same color so as to be shared thereby.

In the third row, a B pixel PCRB-45 is formed over the fourth column and the fifth column in a state rotated, for example, by 45 degrees from the Y direction to the X direction using the square arrangement as a reference.

The B pixel PCB3-45 includes triangular divided pixels DPC3-45AB and DPC3-45BB that are divided into two by the Y axis as a center. The divided pixel DPC3-45AB is arranged in the fourth column, and the divided pixel DPC3-45BB is arranged in the fifth column.

The divided pixel DPC3-45AB is allocated for L in stereo, and the divided pixel DPC3-45BB is allocated for R in stereo.

Further, a multilens ML3-45 is arranged over the two divided pixels DPC3-45AB and DPC3-45BB having the same color so as to be shared thereby.

In a fourth row, a G pixel PCG4-12 is formed over the first column and the second column in a state rotated, for example, by 45 degrees from the Y direction to the X direction using the square arrangement as a reference.

The G pixel PCG4-12 includes triangular divided pixels DPC4-12AG and DPC4-12BG that are divided into two by the Y axis as a center. The divided pixel DPC4-12AG is arranged in the first column, and the divided pixel DPC4-12BG is arranged in the second column.

The divided pixel DPC4-12AG is allocated for L in stereo, and the divided pixel DPC4-12BG is allocated for R in stereo.

Further, a multilens ML4-12 is arranged over the two divided pixels DPC4-12AG and DPC4-12BG having the same color so as to be shared thereby.

In the fourth row, a G pixel PCG4-34 is formed over the third column and the fourth column in a state rotated, for example, by 45 degrees from the Y direction to the X direction using the square arrangement as a reference.

The G pixel PCG4-34 includes triangular divided pixels DPC4-34AG and DPC4-34BG that are divided into two by the Y axis as a center. The divided pixel DPC4-34AG is arranged in the third column, and the divided pixel DPC4-34BG is arranged in the fourth column.

The divided pixel DPC4-34AG is allocated for L in stereo, and the divided pixel DPC4-34BG is allocated for R in stereo.

Further, a multilens ML4-34 is arranged over the two divided pixels DPC4-34AG and DPC4-34BG having the same color so as to be shared thereby.

In the fourth row, a G pixel PCG4-56 is formed over the fifth column and the sixth column in a state rotated, for example, by 45 degrees from the Y direction to the X direction using the square arrangement as a reference.

The G pixel PCG4-56 includes triangular divided pixels DPC4-56AG and DPC4-56BG that are divided into two by the Y axis as a center. The divided pixel DPC4-56AG is arranged in the fifth column, and the divided pixel DPC4-56BG is arranged in the sixth column.

The divided pixel DPC4-56AG is allocated for L in stereo, and the divided pixel DPC4-56BG is allocated for R in stereo.

Further, a multilens ML4-56 is arranged over the two divided pixels DPC4-56AG and DPC4-56BG having the same color so as to be shared thereby.

In a fifth row, a B pixel PCB5-23 is formed over the second column and the third column in a state rotated, for example, by 45 degrees from the Y direction to the X direction using the square arrangement as a reference.

The B pixel PCB5-23 includes triangular divided pixels DPC5-23AB and DPC5-23BB that are divided into two by the Y axis as a center. The divided pixel DPC5-23AB is arranged in the second column, and the divided pixel DPC5-23BB is arranged in the third column.

The divided pixel DPC5-23AB is allocated for L in stereo, and the divided pixel DPC5-23BB is allocated for R in stereo.

Further, a multilens ML5-23 is arranged over the two divided pixels DPC5-23AB and DPC5-23BB having the same color so as to be shared thereby.

In the fifth row, an R pixel PCR5-45 is formed over the fourth column and the fifth column in a state rotated, for example, by 45 degrees from the Y direction to the X direction using the square arrangement as a reference.

The R pixel PCR5-45 includes triangular divided pixels DPC5-45AR and DPC5-45BR that are divided into two by the Y axis as a center. The divided pixel DPC5-45AR is arranged in the fourth column, and the divided pixel DPC5-45BR is arranged in the fifth column.

The divided pixel DPC5-45AR is allocated for L in stereo, and the divided pixel DPC5-45BR is allocated for R in stereo.

Further, a multilens ML5-45 is arranged over the two divided pixels DPC5-45AR and DPC5-45BR having the same color so as to be shared thereby.

In the pixel arrangement shown in FIG. 12, only the G pixels are arranged in the second row and the fourth row. The B pixels and the R pixels are arranged alternately in the first row. The R pixels and the B pixels are arranged alternately in the third row. The B pixels and the R pixels are arranged alternately in the fifth row.

Also the configuration shown in FIG. 12 includes no useless pixel arrangement. Therefore, decrease in resolution caused by adopting stereo function is allowed to be suppressed.

Further, the detection transistor, the wirings, and the like are allowed to be provided based on square unit. Therefore, miniaturization is allowed to be performed.

Moreover, the light receiving face is allowed to detect LR two parallaxes in the structure where the zigzag honeycomb is divided into two in left and right. Therefore, even if the number of pixels is decreased to ½, the zigzag honeycomb processing allows the record pixel number to be restored to double. Therefore, decrease in resolution caused by adopting stereo function is allowed to be compensated.

FIG. 13 is a diagram conceptually illustrating a pixel arrangement obtained by performing binning operation on the pixel arrangement shown in FIG. 12.

In this example, binning such as thinning and addition is allowed to be performed by each four rows. Also in this example, the FD is shared by four pixels.

In such a way, the Bayer stereo arrangement is formed. Therefore, a pixel addition system corresponding to typical Bayer arrangement is applicable as it is.

Read-out pixel signals corresponding to the pixel arrangement shown in FIG. 12 are subjected to demosaic processing. Through the demosaic processing, the zigzag arrangement (checkerboard-like arrangement) obtained by rotating the square arrangement (rectangular arrangement) by 45 degrees is allowed to be a square arrangement (rectangular arrangement) in the DSP circuit 31 based on the pixel signals temporally recorded in the image memory 32.

2-5. Fifth Characteristic Configuration Example

FIG. 14 is a diagram illustrating a fifth characteristic configuration example of the solid-state image pickup device (CMOS image sensor) according to the present embodiment.

A CMOS image sensor 10E shown in FIG. 14 is different from the CMOS image sensor 10D shown in FIG. 12 in that two triangular divided pixels that share one multilens have not the same color but different colors from each other.

In a first row, as a divided pixel that shares the multilens ML1-23 with the divided pixel DPC1-23AB of the B pixel, a divided pixel DPC1-23BG of the G pixel having a different color is arranged instead of the divided pixel DPC1-23BB having the same color.

As a divided pixel that shares the multilens ML1-45 with the divided pixel DPC1-45AR of the R pixel, a divided pixel DPC1-45BG of the G pixel having a different color is arranged instead of the divided pixel DPC1-45BR having the same color.

In a second row, as a divided pixel that shares the multilens ML2-12 with the divided pixel DPC2-12AG of the G pixel, a divided pixel DPC2-12BR of the R pixel having a different color is arranged instead of the divided pixel DPC2-12BG having the same color.

As a divided pixel that shares the multilens ML2-34 with the divided pixel DPC2-34AG of the G pixel, a divided pixel DPC2-34BB of the B pixel having a different color is arranged instead of the divided pixel DPC2-34BG having the same color.

As a divided pixel that shares the multilens ML2-56 with the divided pixel DPC2-56AG of the G pixel, a divided pixel DPC2-56BR of the R pixel having a different color is arranged instead of the divided pixel DPC2-56BG having the same color.

In a third row, as a divided pixel that shares the multilens ML3-23 with the divided pixel DPC3-23AR of the R pixel, a divided pixel DPC3-23BG of the G pixel having a different color is arranged instead of the divided pixel DPC3-23BR having the same color.

As a divided pixel that shares the multilens ML3-45 with the divided pixel DPC3-45AB of the B pixel, a divided pixel DPC3-45BG of the G pixel having a different color is arranged instead of the divided pixel DPC3-45BB having the same color.

In a fourth row, as a divided pixel that shares the multilens ML4-12 with the divided pixel DPC4-12AG of the G pixel, a divided pixel DPC4-12BB of the B pixel having a different color is arranged instead of the divided pixel DPC4-12BG having the same color.

As a divided pixel that shares the multilens ML4-34 with the divided pixel DPC4-34AG of the G pixel, a divided pixel DPC4-34BR of the R pixel having a different color is arranged instead of the divided pixel DPC4-34BG having the same color.

As a divided pixel that shares the multilens ML4-56 with the divided pixel DPC4-56AG of the G pixel, a divided pixel DPC4-56BB of the B pixel having a different color is arranged instead of the divided pixel DPC4-56BG having the same color.

In a fifth row, as a divided pixel that shares the multilens ML5-23 with the divided pixel DPC5-23AB of the B pixel, a divided pixel DPC5-23BG of the G pixel having a different color is arranged instead of the divided pixel DPC5-23BB having the same color.

As a divided pixel that shares the multilens ML5-45 with the divided pixel DPC5-45AR of the R pixel, a divided pixel DPC5-45BG of the G pixel having a different color is arranged instead of the divided pixel DPC5-45BR having the same color.

In the pixel arrangement shown in FIG. 14, B pixels, G pixels, and R pixels are arranged alternately in a mixed state from the first to fifth rows.

Further, in the pixel arrangement shown in FIG. 14, only G pixels are arranged in the first column, the third column, and the fifth column, to form so-called vertical stripes of G pixels.

Also the configuration shown in FIG. 14 includes no useless pixel arrangement. Therefore, decrease in resolution caused by adopting stereo function is allowed to be suppressed.

Further, the detection transistor, the wirings, and the like are allowed to be provided based on square unit. Therefore, miniaturization is allowed to be performed.

Moreover, the light receiving face is allowed to detect LR two parallaxes in the structure where the zigzag honeycomb is divided into two in left and right. Therefore, even if the number of pixels is decreased to ½, the zigzag honeycomb processing allows the record pixel number to be restored to double. Therefore, decrease in resolution caused by adopting stereo function is allowed to be compensated.

Moreover, the color pixels sharing one multilens ML are allowed to have not the same color but different colors. Therefore, mixture (extinction ratio) of L and R in stereo is allowed to be improved by a lens gap and this different color separation.

FIG. 15 is a diagram conceptually illustrating a pixel arrangement obtained by performing binning operation on the pixel arrangement shown in FIG. 14.

In this example, binning such as thinning and addition is allowed to be performed by each four rows. Also in this example, the FD is shared by four pixels.

In such a way, the Bayer stereo arrangement is formed. Therefore, a pixel addition system corresponding to typical Bayer arrangement is applicable as it is.

Read-out pixel signals corresponding to the pixel arrangement shown in FIG. 14 are subjected to demosaic processing. Through the demosaic processing, the zigzag arrangement (checkerboard-like arrangement) obtained by rotating the square arrangement (rectangular arrangement) by 45 degrees is allowed to be a square arrangement (rectangular arrangement) in the DSP circuit 31 based on the pixel signals temporally recorded in the image memory 32.

2-6. Sixth Characteristic Configuration Example

FIG. 16 is a diagram illustrating a sixth characteristic configuration example of the solid-state image pickup device (CMOS image sensor) according to the present embodiment.

A CMOS image sensor 10F shown in FIG. 16 is different from the CMOS image sensor 10D shown in FIG. 12 in that the pixel arrangement includes a color to be a main component of a luminance signal, for example, a white pixel (W (White) pixel).

A color filter array that has color coding including white has output voltage higher than that of the color filter array having the RGB Bayer arrangement. Therefore, sensitivity of the CMOS image sensor 10F is allowed to be higher.

In the example shown in FIG. 16, the second pixel section 70 is formed as a five-row-six-column square arrangement in five rows that are from a p-th row to a (p+4)th row and in six columns that are from a q-th column to a (q+5)th column.

The example shown in FIG. 16 illustrates a zigzag arrangement in five rows that are from the p-th row to the (p+4)th row and in eighth columns that are from a (q−1)th column to a (q+6)th column.

The row arrangement and the column arrangement in a first pixel section 60F are formed to correspond to the row arrangement and the column arrangement in the second pixel section 70.

In the first pixel section 60F, W pixels, G pixels, R pixels, and B pixels are arranged as follows.

Here, for the sake of easy understanding, description will be given assuming p=q=1, as in the case of the example shown in FIG. 9.

In a first row, a B pixel PCB1-23 is formed over the second column and the third column in a state rotated, for example, by 45 degrees from the Y direction to the X direction using the square arrangement as a reference.

The B pixel PCB1-23 includes triangular divided pixels DPC1-23AB and DPC1-23BB that are divided into two by the Y axis as a center. The divided pixel DPC1-23AB is arranged in the second column, and the divided pixel DPC1-23BB is arranged in the third column.

The divided pixel DPC1-23AB is allocated for L in stereo, and the divided pixel DPC1-23BB is allocated for R in stereo.

Further, a multilens ML1-23 is arranged over the two divided pixels DPC1-23AB and DPC1-23BB having the same color so as to be shared thereby.

In the first row, a G pixel PCG1-45 is formed over the fourth column and the fifth column in a state rotated, for example, by 45 degrees from the Y direction to the X direction using the square arrangement as a reference.

The G pixel PCG1-45 includes triangular divided pixels DPC1-45AG and DPC1-45BG that are divided into two by the Y axis as a center. The divided pixel DPC1-45AG is arranged in the fourth column, and the divided pixel DPC1-45BG is arranged in the fifth column.

The divided pixel DPC1-45AG is allocated for L in stereo, and the divided pixel DPC1-45BG is allocated for R in stereo.

Further, a multilens ML1-45 is arranged over the two divided pixels DPC1-45AG and DPC1-45BG having the same color so as to be shared thereby.

In a second row, a W pixel PCW2-12 is formed over the first column and the second column in a state rotated, for example, by 45 degrees from the Y direction to the X direction using the square arrangement as a reference.

The W pixel PCW2-12 includes triangular divided pixels DPC2-12AW and DPC2-12BW that are divided into two by the Y axis as a center. The divided pixel DPC2-12AW is arranged in the first column, and the divided pixel DPC2-12BW is arranged in the second column.

The divided pixel DPC2-12AW is allocated for L in stereo, and the divided pixel DPC2-12BW is allocated for R in stereo.

Further, a multilens ML2-12 is arranged over the two divided pixels DPC2-12AW and DPC2-12BW having the same color so as to be shared thereby.

In the second row, a W pixel PCW2-34 is formed over the third column and the fourth column in a state rotated, for example, by 45 degrees from the Y direction to the X direction using the square arrangement as a reference.

The W pixel PCW2-34 includes triangular divided pixels DPC2-34AW and DPC2-34BW that are divided into two by the Y axis as a center. The divided pixel DPC2-34AW is arranged in the third column, and the divided pixel DPC2-34BW is arranged in the fourth column.

The divided pixel DPC2-34AW is allocated for L in stereo, and the divided pixel DPC2-34BW is allocated for R in stereo.

Further, a multilens ML2-34 is arranged over the two divided pixels DPC2-34AW and DPC2-34BW having the same color so as to be shared thereby.

In the second row, a W pixel PCW2-56 is formed over the fifth column and the sixth column in a state rotated, for example, by 45 degrees from the Y direction to the X direction using the square arrangement as a reference.

The W pixel PCW2-56 includes triangular divided pixels DPC2-56AW and DPC2-56BW that are divided into two by the Y axis as a center. The divided pixel DPC2-56AW is arranged in the fifth column, and the divided pixel DPC2-56BW is arranged in the sixth column.

The divided pixel DPC2-56AW is allocated for L in stereo, and the divided pixel DPC2-56BW is allocated for R in stereo.

Further, a multilens ML2-56 is arranged over the two divided pixels DPC2-56AW and DPC2-56BW having the same color so as to be shared thereby.

In the third row, an R pixel PCR3-01 is formed over the zero-th column and the first column in a state rotated, for example, by 45 degrees from the Y direction to the X direction using the square arrangement as a reference.

The R pixel PCR3-01 includes triangular divided pixels DPC3-01AR and DPC3-01BR that are divided into two by the Y axis as a center. The divided pixel DPC3-01AR is arranged in the zero-th column, and the divided pixel DPC3-01BR is arranged in the first column.

The divided pixel DPC3-01AR is allocated for L in stereo, and the divided pixel DPCR-01BR is allocated for R in stereo.

Further, a multilens ML3-01 is arranged over the two divided pixels DPC3-01AR and DPC3-01BR having the same color so as to be shared thereby.

In the third row, a G pixel PCG3-23 is formed over the second column and the third column in a state rotated, for example, by 45 degrees from the Y direction to the X direction using the square arrangement as a reference.

The G pixel PCG3-23 includes triangular divided pixels DPC3-23AG and DPC3-23BG that are divided into two by the Y axis as a center. The divided pixel DPC3-23AG is arranged in the second column, and the divided pixel DPC3-23BG is arranged in the third column.

The divided pixel DPC3-23AG is allocated for L in stereo, and the divided pixel DPC3-23BG is allocated for R in stereo.

Further, a multilens ML3-23 is arranged over the two divided pixels DPC3-23AG and DPC3-23BG having the same color so as to be shared thereby.

In the third row, an R pixel PCR3-45 is formed over the fourth column and the fifth column in a state rotated, for example, by 45 degrees from the Y direction to the X direction using the square arrangement as a reference.

The R pixel PCB3-45 includes triangular divided pixels DPC3-45AR and DPC3-45BR that are divided into two by the Y axis as a center. The divided pixel DPC3-45AR is arranged in the fourth column, and the divided pixel DPC3-45BR is arranged in the fifth column.

The divided pixel DPC3-45AR is allocated for L in stereo, and the divided pixel DPC3-45BR is allocated for R in stereo.

Further, a multilens ML3-45 is arranged over the two divided pixels DPC3-45AR and DPC3-45BR having the same color so as to be shared thereby.

In the third row, a G pixel PCG3-67 is formed over the sixth column and the seventh column in a state rotated, for example, by 45 degrees from the Y direction to the X direction using the square arrangement as a reference.

The G pixel PCG3-67 includes triangular divided pixels DPC3-67AG and DPC3-67BG that are divided into two by the Y axis as a center. The divided pixel DPC3-67AG is arranged in the sixth column, and the divided pixel DPC3-67BG is arranged in the seventh column.

The divided pixel DPC3-67AG is allocated for L in stereo, and the divided pixel DPC3-667G is allocated for R in stereo.

Further, a multilens ML3-67 is arranged over the two divided pixels DPC3-67AG and DPC3-67BG having the same color so as to be shared thereby.

In a fourth row, a W pixel PCW4-12 is formed over the first column and the second column in a state rotated, for example, by 45 degrees from the Y direction to the X direction using the square arrangement as a reference.

The W pixel PCW4-12 includes triangular divided pixels DPC4-12AW and DPC4-12BW that are divided into two by the Y axis as a center. The divided pixel DPC4-12AW is arranged in the first column, and the divided pixel DPC4-12BW is arranged in the second column.

The divided pixel DPC4-12AW is allocated for L in stereo, and the divided pixel DPC4-12BW is allocated for R in stereo.

Further, a multilens ML4-12 is arranged over the two divided pixels DPC4-12AW and DPC4-12BW having the same color so as to be shared thereby.

In the fourth row, a W pixel PCW4-34 is formed over the third column and the fourth column in a state rotated, for example, by 45 degrees from the Y direction to the X direction using the square arrangement as a reference.

The W pixel PCW4-34 includes triangular divided pixels DPC4-34AW and DPC4-34BW that are divided into two by the Y axis as a center. The divided pixel DPC4-34AW is arranged in the third column, and the divided pixel DPC4-34BW is arranged in the fourth column.

The divided pixel DPC4-34AW is allocated for L in stereo, and the divided pixel DPC4-34BW is allocated for R in stereo.

Further, a multilens ML4-34 is arranged over the two divided pixels DPC4-34AW and DPC4-34BW having the same color so as to be shared thereby.

In the fourth row, a W pixel PCW4-56 is formed over the fifth column and the sixth column in a state rotated, for example, by 45 degrees from the Y direction to the X direction using the square arrangement as a reference.

The W pixel PCW4-56 includes triangular divided pixels DPC4-56AW and DPC4-56BW that are divided into two by the Y axis as a center. The divided pixel DPC4-56AW is arranged in the fifth column, and the divided pixel DPC4-56BW is arranged in the sixth column.

The divided pixel DPC4-56AW is allocated for L in stereo, and the divided pixel DPC4-56BW is allocated for R in stereo.

Further, a multilens ML4-56 is arranged over the two divided pixels DPC4-56AW and DPC4-56BW having the same color so as to be shared thereby.

In a fifth row, a B pixel PCB5-23 is formed over the second column and the third column in a state rotated, for example, by 45 degrees from the Y direction to the X direction using the square arrangement as a reference.

The B pixel PCB5-23 includes triangular divided pixels DPC5-23AB and DPC5-23BB that are divided into two by the Y axis as a center. The divided pixel DPC5-23AB is arranged in the second column, and the divided pixel DPC5-23BB is arranged in the third column.

The divided pixel DPC5-23AB is allocated for L in stereo, and the divided pixel DPC5-23BB is allocated for R in stereo.

Further, a multilens ML5-23 is arranged over the two divided pixels DPC5-23AB and DPC5-23BB having the same color so as to be shared thereby.

In the fifth row, a G pixel PCG5-45 is formed over the fourth column and the fifth column in a state rotated, for example, by 45 degrees from the Y direction to the X direction using the square arrangement as a reference.

The G pixel PCG5-45 includes triangular divided pixels DPC5-45AG and DPC5-45BG that are divided into two by the Y axis as a center. The divided pixel DPC5-45AG is arranged in the fourth column, and the divided pixel DPC5-45BG is arranged in the fifth column.

The divided pixel DPC5-45AG is allocated for L in stereo, and the divided pixel DPC5-45BG is allocated for R in stereo.

Further, a multilens ML5-45 is arranged over the two divided pixels DPC5-45AG and DPC5-45BG having the same color so as to be shared thereby.

In the pixel arrangement shown in FIG. 16, only W pixels are arranged in the second row and the fourth row. B pixels and G pixels are arranged alternately in the first row. R pixels and G pixels are arranged alternately in the third row. B pixels and G pixels are arranged alternately in the fifth row.

Also the configuration shown in FIG. 16 includes no useless pixel arrangement. Therefore, decrease in resolution caused by adopting stereo function is allowed to be suppressed.

Further, the detection transistor, the wirings, and the like are allowed to be provided based on square unit. Therefore, miniaturization is allowed to be performed.

Moreover, the light receiving face is allowed to detect LR two parallaxes in the structure where the zigzag honeycomb is divided into two in left and right. Therefore, even if the number of pixels is decreased to ½, the zigzag honeycomb processing allows the record pixel number to be restored to double. Therefore, decrease in resolution caused by adopting stereo function is allowed to be compensated.

FIG. 17 is a diagram conceptually illustrating a pixel arrangement obtained by addition operation on the pixel arrangement shown in FIG. 16.

In this example, in the addition processing, addition is performed for pixels having the same color in the vertical direction, and digital addition in the lateral direction is performed by the DSP circuit 31. Further, FIG. 17 conceptually illustrates a pixel center after the addition.

Read-out pixel signals corresponding to the pixel arrangement shown in FIG. 16 are subjected to demosaic processing. Through the demosaic processing, the zigzag arrangement (checkerboard-like arrangement) obtained by rotating the square arrangement (rectangular arrangement) by 45 degrees is allowed to be a square arrangement (rectangular arrangement) in the DSP circuit 31 based on the pixel signals temporally recorded in the image memory 32.

2-7. Seventh Characteristic Configuration Example

FIG. 18 is a diagram illustrating a seventh characteristic configuration example of the solid-state image pickup device (CMOS image sensor) according to the present embodiment.

A CMOS image sensor 10G shown in FIG. 18 is different from the CMOS image sensor 10D shown in FIG. 12 is that a configuration in which pixels are fully arranged is adopted in terms of multiple perspectives in the Bayer arrangement.

In an example shown in FIG. 18, four full pixels FPC1, FPC2, FPC3, and FPC4 are arranged in a matrix in a form of 2×2, and are formed in a state rotated, for example, by 45 degrees from the Y direction to the X direction.

Further, multilenses FML1, FML2, FML3, and FML4 are arranged over the respective full pixels FPC1, FPC2, FPC3, and FPC4 so as to be shared by the respective pixels.

In the example shown in FIG. 18, the full pixel FPC1 is formed of G pixels PCG1-23, PCG1-45, PCG0-34, and PGG2-34 that are arranged in a matrix in a form of 2×2.

The G pixel PCG1-23 includes triangular divided pixels DPC1-2AG and DPC1-3BG that are divided into two by the Y axis as a center. The divided pixel DPC1-2AG is arranged in the second column, and the divided pixel DPC1-3BG is arranged in the third column.

The G pixel PCG1-45 includes triangular divided pixels DPC1-4AG and DPC1-5BG that are divided into two by the Y axis as a center. The divided pixel DPC1-4AG is arranged in the fourth column, and the divided pixel DPC1-5BG is arranged in the fifth column.

The G pixel PCG0-34 includes triangular divided pixels DPC0-3AG and DPC0-4BG that are divided into two by the Y axis as a center. The divided pixel DPC0-3AG is arranged in the third column, and the divided pixel DPC0-4BG is arranged in the fourth column.

The G pixel PGG2-34 includes triangular divided pixels DPC2-3AG and DPC2-4BG that are divided into two by the Y axis as a center. The divided pixel DPC2-3AG is arranged in the third column, and the divided pixel DPC2-4BG is arranged in the fourth column.

The multilens FML1 is arranged over the eight divided pixels DPC1-2AG, DPC1-3BG, DPC1-4AG, DPC1-5BG, DPC0-3AG, DPC0-4BG, DPC2-3AG, and DPC2-4BG so as to be shared thereby.

In this example, the multilens FML1 is arranged over the eight divided pixels having the same color so as to be shared thereby.

Here, in the full pixel FPC1, the respective four divided pixels on the left side of the Y axis as a center in the drawing are allocated for L in stereo and the respective four divided pixels on the right side are allocated for R in stereo.

Specifically, the divided pixels DPC1-2AG, DPC1-3BG, DPC0-3AG, and DPC2-3AG are allocated for L in stereo.

The divided pixels DPC1-4AG, DPC1-5BG, DPC0-4BG, and DPC2-4BG are allocated for R in stereo.

The full pixel FPC2 is formed of G pixels PCG5-23, PCG5-45, PCG4-34, and PCG6-34 that are arranged in a matrix in a form of 2×2.

The G pixel PCG5-23 includes triangular divided pixels DPC5-2AG and DPC5-3BG that are divided into two by the Y axis as a center. The divided pixel DPC5-2AG is arranged in the second column, and the divided pixel DPC5-3BG is arranged in the third column.

The G pixel PCG5-45 includes triangular divided pixels DPC5-4AG and DPC5-5BG that are divided into two by the Y axis as a center. The divided pixel DPC5-4AG is arranged in the fourth column, and the divided pixel DPC5-5BG is arranged in the fifth column.

The G pixel PCG4-34 includes triangular divided pixels DPC4-3AG and DPC4-4BG that are divided into two by the Y axis as a center. The divided pixel DPC4-3AG is arranged in the third column, and the divided pixel DPC4-4BG is arranged in the fourth column.

The G pixel PCG6-34 includes triangular divided pixels DPC6-3AG and DPC6-4BG that are divided into two by the Y axis as a center. The divided pixel DPC6-3AG is arranged in the third column, and the divided pixel DPC6-4BG is arranged in the fourth column.

The multilens FML2 is arranged over the eight divided pixels DPC5-2AG, DPC5-3BG, DPC5-4AG, DPC5-5BG, DPC4-3AG, DPC4-4BG, DPC6-3AG, and DPC6-4BG so as to be shared thereby.

In this example, the multilens FML2 is arranged over the eight divided pixels having the same color so as to be shared thereby.

Here, in the full pixel FPC2, the respective four divided pixels on the left side of the Y axis as a center in the drawing are allocated for L in stereo and the respective four divided pixels on the right side are allocated for R in stereo.

Specifically, the divided pixels DPC5-2AG, DPC5-3BG, DPC4-3AG, and DPC6-3AG are allocated for L in stereo.

The divided pixels DPC5-4AG, DPC5-5BG, DPC4-4BG, and DPC6-4BG are allocated for R in stereo.

The full pixel FPC3 is formed of B pixels PCB3-01, PCB3-23, PCB2-12, and PCB4-12 that are arranged in a matrix in a form of 2×2.

The B pixel PCB3-01 includes triangular divided pixels DPC3-0AB and DPC3-1BB that are divided into two by the Y axis as a center. The divided pixel DPC3-0AB is arranged in the zero-th column, and the divided pixel DPC3-1BB is arranged in the first column.

The B pixel PCB3-23 includes triangular divided pixels DPC3-2AB and DPC3-3BB that are divided into two by the Y axis as a center. The divided pixel DPC3-2AB is arranged in the second column, and the divided pixel DPC3-3BB is arranged in the third column.

The B pixel PGG2-12 includes triangular divided pixels DPC2-1AB and DPC2-2BB that are divided into two by the Y axis as a center. The divided pixel DPC2-1AB is arranged in the first column, and the divided pixel DPC2-2BB is arranged in the second column.

The B pixel PCB4-12 includes triangular divided pixels DPC4-1AB and DPC4-2BB that are divided into two by the Y axis as a center. The divided pixel DPC4-1AB is arranged in the first column, and the divided pixel DPC4-2BB is arranged in the second column.

The multilens FML3 is arranged over the eight divided pixels DPC3-0AB, DPC3-1BB, DPC3-2AB, DPC3-3BB, DPC2-1AB, DPC2-2BB, DPC4-1AB, and DPC4-2BB so as to be shared thereby.

In this example, the multilens FML3 is arranged over the eight divided pixels having the same color so as to be shared thereby.

Here, in the full pixel FPC3, the respective four divided pixels on the left side of the Y axis as a center in the drawing are allocated for L in stereo and the respective four divided pixels on the right side are allocated for R in stereo.

Specifically, the divided pixels DPC3-0AB, DPC3-1BB, DPC2-1AB, and DPC4-1AB are allocated for L in stereo.

The divided pixels DPC3-2AB, DPC3-3BB, DPC2-2BB, and DPC4-2BB are allocated for R in stereo.

The full pixel FPC4 is formed of R pixels PCR3-45, PCR3-67, PCB2-56, and PCR4-56 that are arranged in a matrix in a form of 2×2.

The R pixel PCR3-45 includes triangular divided pixels DPC3-4AR and DPC3-5BR that are divided into two by the Y axis as a center. The divided pixel DPC3-4AR is arranged in the fourth column, and the divided pixel DPC3-5BR is arranged in the fifth column.

The R pixel PCR3-67 includes triangular divided pixels DPC3-6AR and DPC3-7BR that are divided into two by the Y axis as a center. The divided pixel DPC3-6AR is arranged in the sixth column, and the divided pixel DPC3-7BR is arranged in the seventh column.

The R pixel PCR2-56 includes triangular divided pixels DPC2-5AR and DPC2-6BR that are divided into two by the Y axis as a center. The divided pixel DPC2-5AR is arranged in the fifth column, and the divided pixel DPC2-6BR is arranged in the sixth column.

The R pixel PCR4-56 includes triangular divided pixels DPC4-5AR and DPC4-6BR that are divided into two by the Y axis as a center. The divided pixel DPC4-5A5 is arranged in the fifth column, and the divided pixel DPC4-6BR is arranged in the sixth column.

The multilens FML4 is arranged over the eight divided pixels DPC3-4AR, DPC3-5BR, DPC3-6AR, DPC3-7BR, DPC2-5AR, DPC2-6BR, DPC4-5AR, and DPC4-5BR so as to be shared thereby.

In this example, the multilens FML4 is arranged over the eight divided pixels having the same color so as to be shared thereby.

Here, in the full pixel FPC4, the respective four divided pixels on the left side of the Y axis as a center in the drawing are allocated for L in stereo and the respective four divided pixels on the right side are allocated for R in stereo.

Specifically, the divided pixels DPC3-4AR, DPC3-5BR, DPC2-5AR, and DPC4-5AR are allocated for L in stereo.

The divided pixels DPC3-6AR, DPC3-7BR, DPC2-6BR, and DPC4-6BR are allocated for R in stereo.

FIG. 19 is a diagram for discussing the example shown in FIG. 18 in terms of multiple perspectives in the Bayer arrangement.

The pixel arrangement shown in FIG. 18 corresponds to nine perspective images including six actual parallax images and three interpolated parallax images in the horizontal direction (X direction), and the number of perspective images in the horizontal direction is large. Therefore, the pixel arrangement shown in FIG. 18 is suitable for a monocular three-dimensional (3D) stereo camera.

FIG. 20 is a diagram conceptually illustrating a pixel arrangement obtained by performing binning processing on the example shown in FIG. 18.

In a case where the binning processing is performed applying the pixel arrangement shown in FIG. 18, four parallaxes are achieved only by the G-pixel rows such as the first row and the fifth row as shown in FIG. 20.

It is to be noted that, when only the stereo function is used, the pixels in the Y direction (vertical direction) do not contribute to the stereo function.

2-8. Eighth Characteristic Configuration Example

FIG. 21 is a diagram illustrating an eighth characteristic configuration example of the solid-state image pickup device (CMOS image sensor) according to the present embodiment.

A CMOS image sensor 10H shown in FIG. 21 is different from the CMOS image sensor 10G shown in FIG. 18 in that color pixels configuring respective full pixels FPC1H, FPC2H, FPC3H, and FPC4H have different colors.

It is to be noted that, in FIG. 21, for the sake of easy understanding, only parts different from those in the configuration shown in FIG. 18 are denoted with signs.

In the full pixel FPC1H, an R pixel PCR0-34 is formed instead of the G pixel PCG0-34, and a B pixel PCB2-34 is formed instead of the G pixel PGG2-34.

Further, the R pixel PCR0-34 includes triangular divided pixels DPC0-3AR and DPC0-4BR that are divided into two by the Y axis as a center.

The B pixel PCB2-34 includes triangular divided pixels DPC2-3AB and DPC2-4BB that are divided into two by the Y axis as a center.

It is to be noted that a multilens FML1H is arranged over the eight divided pixels DPC1-2AG, DPC1-3BG, DPC1-4AG, DPC1-5BG, DPC0-3AR, DPC0-4BR, DPC2-3AB, and DPC2-4BB so as to be shared thereby.

Also in this example, the multilens FML1H is arranged over the eight divided pixels so as to be shared thereby.

In the full pixel FPC2H, a B pixel PCB4-34 is formed instead of the G pixel PCG4-34, and an R pixel PCR6-34 is formed instead of the G pixel PCG6-34.

Further, the B pixel PCB4-34 includes triangular divided pixels DPC4-3AB and DPC4-4BB that are divided into two by the Y axis as a center.

The R pixel PCR6-34 includes triangular divided pixels DPC6-3AR and DPC6-4BR that are divided into two by the Y axis as a center.

It is to be noted that a multilens FML1H is arranged over the eight divided pixels DPC5-2AG, DPC5-3BG, DPC5-4AG, DPC5-5BG, DPC4-3AB, DPC4-4BB, DPC6-3AR, and DPC6-4BR so as to be shared thereby.

Also in this example, the multilens FML2H is arranged over the eight divided pixels so as to be shared thereby.

In the full pixel FPC3H, an R pixel PCR3-01 is formed instead of the B pixel PCB3-01, a G pixel PCG2-12 is formed instead of the B pixel PCB2-12, and a G pixel PCG4-12 is formed instead of the B pixel PCB4-12.

Further, the R pixel PCR3-01 includes triangular divided pixels DPC3-0AR and DPC3-1BR that are divided into two by the Y axis as a center.

The G pixel PCG2-12 includes triangular divided pixels DPC2-1AG and DPC2-2BG that are divided into two by the Y axis as a center.

The G pixel PCR4-12 includes triangular divided pixels DPC4-1AG and DPC4-2BG that are divided into two by the Y axis as a center.

It is to be noted that a multilens FML3H is arranged over the eight divided pixels DPC3-0AR, DPC3-1BR, DPC3-2AB, DPC3-3BB, DPC2-1AG, DPC2-2BG, DPC4-1AG, and DPC4-2BG so as to be shared thereby.

Also in this example, the multilens FML3H is arranged over the eight divided pixels so as to be shared thereby.

In the full pixel FPC4H, a B pixel PCB3-45 is formed instead of the R pixel PCR3-45, a G pixel PCG2-56 is formed instead of the R pixel PCR2-56, and a G pixel PCG4-56 is formed instead of the R pixel PCR4-56.

Further, the B pixel PCB3-45 includes triangular divided pixels DPC3-4AB and DPC3-5BB that are divided into two by the Y axis as a center.

The G pixel PCG2-56 includes triangular divided pixels DPC2-5AG and DPC2-6BG that are divided into two by the Y axis as a center.

The G pixel PCR4-56 includes triangular divided pixels DPC4-5AG and DPC4-6BG that are divided into two by the Y axis as a center.

It is to be noted that a multilens FML4H is arranged over the eight divided pixels DPC3-0AB, DPC3-1BB, DPC3-6AR, DPC3-7BR, DPC2-5AG, DPC2-6BG, DPC4-5AG, and DPC4-6BG so as to be shared thereby.

Also in this example, the multilens FML4H is arranged over the eight divided pixels so as to be shared thereby.

Also in a case where the binning processing is performed applying the pixel arrangement shown in FIG. 21, four parallaxes are achieved only by the G-pixel rows such as the first row and the fifth row as shown in FIG. 20.

2-9. Ninth Characteristic Configuration Example

FIG. 22 is a diagram illustrating a ninth characteristic configuration example of the solid-state image pickup device (CMOS image sensor) according to the present embodiment.

A CMOS image sensor 10I shown in FIG. 22 is different from the CMOS image sensor 10G shown in FIG. 18 in that color pixels configuring respective full pixels FPC1I, FPC2I, FPC3I, and FPC4I are different.

It is to be noted that, in FIG. 22, for the sake of easy understanding, only parts different from those in the configuration shown in FIG. 18 are denoted with signs.

In the full pixel FPC1I, an R pixel PCR0-34 is formed instead of the G pixel PCG0-34, and an R pixel PCR2-34 is formed instead of the G pixel PGG2-34.

Further, the R pixel PCR0-34 includes triangular divided pixels DPC0-3AR and DPC0-4BR that are divided into two by the Y axis as a center.

The R pixel PCR2-34 includes triangular divided pixels DPC2-3AR and DPC2-4BR that are divided into two by the Y axis as a center.

It is to be noted that a multilens FML1I is arranged over the eight divided pixels DPC1-2AG, DPC1-3BG, DCP1-4AG, DPC1-5BG, DPC0-3AR, DPC0-4BR, DPC2-3AR, and DPC2-4BR so as to be shared thereby.

Also in this example, the multilens FML1I is arranged over the eight divided pixels so as to be shared thereby.

In the full pixel FPC2I, a B pixel PCB4-34 is formed instead of the G pixel PCG4-34, and a B pixel PCB6-34 is formed instead of the G pixel PCG6-34.

Further, the B pixel PCB4-34 includes triangular divided pixels DPC4-3AB and DPC4-4BB that are divided into two by the Y axis as a center.

The B pixel PCB6-34 includes triangular divided pixels DPC6-3AB and DPC6-4BB that are divided into two by the Y axis as a center.

It is to be noted that a multilens FML2I is arranged over the eight divided pixels DPC5-2AG, DPC5-3BG, DPC5-4AG, DPC5-5BG, DPC4-3AB, DPC4-4BB, DPC6-3AB, and DPC6-4BB so as to be shared thereby.

Also in this example, the multilens FML2I is arranged over the eight divided pixels so as to be shared thereby.

In the full pixel FPC3I, a G pixel PCG2-12 is formed instead of the B pixel PCB2-12, and a G pixel PCG4-12 is formed instead of the B pixel PCB4-12.

Further, the G pixel PCG2-12 includes triangular divided pixels DPC2-1AG and DPC2-2BG that are divided into two by the Y axis as a center.

The G pixel PCG4-12 includes triangular divided pixels DPC4-1AG and DPC4-2BG that are divided into two by the Y axis as a center.

It is to be noted that a multilens FML3I is arranged over the eight divided pixels DPC3-0AB, DPC3-1BB, DPC3-2AB, DPC3-3BB, DPC2-1AG, DPC2-2BG, DPC4-1AG, and DPC4-2BG so as to be shared thereby.

Also in this example, the multilens FML3I is arranged over the eight divided pixels so as to be shared thereby.

In the full pixel FPC4I, a G pixel PCG2-56 is formed instead of the R pixel PCR2-56, and a G pixel PCG4-56 is formed instead of the R pixel PCR4-56.

Further, the G pixel PCG2-56 includes triangular divided pixels DPC2-5AG and DPC2-6BG that are divided into two by the Y axis as a center.

The G pixel PCR4-56 includes triangular divided pixels DPC4-5AG and DPC4-6BG that are divided into two by the Y axis as a center.

It is to be noted that a multilens FML4I is arranged over the eight divided pixels DPC3-4AR, DPC3-5BR, DPC3-6AR, DPC3-7BR, DPC2-5AG, DPC2-6BG, DPC4-5AG, and DPC4-6BG so as to be shared thereby.

Also in this example, the multilens FML4I is arranged over the eight divided pixels so as to be shared thereby.

Also in a case where the binning processing is performed applying the pixel arrangement shown in FIG. 22, four parallaxes are achieved only by the G-pixel rows such as the first row and the fifth row as shown in FIG. 20.

2-10. Tenth Characteristic Configuration Example

FIG. 23 is a diagram illustrating a tenth characteristic configuration example of the solid-state image pickup device (CMOS image sensor) according to the present embodiment.

A CMOS image sensor 10J shown in FIG. 23 is different from the CMOS image sensor 10I shown in FIG. 22 in the following point.

In the present CMOS image sensor 10J, the color pixels sharing the multilens ML in the row direction in the configuration of the respective full pixels FPC1J, FPC2J, FPC3J, and FPC4J, and the CMOS image sensor 10I have not the same color but different colors from one another.

The color pixels sharing the multilens ML in the row direction are allowed to have not the same color but different colors in such a way. Therefore, mixture (extinction ratio) of L and R in stereo is allowed to be improved by a lens gap and this different color separation.

It is to be noted that, in FIG. 23, for the sake of easy understanding, only parts different from those in the configuration shown in FIG. 22 are denoted with signs.

In a full pixel FPC1J, a divided pixel DPC1-2AB of the B pixel PCB is formed instead of the divided pixel DPC1-2AG of the G pixel PCG1-23.

In the full pixel FPC1J, a divided pixel DPC1-5BR of the R pixel PCR is formed instead of the divided pixel DPC1-5BG of the G pixel PCG1-45.

It is to be noted that a multilens FML1J is arranged over the eight divided pixels DPC1-2AB, DPC1-3BG, DPC1-4AG, DPC1-5BR, DPC0-3AR, DPC0-4BR, DPC2-3AR, and DPC2-4BR so as to be shared thereby.

Also in this example, the multilens FML1J is arranged over two divided pixels DCP1-2AB and DPC1-3BG having different colors from each other as well as the divided pixels DPC1-4AG and DPC1-5BR so as to be shared thereby.

In a full pixel FPC2J, a divided pixel DPC5-2AR of the R pixel PCR is formed instead of the divided pixel DPC5-2AG of the G pixel PCG5-23.

In the full pixel FPC2J, a divided pixel DPC5-5BB of the B pixel PCB is formed instead of the divided pixel DPC5-5BG of the G pixel PCG5-45.

It is to be noted that a multilens FML2J is arranged over the eight divided pixels DPC5-2AR, DPC5-3BG, DPC5-4AG, DPC5-5BB, DPC4-3AB, DPC4-4BB, DPC6-3AB, and DPC6-4BB so as to be shared thereby.

Also in this example, the multilens FML2J is arranged over two divided pixels DCP5-2AR and DPC5-3BG having different colors from each other as well as the divided pixels DPC5-4AG and DPC5-5BB so as to be shared thereby.

In a full pixel FPC3J, a divided pixel DPC3-0AG of the G pixel PCG is formed instead of the divided pixel DPC3-0AB of the B pixel PCG3-01.

In the full pixel FPC3J, a divided pixel DPC3-1BR of the R pixel PCR is formed instead of the divided pixel DPC3-1BB of the B pixel PCG3-01.

In the full pixel FPC3J, a divided pixel DPC3-2AR of the R pixel PCR is formed instead of the divided pixel DPC3-2AB of the B pixel PCG3-23.

In the full pixel FPC3J, a divided pixel DPC3-3BG of the G pixel PCG is formed instead of the divided pixel DPC3-3BB of the B pixel PCG3-23.

It is to be noted that a multilens FML3J is arranged over the eight divided pixels DPC3-0AG, DPC3-1BR, DPC3-2AR, DPC3-3BG, DPC2-1AG, DPC2-2BG, DPC4-1AG, and DPC4-2BG so as to be shared thereby.

Also in this example, the multilens FML3J is arranged over two divided pixels DCP3-0AG and DPC3-1BR having different colors from each other as well as the divided pixels DPC3-2AR and DPC3-3BG so as to be shared thereby.

In a full pixel FPC4J, a divided pixel DPC3-4AG of the G pixel PCG is formed instead of the divided pixel DPC3-4AR of the R pixel PCG3-45.

In the full pixel FPC4J, a divided pixel DPC3-5BB of the B pixel PCB is formed instead of the divided pixel DPC3-5BR of the R pixel PCG3-45.

In the full pixel FPC4J, a divided pixel DPC3-6AB of the B pixel PCB is formed instead of the divided pixel DPC3-6AR of the B pixel PCG3-67.

In the full pixel FPC4J, a divided pixel DPC3-7BG of the G pixel PCG is formed instead of the divided pixel DPC3-7BR of the B pixel PCG3-67.

It is to be noted that a multilens FML3J is arranged over the eight divided pixels DPC3-4AG, DPC3-5BB, DPC3-6AB, DPC3-7BG, DPC2-5AG, DPC2-6BG, DPC4-5AG, and DPC4-6BG so as to be shared thereby.

Also in this example, a multilens FML4J is arranged over two divided pixels DCP3-4AG and DPC3-5BB having different colors from each other as well as the divided pixels DPC3-6AR and DPC3-7BG so as to be shared thereby.

FIG. 24 is a diagram conceptually illustrates a pixel arrangement in a case where the binning processing is performed on the example shown in FIG. 23.

In the case where the binning processing is performed applying the pixel arrangement shown in FIG. 23, RGB parallaxes exist upon thinning as shown in FIG. 24.

Further, the color pixels sharing the multilens ML in the row direction are allowed to have not the same color but different colors. Therefore, mixture (extinction ratio) of L and R in stereo is allowed to be improved by a lens gap and this different color separation.

2-11. Eleventh Characteristic Configuration Example

Parts (A) and (B) of FIG. 25 are diagrams each illustrating an eleventh characteristic configuration example of the solid-state image pickup device (CMOS image sensor) according to the present embodiment.

Parts (A) and (B) of FIG. 25 each illustrate an example of a shape of the multilens ML according to the present embodiment.

Part (A) of FIG. 25 illustrates an example of another shape of the multilens ML in the CMOS image sensor 10D shown in FIG. 12 corresponding to left-right two parallaxes.

Part (B) of FIG. 25 illustrates an example of another shape of the multilens ML in the CMOS image sensor 10G shown in FIG. 18 corresponding to multiple perspective images for naked-eye 3D scheme.

Here, for the sake of simplification, the G pixel, the B pixel, and the R pixel are denoted with the signs PCG, PCB, and PCR, respectively.

Instead of the multilens basically having a circular shape shown in Parts (A-1) or (B-1) of FIG. 25, for example, shapes shown in Parts (A-2), (A-3), and (B-2) of FIG. 25 may be adoptable so as to round the acute-angle part of each pixel.

A multilens shown in Part (A-2) of FIG. 25 is formed as a multilens MLE having an ellipsoidal shape.

Multilens shown in each of Parts (A-3) and (B-2) of FIG. 25 is formed as a multilens MLPL having a polygonal shape.

In such a way, the shape of the multilens ML provided over a plurality of divided pixels may desirably have a flat shape extending in the lateral direction (X direction) in order to avoid influence of the multilens that is adjacent thereto in the vertical direction (Y direction) and is shared by divided pixels.

In such a way, the multilens ML is allowed to have an ellipsoidal shape, a polygonal shape, or the like that is formed along the boundary (dividing ridge) with respect to the adjacent pixels. Therefore, extinction ratio (mixture) is allowed to be improved.

2-12. Twelfth Characteristic Configuration Example

Parts (A) to (C) of FIG. 26 are diagrams each illustrating an eleventh characteristic configuration example of the solid-state image pickup device (CMOS image sensor) according to the present embodiment.

Parts (A) to (C) of FIG. 26 each illustrate an example of the pixel structure according to the present embodiment.

In this example, as described above, two configurations in each of which the FD section 26 is shared by four pixels in a form of 2×2 are formed in parallel in the Y direction. Further, four PDs 21 are arranged to surround the FD section 26.

Part (A) of FIG. 26 illustrates each electrode structure in the surface portion of the Si substrate. In the drawing, WC represents a well contact.

Triangles and rectangular portions rotated by 45 degrees that are shown by a dashed line in the drawing each represent a pixel separation section in a deep portion of the substrate.

Part (B) of FIG. 26 illustrates a well WL structure of a transistor down to a depth of 1 μm.

Part (C) of FIG. 26 illustrates a separation shape of a deep-portion sensor section at a depth of 1 μm, and line sections indicated by signs 81 to 87 correspond thereto and correspond to the dashed line in Part (A) of FIG. 26.

It is to be noted that electric potential distribution around the area having a depth of 1 μm is retained by continuousness of the potential.

Parts (A) and (B) of FIG. 27 are diagrams each illustrating an example of electric potential distribution of the light receiving face in a typical pixel structure and the pixel structure shown in FIG. 26.

Part (A) of FIG. 27 illustrates an example of electric potential distribution of the light receiving face (back face) in the typical pixel structure having a square pixel.

Part (B) of FIG. 27 illustrates an example of electric potential distribution of the light receiving face (back face) in the pixel structure shown in FIG. 26 having triangular pixels.

In a case of the typical pixel structure, the electric potential distribution has a shape close to a circular shape that is similar to the shape of the on-chip lens OCL that is formed along the boundary (dividing ridge: horizontal, vertical) with respect to the adjacent pixels, as shown in Part (A) of FIG. 27.

On the other hand, in a case of the pixel structure shown in FIG. 26, the multilens ML is allowed to have an ellipsoidal shape, a polygonal shape, or the like that is formed along the boundary (dividing ridge) with respect to the adjacent pixels as shown in FIG. 25. Therefore, in this case, the boundary (dividing ridge: horizontal) with respect to the adjacent pixels is strained and the electric potential distribution may have a shape close to a polygonal shape such as a hexagonal shape or a shape close to an ellipsoidal shape.

In such a way, the multilens ML is allowed to have an ellipsoidal shape, a polygonal shape, or the like that is formed along the boundary (dividing ridge) with respect to the adjacent pixels. Therefore, extinction ratio (mixture) is allowed to be improved.

2-13. Thirteenth Characteristic Configuration Example

Parts (A) to (C) of FIG. 28 are diagrams each illustrating a thirteenth characteristic configuration example of the solid-state image pickup device (CMOS image sensor) according to the present embodiment.

The characteristic point of a CMOS image sensor 10K shown in FIG. 28 is that the CMOS image sensor 10K basically has not the zigzag arrangement but the square arrangement (rectangular arrangement), but pixels for L and pixels for R are provided alternately for the respective rows.

The present CMOS image sensor 10K is different from the CMOS image sensor 10A shown in FIG. 8 in that stripes of G pixels configured only of the G pixels are formed in the first, third, fifth, and seventh rows in addition to that the pixels for L and the pixels for R are provided alternately for the respective rows.

Further, the multilens ML is arranged so that each G pixel PCG and the R pixel PCR or the B pixel PCB that is adjacent thereto in the X direction serve as an L-side pixel and an R-side pixel in stereo, respectively.

Here, for the sake of simplification, the G pixel, the B pixel, and the R pixel are denoted with the signs PCG, PCB, and PCR, respectively.

In this configuration, as in the example shown in FIG. 8, the pixels sharing each multilens ML in the multilens array 34 in the lateral direction (X direction) are arranged to have not the same color but different colors, unlike in the typical arrangement.

In the example shown in Part (A) in FIG. 28, the G pixels PCG in the second row and the fourth row that are even-numbered rows are allocated as pixels (divided pixels) for L in stereo.

Correspondingly, the B pixel PCB or the R pixel PCR that shares the multilens ML together with these G pixels PCG is allocated as the pixel (divided pixel) for R in stereo.

In the example shown in Part (A) in FIG. 28, the G pixels PCG in the third row and the fifth row that are odd-numbered rows are allocated as pixels (divided pixels) for R in stereo.

Correspondingly, the B pixel PCB or the R pixel PCR that shares the multilens ML together with these G pixels PCG is allocated as the pixel (divided pixel) for L in stereo.

Based on the pixel arrangement shown in Part (A) of FIG. 28, a so-called Bayer honeycomb (zigzag) arrangement is achievable, for example, only by the L parallax pixels as shown in Part (B) of FIG. 28.

Further, based on the pixel arrangement shown in Part (A) of FIG. 28, the Bayer honeycomb arrangement is achievable, for example, only by the R parallax pixels as shown in Part (C) of FIG. 28.

In these configurations, a 2D (two-dimensional) zigzag Bayer arrangement is achieved by adding the pixels for L and the pixels for R in the Y direction. In this case, the addition is performed on the same vertical signal line. Therefore, the addition processing becomes easy.

Also in the example shown in FIG. 28, the color pixels sharing one multilens ML are allowed to have not the same color but different colors. Therefore, mixture (extinction ratio) of L and R in stereo is allowed to be improved by a lens gap and this different color separation.

Further, in the example shown in FIG. 28, in the sharing divided pixels that are adjacent to each other in the vertical direction (Y direction), the cycle of L is different from that of R by half cycle. Therefore, a region where the multilens ML is allowed to be arranged is increased. Accordingly, the multilens ML is allowed to have not a flat shape but a shape further closer to a circular shape. Therefore, the lens formation becomes easy.

2-14. Fourteenth Characteristic Configuration Example

FIG. 29 is a diagram illustrating a fourteenth characteristic configuration example of the solid-state image pickup device (CMOS image sensor) according to the present embodiment.

A CMOS image sensor 10L shown in FIG. 29 basically has not the zigzag arrangement but the square arrangement (rectangular arrangement). However, pixels for L and pixels for R are provided alternately for the respective rows.

The present CMOS image sensor 10L is different from the CMOS image sensor 10A shown in FIG. 8 in that stripes of G pixels configured only of the G pixels are formed in the second and fourth rows in addition to that the pixels for L and the pixels for R are provided alternately for the respective rows.

Further, the multilens ML is arranged so that each G pixel PCG and the R pixel PCR or the B pixel PCB that is adjacent thereto in the X direction serve as an L-side pixel and an R-side pixel in stereo, respectively.

Here, for the sake of simplification, the G pixel, the B pixel, and the R pixel are denoted with the signs PCG, PCB, and PCR, respectively.

In this configuration, colors of the pixels sharing each multilens ML in the multilens array 34 in the lateral direction (X direction) in the first, third, and fifth rows are arranged to have not the same color but different colors, unlike in the typical arrangement.

Specifically, in the first, third, and fifth rows, the B pixel PCB and the R pixel that are adjacent to each other in the X direction share the multilens ML. Further, one of them is allocated as the pixel (divided pixel) for L in stereo, and the other is allocated as the pixel (divided pixel) for R.

Further, in the second and fourth rows, the G pixels PCG of the same color that are adjacent to each other share the multilens ML. Further, one of them is allocated as the pixel (divided pixel) for L in stereo, and the other is allocated as the pixel (divided pixel) for R.

Based on the pixel arrangement shown in Part (A) of FIG. 29, a so-called Bayer honeycomb (zigzag) arrangement may be achievable, for example, only by the L parallax pixels as shown in Part (B) of FIG. 29. It is to be noted that the pixel arrangement (color filter arrangement) shown in Part (A) of FIG. 29 is not limitative, and the arrangement as shown in Part (D) of FIG. 29 may be adopted.

Further, based on the pixel arrangement shown in Part (A) of FIG. 29, a so-called Bayer honeycomb (zigzag) arrangement may be achievable, for example, only by the R parallax pixels as shown in Part (C) of FIG. 29.

Also in the example shown in FIG. 29, the color pixels sharing one multilens ML are allowed to have not the same color but different colors. Therefore, mixture (extinction ratio) of L and R in stereo is allowed to be improved by a lens gap and this different color separation.

Further, in the example shown in FIG. 29, in the sharing divided pixels that are adjacent to each other in the vertical direction (Y direction), the cycle of L is different from that of R by half cycle. Therefore, a region where the multilens ML is allowed to be arranged is increased. Accordingly, the multilens ML is allowed to have not a flat shape but a shape further closer to a circular shape. Therefore, the lens formation becomes easy.

It is to be noted that, in the respective embodiments described above, description has been given referring to the pixel structure of a back-face illumination type as an example. However, a laminated-type pixel structure that includes a photoelectric conversion film may be adoptable.

In this case, in the pixel array section 12, basically, the photoelectric conversion film that is part of the unit pixel adopts a checkerboard-like zigzag arrangement obtained by rotating each unit pixel, for example, by 45 degrees using a square arrangement (rectangular arrangement) as a reference.

Description will be given below of the laminated-type pixel structure and an example of the zigzag arrangement in the case of the laminated type.

[Second Configuration Example of Unit Pixel]

First, the laminated-type pixel structure that includes the photoelectric conversion film will be described as a second configuration example of a unit pixel, and then, an example of the pixel arrangement will be described.

[Structure Example of Laminated-Type Pixel]

FIG. 30 is a circuit diagram illustrating a configuration example of a laminated-type pixel according to the present embodiment.

FIG. 31 is a partially-omitted/simplified cross-sectional view illustrating the configuration example of the laminated-type pixel according to the present embodiment.

A laminated-type pixel 200 includes a photoelectric conversion film 201, a contact section 202 serving as an injection section, a barrier section 203, a storage section 204, a transfer transistor 205, a reset transistor 206, an amplifier transistor 207, a selection transistor 208, and a discharge transistor 209. One end of the photoelectric conversion film 201 is connected to an upper electrode 210, and the other end is connected to a lower electrode 211. The lower electrode 211 is connected to the contact section 202 in the layer below via a contact 212.

To the contact section 202, electric charge generated in the photoelectric conversion film 201 is injected.

The contact section 202 is connected to the storage section 204 via the barrier section 203.

The transfer transistor 205 is connected between the storage section 204 and floating diffusion FD serving as an output node. A transfer signal TRF that is a control signal is supplied to a gate (transfer gate) of the transfer transistor 205 via a transfer control line LTRF.

Thus, the transfer transistor 205 transfers the electric charge (here, electron) stored in the storage section 204 to the floating diffusion FD.

The reset transistor 206 is connected between a power source line LVDD and the floating diffusion FD. A reset signal RST that is a control signal is supplied to a gate of the reset transistor 206 via a reset control line LRST.

Thus, the reset transistor 206 resets an electric potential of the floating diffusion FD to an electric potential of the power source line LVDD.

A gate of the amplifier transistor 207 is connected to the floating diffusion FD. A source of the amplifier transistor 207 is connected to a vertical signal line LSGN. A drain of the amplifier transistor 207 is connected to a source of the selection transistor 208, and a drain of the selection transistor 208 is connected to the power source line LVDD. In such a manner, the amplifier transistor 207 and the selection transistor 208 configure, together with a constant current source outside the pixel section, a source follower.

Further, a selection signal SEL that is a control signal in accordance with an address signal is supplied to a gate of the selection transistor 208 via a selection control line LSEL, and thereby, the selection transistor 208 is turned on.

When the selection transistor 208 is turned on, the amplifier transistor 207 outputs a voltage, to the vertical signal line LSGN, a voltage in accordance with an electric potential of the floating diffusion FD. The voltage outputted from each pixel is outputted to the column processing section 14 via the vertical signal line LSGN.

These operations are performed at the same time for the respective pixels in one row since, for example, the respective gates of the transfer transistor 205, the reset transistor 206, and the selection transistor 208 are connected to the pixel drive lines 18 based on row unit.

The contact section 202 serves as a source of the discharge transistor 209. A drain of the discharge transistor 209 is connected to a discharge drain line LDRN, and a gate of the discharge transistor 209 is connected to a discharge gate line LDGT.

Drive of the discharge drain line LDRN and the discharge gate line LDGT may be controlled, for example, by a vertical drive section 13. In an initial state, the discharge transistor 209 is held to be in an ON state, and an initialization operation is performed through which electric charge is injected from the drain into the contact section 202.

The gate and the drain of the discharge transistor 209 are lateral wirings that are shared by pixels in the same row in this example, but may be vertical wirings that are shared by pixels in the same column.

The reset control line LRST, the transfer control line LTRF, the selection control line LSEL, the discharge drain line LDRN, and the discharge gate line LDGT that are connected to the pixel section 110 are wired as a set based on a row unit in the pixel arrangement.

M-number of each of the control lines LRST, LTRF, LSEL, LDRN, and LDGT are provided.

These reset control line LRST, transfer control line LTRF, selection control line LSEL, discharge drain line LDRN, and discharge gate line LDGT are included in the pixel drive line 18 shown in FIG. 1 and are driven by the vertical drive section 13.

The vertical drive section 13 controls operation of the pixel arranged in any row in the pixel array section 12. The vertical drive section 13 controls the pixel 200 via the control lines LSEL, LRST, LTRF, LDRN, and LDGT.

The vertical drive section 13 switches an exposure scheme between rolling-shutter scheme and a global shutter scheme depending on shutter mode to perform control of pixel drive. In the rolling-shutter scheme, exposure is performed for each row. In the global shutter scheme, exposure is performed for previous pixel movement.

FIG. 31 illustrates a simplified cross-sectional view that includes the photoelectric conversion film 201, the contact section 202, the barrier section 203, the storage section 204, the transfer transistor 205, the discharge transistor 209, the upper electrode 210, the lower electrode 211, and the contact 12 of the laminated-type pixel 200 according to the present embodiment.

Basically, in the present pixel 200, the storage section 204 formed of a PN junction of a p-layer 2041 and an n-layer 2042 in a P well 221 on a front-face side of an Si semiconductor substrate 220.

An n+ diffusion layer 2051 of the transfer transistor 205 is formed on the right side of the storage section 204 in the drawing. A gate electrode 2054 is formed, with a gate insulating film 2053 in between, on a channel formation region 2052 between the p-layer 2041 of the storage section 204 and the diffusion layer 2051.

Further, the contact section 202 configured of an n+ layer is formed on the left side of the drawing in a state of being in contact with the p-layer 2041 in the storage section 204.

The n-layer 2042 in the storage section 204 is extended on a bottom-face side of the contact section 202 to form the barrier section 203.

As described above, the contact section 202 serves as a source region of the discharge transistor 209. A drain region 2092 of the discharge transistor 209 is formed at a position opposing this contact section 202 with the channel formation region 2091 in between. A gate electrode 2094 is formed on the channel formation region 2091 with the gate insulating film 2093 in between.

The drain region 2092 is connected to the discharge drain line LDRN with a contact 223 in between formed in the interlayer insulating film 222 formed on the front-face side of the semiconductor substrate 220.

Further, the lower electrode 211 is formed on the interlayer insulating film 222, the photoelectric conversion film 201 is formed thereon, and the upper electrode 210 is formed thereon.

It is to be noted that the upper electrode 210 may be formed by a transparent electrode such as ITO. The photoelectric conversion film 201 may be formed of amorphous silicon, an organic photoelectric conversion film, or the like.

The lower electrode 211 may be formed of metal such as Ti. The lower electrode 211 is connected to the contact section (D) 202 in the silicon substrate surface via a contact.

As an organic photoelectric conversion film that performs photoelectric conversion on light having wavelength of green, for example, an organic photoelectric conversion material including rhodamine-based dye, merocyanine-based dye, quinacridone, etc. may be used.

As an organic photoelectric conversion film that performs photoelectric conversion on light having wavelength of red, an organic photoelectric conversion material including phthalocyanine-based dye may be used.

As an organic photoelectric conversion film that performs photoelectric conversion on light having wavelength of blue, an organic photoelectric conversion material including coumarin-based dye, tris-8-hydroxyquinoline-A1 (Alq3), merocyanine-based dye, etc. may be used.

Next, operation of the pixel shown in FIGS. 30 and 31 will be described.

FIG. 32 is a timing chart for explaining the operation of the pixel shown in FIGS. 30 and 31.

First, the gate line LDGT and the drain line LDRN of the discharge transistor 209 are driven, and thereby, electron is injected into the contact section (D) 202 in all the pixels at the same time.

Subsequently, a high-active pulse is applied to each of the transfer line LTRF of the transfer transistor 205 and the reset line LRST of the reset transistor 206. Thus, the storage section 204 is reset.

The transfer gate 205 is turned off, and an exposure period begins from that timing.

At the end of the exposure period, the discharge gate line LDGT is returned to be at a high level in all of the pixels at the same time.

Subsequently, a period for reading out the respective rows one by one begins. Typical read-out operation is performed on a target pixel, when a row thereof is read out.

FIGS. 33 and 34 each illustrates a potential diagram at the timing of operation shown in FIGS. 30 and 31, respectively.

(a) Photoelectron from the photoelectric conversion film 201 is discarded to the drain (A) of the discharge transistor 209 from the contact section (D) 202 via the discharge transistor 209.

(b) The discharge drain line LDRN is set at a low level for initialization.

Electron is injected from the discharge drain line LDRN to the storage section 204 via the discharge transistor 209 and the barrier section 203.

(c) After the discharge gate line LDGT is set at the low level, the discharge drain line LDRN is set at a high level.

At this time, the electron injected into the contact section (D) 202 and the storage section 204 is remained.

(d) When the transfer line LTRF and the reset line LRST are driven to turn on the transfer transistor 205 and the reset transistor 206, electron is extracted from the storage section 204 and the storage section 204 becomes empty. Also, an electric potential of the contact section (D) 202 becomes equivalent to an electric potential of the barrier section 203.

The transfer gate is the last that is illustrated in the drawing.

(e) The transfer line LTRF is set at the low level, and thereby, storage in the storage section 204 is started.

(f) During the storage, the photoelectron from the photoelectric conversion film 201 leaps over the barrier section 203 and is stored in the storage section 204.

(g) Until the exposure period ends, the discharge transistor 209 is turned on, and it becomes the pixel 200's turn to be read out, the signal is held in the storage section 204 and the photoelectron from the photoelectric conversion film 201 is discharged via the discharge transistor 209.

Through the above-described operation, the photoelectron from the photoelectric conversion film is flown into the storage section from the beginning of the exposure period. Therefore, linearity of the signal is more favorable.

It is to be noted that, in the laminated-type pixel 200, a configuration in which the discharge transistor is not provided may be adoptable. Even if the discharge transistor is not provided, the global shutter operation is achievable by utilizing the fact that the photoelectric conversion film 201 is laminated.

In this case, the drain lines of the reset transistor 206 and the selection transistor (the amplifier transistor, in some cases) 208 are common wirings for all of the pixels, but do not have a fixed voltage and are configured to be driven.

The upper electrode 210 has a voltage that is not fixed, and is configured to be driven.

All wirings LALL and the upper electrode 210 are driven by the vertical drive section 13.

2-15. Fifteenth Characteristic Configuration Example

Parts (A) and (B) of FIG. 35 are diagrams each illustrating a fifteenth characteristic configuration example of the solid-state image pickup device (CMOS image sensor) according to the present embodiment.

In the CMOS image sensor 10M shown in FIG. 35, the photoelectric conversion film that is part of the unit pixel adopts a checkerboard-like zigzag arrangement obtained by rotating each unit pixel, for example, by 45 degrees using a square arrangement (rectangular arrangement) as a reference.

Further, the semiconductor substrate 220 side of the CMOS image sensor 10M including the storage section 204 connected to the photoelectric conversion film 201 by the contact section 202 and the like is formed in the square arrangement (rectangular arrangement).

In this case, a formation section of the photoelectric conversion film 201 corresponds to the first pixel section 60, and the semiconductor substrate 220 side corresponds to the second pixel section 70.

In this example, the photoelectric conversion film is formed of color photoelectric conversion films 201G1, 201G2, 201B, and 201R that also serve as color filters. The color photoelectric conversion films 201G1, 201G2, 201B, and 201R are formed in a zigzag arrangement.

Also the configuration shown in FIG. 35 includes no useless pixel arrangement. Therefore, decrease in resolution caused by adopting stereo function is allowed to be suppressed.

Further, the detection transistor, the wirings, and the like are allowed to be provided based on square unit. Therefore, miniaturization is allowed to be performed.

Moreover, the light receiving face is allowed to detect LR two parallaxes in the structure where the zigzag honeycomb is divided into two in left and right. Therefore, even if the number of pixels is decreased to ½, the zigzag honeycomb processing allows the record pixel number to be restored to double. Therefore, decrease in resolution caused by adopting stereo function is allowed to be compensated.

2-16. Sixteenth Characteristic Configuration Example

Parts (A) and (B) of FIG. 36 are diagrams each illustrating a sixteenth characteristic configuration example of the solid-state image pickup device (CMOS image sensor) according to the present embodiment.

A CMOS image sensor 10N shown in FIG. 36 is different from the CMOS image sensor 10M shown in FIG. 35 in that the photoelectric conversion film 201 does not serve as a color filter, and color filters 230G1, 230G2, 230B, and 230R are provided separately.

Also the configuration shown in FIG. 36 includes no useless pixel arrangement. Therefore, decrease in resolution caused by adopting stereo function is allowed to be suppressed.

Further, the detection transistor, the wirings, and the like are allowed to be provided based on square unit. Therefore, miniaturization is allowed to be performed.

Moreover, the light receiving face is allowed to detect LR two parallaxes in the structure where the zigzag honeycomb is divided into two in left and right. Therefore, even if the number of pixels is decreased to ½, the zigzag honeycomb processing allows the record pixel number to be restored to double. Therefore, decrease in resolution caused by adopting stereo function is allowed to be compensated.

2-17. Seventeenth Characteristic Configuration Example

Parts (A) and (B) of FIG. 37 are diagrams each illustrating a seventeenth characteristic configuration example of the solid-state image pickup device (CMOS image sensor) according to the present embodiment.

A CMOS image sensor 10O shown in FIG. 37 is different from the CMOS image sensor 10M shown in FIG. 35 in that the photoelectric conversion film is formed as the lamination of organic photoelectric conversion films 201G1, 201G2, 201B, and 201R that also serve as color filters.

Also the configuration shown in FIG. 37 includes no useless pixel arrangement. Therefore, decrease in resolution caused by adopting stereo function is allowed to be suppressed.

Further, the detection transistor, the wirings, and the like are allowed to be provided based on square unit. Therefore, miniaturization is allowed to be performed.

Moreover, the light receiving face is allowed to detect LR two parallaxes in the structure where the zigzag honeycomb is divided into two in left and right. Therefore, even if the number of pixels is decreased to ½, the zigzag honeycomb processing allows the record pixel number to be restored to double. Therefore, decrease in resolution caused by adopting stereo function is allowed to be compensated.

2-18. Eighteenth Characteristic Configuration Example

Parts (A) and (B) of FIG. 38 are diagrams each illustrating an eighteenth characteristic configuration example of the solid-state image pickup device (CMOS image sensor) according to the present embodiment.

A CMOS image sensor 10P shown in FIG. 38 is different from the CMOS image sensor 10M shown in FIG. 35 in that each pixel is divided into two to serve as a stereo version of light field and LR parallax separation is performed with the use of the multilens array 34.

In this example, a multilens ML200 is arranged over two divided pixels that are divided into divided pixels having the triangle-prism-like shape of the same color so as to be shared thereby.

Also the configuration shown in FIG. 38 includes no useless pixel arrangement. Therefore, decrease in resolution caused by adopting stereo function is allowed to be suppressed.

Further, the detection transistor, the wirings, and the like are allowed to be provided based on square unit. Therefore, miniaturization is allowed to be performed.

Moreover, the light receiving face is allowed to detect LR two parallaxes in the structure where the zigzag honeycomb is divided into two in left and right. Therefore, even if the number of pixels is decreased to ½, the zigzag honeycomb processing allows the record pixel number to be restored to double. Therefore, decrease in resolution caused by adopting stereo function is allowed to be compensated.

2-19. Nineteenth Characteristic Configuration Example

Parts (A) and (B) of FIG. 39 are diagrams each illustrating a nineteenth characteristic configuration example of the solid-state image pickup device (CMOS image sensor) according to the present embodiment.

A CMOS image sensor 10Q shown in FIG. 39 is different from the CMOS image sensor 10N shown in FIG. 36 in that each pixel is divided into two to serve as a stereo version of light field and LR parallax separation is performed with the use of the multilens array 34.

In this example, the multilens ML200 is arranged over two divided pixels that are divided into divided pixels having the triangle-prism-like shape of the same color so as to be shared thereby.

Also the configuration shown in FIG. 39 includes no useless pixel arrangement. Therefore, decrease in resolution caused by adopting stereo function is allowed to be suppressed.

Further, the detection transistor, the wirings, and the like are allowed to be provided based on square unit. Therefore, miniaturization is allowed to be performed.

Moreover, the light receiving face is allowed to detect LR two parallaxes in the structure where the zigzag honeycomb is divided into two in left and right. Therefore, even if the number of pixels is decreased to ½, the zigzag honeycomb processing allows the record pixel number to be restored to double. Therefore, decrease in resolution caused by adopting stereo function is allowed to be compensated.

3. Configuration Example of Monocular 3D Stereo Camera to which Present Embodiment is Applicable FIG. 40 is a diagram illustrating a configuration example of a monocular 3D stereo camera to which the solid-state image pickup device (CMOS image sensor) according to the present embodiment is applied.

In a monocular 3D stereo camera 300, basically, an optical system 310 including an imaging lens 311 on a subject side of the multilens array 34 is arranged.

A zoom lens may be arranged in the optical system 310.

As described above, the following effects are obtainable according to the present embodiment.

According to the present embodiment, no useless pixel arrangement is included. Therefore, decrease in resolution caused by adopting stereo function is allowed to be suppressed.

Further, the detection transistor, the wirings, and the like are allowed to be provided based on square unit. Therefore, miniaturization is allowed to be performed.

Moreover, the light receiving face is allowed to detect LR two parallaxes in the structure where the zigzag honeycomb is divided into two in left and right. Therefore, even if the number of pixels is decreased to ½, the zigzag honeycomb processing allows the record pixel number to be restored to double. Therefore, decrease in resolution caused by adopting stereo function is allowed to be compensated.

Moreover, as the stereo version of light field, LR parallax separation is performed with the use of the multilens array 34. Further, the color pixels sharing one multilens ML are allowed to have not the same color but different colors. Therefore, mixture (extinction ratio) of L and R in stereo is allowed to be improved by a lens gap and this different color separation.

Moreover, two conditions of parallax and wide dynamic range are distributed to four pixels having the same color. Thus, assuming that the record information is allowed to be decreased to ¼, concerning the sensor having a Quad-type four-pixel same-color arrangement, by using one condition for WDR for high sensitivity and low sensitivity, and using the other condition for LR parallax, a WDR image in stereo is obtainable in a monocular scheme.

In other words, according to the present embodiment, a wide dynamic range (WDR) image in stereo is obtainable in a monocular scheme without any complex structure or complex signal processing.

Further, wide dynamic range (WDR) and LR parallax are both achieved at low cost.

FIG. 41 is a diagram illustrating dependency, on distance to a subject, of an amount of variation in image height in the monocular 3D stereo camera to which the solid-state image pickup device (CMOS image sensor) according to the present embodiment is applied.

In FIG. 41, a lateral axis indicates the distance (mm) to the subject, and a vertical axis indicates the amount (μm) of variation in image height.

In this case, dependency, on distance to a subject, of the amount of variation in image height at a focal point of 3 m is illustrated.

It is shown that, in this camera, separation characteristics of the parallax images are not favorable if the subject distance is not within 1.5 m even when the micro pixel pitch of 1.12 μm is achieved.

Therefore, the monocular 3D stereo camera provided with the solid-state image pickup device according to the present embodiment is suitable for short-distance shooting as application of stereo.

Therefore, as described above, the monocular 3D stereo camera provided with the solid-state image pickup device according to the present embodiment is suitable for a face camera in a mobile electronic apparatus.

Parts (A), (B), and (C) of FIG. 42 are diagrams each illustrating an amount of variation in imaging with respect to the distance to the subject in the monocular 3D stereo camera to which the solid-state image pickup device (CMOS image sensor) according to the present embodiment is applied.

In Parts (A), (B), and (C) of FIG. 42, a lateral axis indicates the distance (mm) to the subject, and a vertical axis indicates the amount (μm) of variation in image height.

Part (A) of FIG. 42 shows dependency on angle of view, Part (B) of FIG. 42 shows dependency on F-number, and Part (C) of FIG. 42 illustrates zoom dependency.

Here, when the extinction ratio is oo, and the wide angle has the focal length f of about 28 mm, small monocular parallax of 3/2 inch or smaller is not allowed to be obtained when the subject distance is 3 m or larger in a wide angle having the focal length f of about 28 mm.

It can be seen that zoom is most effective in the example shown in FIG. 42.

The solid-state image pickup device having such effects is applicable as an image pickup device in digital cameras and video camcorders.

4. Configuration Example of Camera System

FIG. 43 is a diagram illustrating an example of a configuration of a camera system to which the solid-state image pickup device according to the present embodiment is applied.

A present camera system 400 includes an image pickup device 410 to which any of the CMOS image sensors (solid-state image pickup devices) 10 and 10A to 10Q according to the present embodiment is applicable, as shown in FIG. 43.

The camera system 400 includes an optical system that guides entering light to a pixel region of this image pickup device 410 (that forms an image of a subject), which may be, for example, a lens 420 that forms an image on an image pickup plane with the use of the entering light (image light).

The camera system 400 includes a drive circuit (DRV) 430 that drives the image pickup device 410 and a signal processing circuit (PRC) 440 that performs processing on an output signal of the image pickup device 410.

The drive circuit 430 includes a timing generator (not illustrated) that generating various timing signals that include a start pulse, a clock pulse, etc. that drive circuits in the image pickup device 410. The drive circuit 430 drives the image pickup device 410 with the use of a predetermined timing signal.

Further, the signal processing circuit 440 performs a predetermined signal processing on the output signal of the image pickup device 410.

The image signal processed by the signal processing circuit 440 may be recorded in a recording media such as a memory. Image information recorded in the recording media is hard-copied by a printer or the like. Further, The image signal processed by the signal processing circuit 440 is displayed as a moving footage on a monitor configured, for example, of a liquid crystal display or the like.

As described above, in the image pickup apparatus such as a digital still camera, a highly-accurate camera with low power consumption is achieved by providing any of the above-described solid-state image pickup devices 10 and 10A to 10Q as the image pickup device 410.

It is to be noted that it is possible to achieve configurations as described below from the present technology.

(1) A solid-state image pickup device including:
a pixel array section including a plurality of pixels arranged in an array, each of the plurality of pixels having a photoelectric conversion function,
each of the plurality of pixels in the pixel array section including
a first pixel section including at least a microlens,
a second pixel section including an electric charge detection element, and
a photoelectric conversion element included in the first or second pixel section,
the first and second pixel sections being formed in a laminated state,
the second pixel section having a two-dimensional arrangement along a first direction and a second direction that is orthogonal to the first direction, and
the first pixel section having a two-dimensional arrangement along directions different from the first and second directions.

(2) The solid-state image pickup device according to (1), wherein the respective first pixel sections in the plurality of pixels are arranged in a state rotated by a predetermined angle using the first and second directions as references.

(3) The solid-state image pickup device according to (1) or (2), wherein
the microlens is a multilens provided over two or more pixels of the plurality of pixels,
the first pixel section in the pixel includes a plurality of divided pixels formed at least in the first direction,
each of the divided pixels is allocated for a pixel for L or a pixel for R in stereo, and
the multilens is arranged to allow light to enter over two or more of the divided pixels at least in the first direction.

(4) The solid-state image pickup device according to any one of (1) to (3), wherein
the first pixel section includes the microlens, and the second pixel section includes the photoelectric conversion element, a wiring layer, and the electric charge detection element.

(5) The solid-state image pickup device according to any one of (1) to (4), wherein the first pixel section includes the microlens and a color filter, and the second pixel section includes the photoelectric conversion element, a wiring layer, and the electric charge detection element.

(6) The solid-state image pickup device according to any one of (1) to (5), wherein the solid-state image pickup device has a pixel structure of a back-face illumination type, the first pixel section includes the microlens, a color filter, and the photoelectric conversion element, and the second pixel section includes a wiring layer and the electric charge detection element.

(7) The solid-state image pickup device according to any one of (1) to (5), wherein the solid-state image pickup device has a pixel structure of a front-face illumination type, the first pixel section includes the microlens, a color filter, and a wiring layer, and the second pixel section includes the photoelectric conversion element and the electric charge detection element.

(8) The solid-state image pickup device according to any one of (3) to (7), wherein part or all of the multilens is arranged to allow light to enter over the divided pixels adjacent to one another, at least in the first direction, the divided pixels being included in one or more color pixels having same color.

(9) The solid-state image pickup device according to (8), wherein in the pixel array section, color pixels having same color are arranged in one of odd-numbered rows and even-numbered rows in a pixel arrangement, and color pixels having different colors are arranged in the other of the odd-numbered rows and the even-numbered rows.

(10) The solid-state image pickup device according to (8), wherein in the pixel array section, divided pixels of color pixels having same color are arranged in rows in part of a pixel arrangement, and divided pixels of color pixels having different colors are arranged in a mixed state in other rows.

(11) The solid-state image pickup device according to any one of (3) to (10), wherein part or all of the multilens is arranged to allow light to enter over different-color divided pixels having different colors that are adjacent to one another, at least in the first direction.

(12) The solid-state image pickup device according to (11), wherein in the pixel array section, divided pixels of color pixels having same color are arranged in odd-numbered columns or in even-numbered columns in a pixel arrangement, and divided pixels of color pixels having different colors are arranged in a mixed state in respective rows.

(13) The solid-state image pickup device according to (11), wherein in the pixel array section, divided pixels of color pixels having different colors are arranged in a mixed state in respective rows and respective columns.

(14) A camera system with a solid-state image pickup device and an optical system configured to form an image of a subject on the solid-state image pickup device, the solid-state image pickup device including:

a pixel array section including a plurality of pixels arranged in an array, each of the plurality of pixels having a photoelectric conversion function, each of the plurality of pixels in the pixel array section including a first pixel section including at least a microlens, a second pixel section including an electric charge detection element, and a photoelectric conversion element included in the first or second pixel section, the first and second pixel sections being formed in a laminated state, the second pixel section having a two-dimensional arrangement along a first direction and a second direction that is orthogonal to the first direction, and the first pixel section having a two-dimensional arrangement along directions different from the first and second directions.

(15) The camera system according to (14), wherein the respective first pixel sections in the plurality of pixels are arranged in a state rotated by a predetermined angle using the first and second directions as references.

(16) The camera system according to (14) or (15), wherein the microlens is a multilens provided over two or more pixels of the plurality of pixels, the first pixel section in the pixel includes a plurality of divided pixels formed at least in the first direction, each of the divided pixels is allocated for a pixel for L or a pixel for R in stereo, and the multilens is arranged to allow light to enter over two or more of the divided pixels at least in the first direction.

(17) The camera system according to (16), wherein part or all of the multilens is arranged to allow light to enter over the divided pixels adjacent to one another, at least in the first direction, the divided pixels being included in one or more color pixels having same color.

(18) The camera system according to (17), wherein in the pixel array section, color pixels having same color are arranged in one of odd-numbered rows and even-numbered rows in a pixel arrangement, and color pixels having different colors are arranged in the other of the odd-numbered rows and the even-numbered rows.

(19) The camera system according to (17), wherein in the pixel array section, divided pixels of color pixels having same color are arranged in rows in part of a pixel arrangement, and divided pixels of color pixels having different colors are arranged in a mixed state in other rows.

(20) The camera system according to any one of (16) to (19), wherein part or all of the multilens is arranged to allow light to enter over different-color divided pixels having different colors that are adjacent to one another, at least in the first direction.

(21) The camera system according to (20), wherein in the pixel array section, divided pixels of color pixels having same color are arranged in odd-numbered columns or in even-numbered columns in a pixel arrangement, and divided pixels of color pixels having different colors are arranged in a mixed state in respective rows.

(22) The camera system according to (20), wherein in the pixel array section, divided pixels of color pixels having different colors are arranged in a mixed state in respective rows and respective columns.

The present application claims priority on the basis of Japanese Patent Application No. 2011-116235 filed in the Japan Patent Office on May 24, 2011, the entire content of which is hereby incorporated by reference.

The invention claimed is:

1. A solid-state image pickup device comprising:

a plurality of rectangular pixels arranged in an array, each of the plurality of pixels divided into a plurality of triangular divided pixel cells, each of the divided pixel cells having a respective photoelectric conversion element; and first and second pixel sections, wherein, for each pixel, the divided pixel cells have a same sensitivity to light, for each pixel, one half of the divided pixels are dedicated to a left channel of a stereoscopic image and another half of the divided pixels are dedicated to a right channel of the stereoscopic image, the first pixel section is comprised of rectangular upper portions of the pixels and the second pixel section is comprised of rectangular lower portions of the pixels, each pixel having one upper section and one lower section, the first and second pixel sections overlie each other in a vertical direction so that each pixel is comprised of its upper portion and its lower portion in the vertical direction, the first pixel section includes microlenses of the pixels, the second pixel section includes electric charge detection elements of the divided pixel cells, each lower portion having a respective electric charge detection element, the first or the second pixel section includes the photoelectric conversion elements of the divided pixel cells, the upper portions of the pixels are arrayed in a first square matrix pattern along first and second directions which are orthogonal to each other in horizontal directions, the lower portions of the pixels are arrayed in a second square matrix pattern along third and fourth directions which are orthogonal to each other in horizontal directions, but neither of which is the same as either the first direction or the second direction so that the first and second pixel sections are rotated relative to each other, and for each pixel, the divided pixel cells are divided from each other along the first direction or the second direction.

2. The solid-state image pickup device according to claim 1, wherein:

each of the divided pixel cells is designated as a left (L) pixel or a right (R) pixel for stereoscopic imaging, and each multilens is arranged to allow light to enter over two or more of the divided pixel cells at least in the third direction.

3. The solid-state image pickup device according to claim 1, wherein the second pixel section also includes the photoelectric conversion elements and wiring layers.

4. The solid-state image pickup device according to claim 1, wherein the first pixel section also includes color filters, and the second pixel section also includes the photoelectric conversion elements and wiring layers.

5. The solid-state image pickup device according to claim 1, wherein:

the solid-state image pickup device has a back-face illumination type pixel structure, the first pixel section also includes color filters, and the photoelectric conversion elements, and the second pixel section also includes wiring layers.

6. The solid-state image pickup device according to claim 1, wherein:

the solid-state image pickup device has a front-face illumination type pixel structure, the first pixel section also includes color filters and wiring layers, and the second pixel section also includes the photoelectric conversion elements.

7. The solid-state image pickup device according to claim 2, wherein part or all of each multilens is arranged to allow light to enter over adjacent divided pixel cells, at least in the third direction, the divided pixel cells being included in one or more color pixels having same color.

8. The solid-state image pickup device according to claim 7, wherein:

color pixels having a same color are arranged in one of odd-numbered rows or even-numbered rows in a pixel arrangement, and color pixels having different colors are arranged in the other of the odd-numbered rows or the even-numbered rows.

9. The solid-state image pickup device according to claim 7, wherein:

divided pixel cells of color pixels having a same color are arranged in some rows in a part of the pixel array, and divided pixel cells of color pixels having different colors are arranged in a mixed state in other rows.

10. The solid-state image pickup device according to claim 2, wherein part or all of each multilens is arranged to allow light to enter over different-color divided pixel cells having different colors that are adjacent to one another, at least in the third direction.

11. The solid-state image pickup device according to claim 10, wherein:

divided pixel cells of color pixels having a same color are arranged in odd-numbered columns or in even-numbered columns in the pixel array, and divided pixel cells of color pixels having different colors are arranged in a mixed state in respective rows of the pixel array.

12. The solid-state image pickup device according to claim 10, wherein divided pixel cells of color pixels having different colors are arranged in a mixed state in respective rows and respective columns of the pixel array.

13. A camera system with a solid-state image pickup device according to claim 1 and an optical system configured to form an image of a subject on the solid-state image pickup device.

14. The camera system according to claim 13, wherein the first and second directions are oriented 45 degrees rotated with respect to the third and fourth directions.

15. The camera system according to claim 13, wherein:
each microlens is a multilens provided over two or more pixels of the plurality of pixels,
the divided pixel cells are arrayed along the third and fourth directions,
each of the divided pixel cells is allocated as a left (L) pixel or a right (R) pixel for stereoscopic imaging, and
each multilens is arranged to allow light to enter over two or more of the divided pixel cells at least in the third direction.

16. The camera system according to claim 15, wherein part or all of the multilens is arranged to allow light to enter over the divided pixel cells adjacent to one another, at least in the first direction, the divided pixel cells being included in one or more color pixels having same color.

17. The camera system according to claim 16, wherein:
color pixels having a same color are arranged in odd-numbered rows or even-numbered rows, and
color pixels having different colors are arranged in rows with the color pixels having the same color.

18. The camera system according to claim 16, wherein:
divided pixel cells of color pixels having same color are arranged in rows in part of a pixel arrangement, and
divided pixel cells of color pixels having different colors are arranged in a mixed state in other rows.

19. The camera system according to claim 15, wherein part or all of each multilens is arranged to allow light to enter over different-color divided pixel cells having different colors that are adjacent to one another, at least in the first direction.

20. The camera system according to claim 19, wherein:
divided pixel cells of color pixels having same color are arranged in odd-numbered columns or in even-numbered columns in a pixel arrangement, and
divided pixel cells of color pixels having different colors are arranged in a mixed state in respective rows.

21. The camera system according to claim 19, wherein divided pixel cells of color pixels having different colors are arranged in a mixed state in respective rows and respective columns.

* * * * *